(12) United States Patent
Fried et al.

(10) Patent No.: US 8,422,218 B2
(45) Date of Patent: Apr. 16, 2013

(54) LIQUID COOLED CONDENSERS FOR LOOP HEAT PIPE LIKE ENCLOSURE COOLING

(76) Inventors: Stephen Samuel Fried, Kingston, MA (US); Yury F Maydanik, Ekaterinburg (RU); Vladimir A. Kozhin, Ekaterinburg (RU)

( * ) Notice: Subject to any disclaimer, the term of this patent is extended or adjusted under 35 U.S.C. 154(b) by 170 days.

(21) Appl. No.: 13/068,029

(22) Filed: May 2, 2011

(65) Prior Publication Data

US 2011/0277967 A1 Nov. 17, 2011

Related U.S. Application Data

(63) Continuation-in-part of application No. 12/103,695, filed on Apr. 15, 2008, now Pat. No. 7,957, 132.

(60) Provisional application No. 60/923,588, filed on Apr. 16, 2007, provisional application No. 61/327,659, filed on May 24, 2010.

(51) Int. Cl.
*G06F 1/20* (2006.01)
*H05K 7/20* (2006.01)

(52) U.S. Cl.
USPC ...... 361/679.47; 361/694; 361/695; 361/700; 361/702; 361/715; 361/719

(58) Field of Classification Search .................. 361/700, 361/715

See application file for complete search history.

(56) References Cited

U.S. PATENT DOCUMENTS

| | | | |
|---|---|---|---|
| 6,310,772 B1 * | 10/2001 | Hutchison et al. | 361/700 |
| 6,643,132 B2 * | 11/2003 | Faneuf et al. | 361/700 |
| 6,972,365 B2 * | 12/2005 | Garner | 174/16.3 |
| 7,203,663 B1 * | 4/2007 | Buisman et al. | 705/38 |
| 7,403,386 B2 * | 7/2008 | Aihara et al. | 361/694 |
| 7,505,269 B1 * | 3/2009 | Cosley et al. | 361/700 |
| 7,654,310 B2 * | 2/2010 | Li | 165/104.33 |
| 7,957,132 B2 * | 6/2011 | Fried | 361/679.47 |

* cited by examiner

*Primary Examiner* — Gregory Thompson
(74) *Attorney, Agent, or Firm* — Michael Ries

(57) ABSTRACT

A cooling device includes an enclosure, an external heat rejection device, a primary cooling system including a loop heat pipe like device. The LHPL device includes, an evaporator module, a condenser module, a vapor line, a liquid return line, and a working fluid having a liquid phase and a vapor phase. The evaporator module includes a component-evaporator heat spreader, an evaporator body, and an evaporator-component clamping mean. The evaporator body includes an evaporator outer shell, a working fluid inlet port, a compensation chamber, a working fluid exit port, and an evaporator wick having vapor escape channels. The condenser module includes a condenser coolant inlet, a condenser coolant exit, a condenser condensation channel, a condensation channel working fluid inlet, a condensation channel working fluid exit, and a condensation channel-coolant thermal interface further comprises a coolant passageway. The secondary cooling system including a secondary coolant, the secondary cooling system cooling a secondary heat rejecting component, wherein the secondary heat rejecting component is one of the plurality of other components.

20 Claims, 52 Drawing Sheets

LIQUID COOLED CONDENSERS FOR LOOP HEAT PIPE LIKE ENCLOSURE COOLING

CROSS REFERENCE TO RELATED APPLICATIONS

This application is a Continuation-in-Part of U.S. application Ser. No. 12/103,695, filed on Apr. 15, 2008 now U.S. Pat. No. 7,957,132, which claimed priority to U.S. Provisional Application 60/923,588 filed Apr. 16, 2007; and this application claims priority to U.S. Provisional Application 61/327,659, filed on May 24, 2010; the disclosures of which are hereby incorporated by reference in their entireties.

TECHNICAL FIELD

The disclosure relates generally to devices and methods for cooing electronics, and specifically to loop heat pipe like devices.

BACKGROUND

A way that may be employed to efficiently cool data centers and electronics housed in electronics which employs Loop Heat Pipes and other passive technologies to cool the primary heat loads in such systems and which may employ a combination of other methods to cool the secondary heat loads.

The cooling of electronics housed in enclosures has for many years been dominated by methods that were much more concerned about getting the job done than the energy it took to get the job done. Methods for improving the efficiency of electronic cooling using passive heat transfer such as heat pipes have been available since at least the Manhattan project, yet have only become inexpensive with the advent of CPUs that rejected 40 or more Watts, and needed to extend the operating capabilities of finned heat sinks. This disclosure employs passive closed loop heat transfer devices that can dramatically improve not only the energy efficiency of electronic cooling but also makes it possible to cool devices that reject 500 or more Watts mounted on densely packed printed circuit boards and in the case of a data center reducing the energy required to cool it by 80% or more!

The devices at the heart of this disclosure are Loop Heat Pipes, Capillary Pumped Loops and derivatives of Loop Heat Pipes that included devices like pumps in the condenser lines. We lump all these devices together into the category Loop Heat Pipe Like (LHPL).

In general the LHPLs employed provide the best energy efficiency of any electronic cooling device ever invented. Not only are they passive, but their ability to reject heat to new locations is often measured in meters employing very small condenser pipes (often less than 3 mm) that make it possible for them to move heat out of tight spaces to condensers that can reject the heat over large heat transfer areas to secondary coolants such as air and water. And it is this ability to transport heat to new locations in a chassis or enclosure and then pass it through a reasonably long pipe in a condenser which distributes it over a reasonably large area, that makes it possible to efficiently transfer the heat being rejected by tiny hot spots to secondary coolants which in turn remove the heat to cooling loops which ultimately reject it to the outside world. And it is also this ability to distribute the primary heat load over large areas that makes it possible to create very efficient counter flow heat exchangers that retain the quality of the heat as well, that makes this technology so exciting. In fact, the secondary coolants that it heats up are produced with the highest delta T's of any technology we know of. It is the low total thermal resistances of these devices that make it possible to produce LHPLs whose overall thermal resistance is only 0.15.degree. C./Watt and that have a heat transfer coefficient of 0.15.degree. C./(Wcm.sup.2). In the case of a 100 Watt CPU whose LHP condenser was cooled by water at 30.degree. C. the output from the condenser turned out to be 47.degree. C. with the CPU running at a heat spreader temperature of 59.degree. C. Translated into practical terms, employed in the 1 U rack mount chassis that dominate modern data centers, this device makes it possible to remove the heat directly from a server housed in a rack cabinet and move it directly back to the cooling tower in the data center. In the process, the noisy fans in the racks that produce many points of failure and can consume as much as 30% of the energy being used by servers along with the main CRAC unit blowers and water chillers that consume 35% of the total power employed by the data center end up getting cut out of the cooling process. The temperature we chose to cool these LHPs with, 30.degree. C., was chosen based on ASHRAE tables, and the performance of commercially available evaporative cooling towers. This temperature turns out to be the temperature of the coolant that this type of cooling tower will produce running in Atlanta Ga. on the hottest and most humid day of the year. A quick comparison of the power consumption at institutions like Lawrence Livermore National Labs suggests that:

TABLE 1 Electronics 50% Water Chiller 25% Air Blower 10% 1U fans 9% UPS 5% Lighting 1% changes to this:

TABLE-US-No. 00002 Electronics 83% 1U fans 1.6% Cooling Tower Pump and fan 5% UPS 8.3% Lighting 1.6%

Which is to say the total power consumed by the data center goes down by 40%!

The same energy benefits that accrue to data center cooling also accrue to the general cooling of all electronic enclosures that are air cooled, but to a lesser extent, for the simple reason that air is a much poorer heat transport medium than the chilled water that gets employed to move heat from servers that are cooled with it back to the water chiller or in the best case cooling case we have run up against, the data center cooling tower. At the head of the list of benefits in addition to reduced energy costs are huge reductions in noise, the elimination of heat arriving at the walls of enclosures that can be so hot that it is almost impossible to get burned touching them, the frequent failure of rotating cooling components including fans and pumps (in the case of pumped liquid cooling) which now occur so often that the systems that employ them have to mount them so that they can be easily swapped out without turning the machine off along with the ability to reject heat loads from devices that produced 500 or more Watts and to cool efficient devices such as CPUs and GPUs mounted in laptops where improved energy efficiency can improve battery life.

To appreciate the benefits of employing LHPLs to cool electronic enclosures, including air and water cooled electronic devices used to do everything from control the operation of space vehicles to reject heat to the cooling towers of data centers, it is first necessary to recite the goals of this disclosure, which were to efficiently cool electronic enclosures in which semiconductor devices that rejected large quantities of heat (greater than 200 Watts) mounted on densely packed PCBs along with devices that shared the same enclosures that rejected the balance of the heat but did not provide a dense source of heat. In the case of air cooled enclosures housed in rack mounted chassis, we wanted to make the first goal achievable while at the same time improving the quality of heat being rejected to the data centers CRAC system. In cases where liquid cooling, including chilled water was available on the data center floor, our goal was to reject high quality heat all the way back to the data center cooling tower, on a year round basis in most localities in the world. To achieve these goals, we employed LHPLs, some of whose other outstanding properties in addition to the fact that they are passive devices, turns out to be that the eliminate most of the electric motors, fans, blowers, compressors and other rotating devices found in servers and throughout the data center that end up making noise, contribute to frequent server failures and cost money to maintain and operate.

These goals don't get met without skepticism from prior art and other technologies, so we will now address the advantages of our approach in detail, while at the same time laying out the critical items that need to be overcome to reach our goals.

There are a large number of technologies that have been recently investigated whose main purpose has been to improve the heat transfer capabilities of devices that can be used to cool semiconductor devices that reject large quantities of heat. LHPLs continue to remain as good or better than these other devices. We will examine just a couple of the higher end sensibly cooled heat exchange technologies: microchannels and jet impingement. Microchannels require a liquid under pressure, usually pump driven and drive the liquid across a channel which extracts heat from the processors heat spreader. The contact areas that can be achieved with these devices is less than the wick areas provided by LHPLs which means to provide equivalent cooling, they need to make up for the fact that LHPLs absorb a factor of 100 as much heat per gram of coolant than they typically do. As a consequence, they end up leaving the region of the device at higher velocities and at much colder temperatures. It is also very difficult for them to provide uniform cooling across the entire heat spreader for the simple reason that they do not uniformly expose the heat spreader to a uniform flow. Jet impingement, on the other hand does expose the surface to a more uniform flow, but because of a characteristics of the way in which jets interact with surfaces along with the fact that the heated water has to be quickly removed from the region of contact, a fair amount of mixing goes on, again reducing the temperature of the resulting effluent. The heat transfer coefficient of the LHPs employed in our experiments was 0.15.degree. C./Wc-m.sup.2. This state of the art performance makes it possible to cool semiconductor dies whose are is 1 inch squared and reject as much as a kilowatt. It is possible that jet impingement may be able to cool devices that reject more power, simply because of the energy that they can eject into the flow employing pumps. But, for now at least, what we have just demonstrated is that for all of the semiconductor devices that are available or likely to become available, this technology not only can reject as much energy as the competitors, but do it without requiring additional energy and at the same time producing effluents whose heat quality is excellent.

The critical role that LHPLs perform in the removal of heat from hot semiconductors, is they make it possible to remove large quantities of it, using small devices that can be packed into small locations and while at the same time providing rejection distances that make it possible to locate large efficient condensers that may employ counter-flow designs at locations in the electronic enclosure where that heat can be exchanged with either air or water. That being said, the next most important feature of the technology that this disclosure brings to the table is methods that make it possible to maintain the quality of that heat as long as possible, whether it be exchanger with air or a chilled liquid. This is a crucial part of the design approach to the heat transfer problem that we have taken.

The method we will use to greatly improve the overall coefficient of performance (COP) of the data centers cooling is by eliminating the majority of the motors typically employed to cool a data center. For this feat to be realized, it becomes important to maintain the quality of the heat being rejected by the rack cabinets that the data center may use to contain its server units.

One of the big problems in energy conservation is underestimating the important role that the quality of the heat being rejected to the final cooling device in major thermodynamic systems plays in the overall cost of buying and operating such systems. Reducing the quality of the heat too much in the case of coal fired powerplants results in the sulfuric acid condensing out in them so fast that they have to be frequently replaced. In the case of a clean large multi-megawatt fuel cell powerplant, extracting too much energy from the exhaust flow ends up driving the cost of the energy and the fan required to cool the plant up to the point where the savings get lost. The implication for data center cooling is, keep the quality of the heat up, unless you want to spend a lot of money rejecting it at the cooling tower. In existing systems, the cost of rejecting it at the cooling tower consumes 25% of the cost of running the data center, i.e., running a water chiller.

The naive approach to the use of passive heat devices suggests that like the extra cooling loops that currently consume close to 35% of the energy required to run a data center, simply stringing a series of these devices in a row, ought to be able to solve the cooling problem, without even using a cooling tower. As it turns out, a sequence of such devices will operate less efficiently than a single large Loop Heat Pipe, whose condenser line moves the heat the same distance, simply because a sequence of these devices will end up losing energy at each point of contact that connects the devices. And, since the effective driving range of the LHPs used to cool the semiconductor devices we are working with is several meters, the bottom line is that unless the cooling tower you are planning to use is in the immediate vicinity of the server you are cooling, stringing passive device together does not buy very much, but does just like the sequence of cooling loops currently employed, does dramatically degrade the heat you are attempting to reject. So, the ground rule for employing LHPLs employed to cool semiconductors turns out to be, exchange the energy with another secondary coolant, preferable one in the liquid state, as quickly as possible, if your goal is to use that coolant to drive a cooling tower directly, or to employ that heat in a cogeneration scheme or if it is simply to return air to a CRAC units heat exchanger at the highest possible temperature, thereby improving the efficiency of even an air cooled data center.

Having rejected the heat from the primary heat load in our electronic enclosure with the highest possible quality to either an air or in the case of a liquid, most likely chilled water, our goal now becomes to move it to the outside world with the smallest loss in energy. However, while doing that, we also need to consider how our LHPL primary heat removal solution interacts with the rest of the devices we use to gather up heat from the enclosure.

In data centers in which the average rack cabinet only consumed 5 KW, the fans on the rear of rack cabinets were a convenient way to help cool the contents. However, their main function at today's power levels of 20+KW, is mostly to hide the unsightly cables that drape the servers contained in the cabinet. A significant portion of the air being drawn through a typical rack cabinet ends up being drawn around the stack of server chassis within and often the asymmetric flows within the cabinet can result in eddies that circle back to the front of the cabinet near the top, heat up the top servers by as much as 15 degrees F. To get around that problem fans can be added to the top of the rack cabinet and baffles inserted between the servers and the side panels. A better way to employ such fans, is simply to insert a duct in the cabinet that can be used to gather up all the air from the rack mounted chassis and exhaust it out the rear of the cabinet by connecting it the fans on the rear door or out the top using fans mounted on the top panel or possibly to the CRAC units return air flow ducting. To make sure that this duct does what it is intended to do, a mechanism has been provided in the disclosure to seal the chassis to the duct and at the same time make sure that in the event that a chassis is not installed the duct does not leak. Furthermore, to help solve the problem of potential leaks in situations where direct chilled water is being employed within the rack cabinets, the duct can be used to contain the chilled water manifolds that serve the rack mount chassis. Finally, to make it possible for the air being removed from the rack to be reused without having to make the long trip back to the CRAC units blower, simply inserting chilled water air heat exchangers in the exit path from the rack mount chassis to the duct, makes it possible to eject the air from the cabinet at the ambient air temperature of the room. This strategy has a number of benefits of other approaches to the cooling of high power rack mount chassis that employ water cooled air heat exchangers within the rack cabinet. Besides taking up much less space in the rack cabinet, and making it possible to employ distributed heat exchangers whose total area is much larger than the ones employed by other solutions, it also reduces the total high speed fetch that the air has to make. And in the process, the amount of energy that gets injected into air flows ends up being minimized.

Reducing the energy employed moving air is one of our overall goals. When we have to do it, our goal is to move the air the smallest distance at the smallest possible speed that gets the cooling job done. The reason for this is quite simple, energy losses due to drag scale as the velocity of the air cubed multiplied by the distance it travels. Keeping the velocity and distance down, makes an enormous difference in the energy consumed by the fans driving the serves, rack cabinets and the data center itself. The technology we employ cuts down on these losses three different ways. First, when exchanging energy between air and either the primary coolant being chilled in a condenser, or a chilled liquid that is cooling it, employing finned condensers that have large areas, which our technology enables by doing things like moving the heat being rejected out of tight spaces, ends up reducing the velocity of the air required. Next, by moving air the smallest distances possible, which we make possible by picking up secondary heat sources in 1 U sealed rack mount chassis (which reduces the distance and velocity needed) or by cutting down on the distance that air needs to flow at high velocities when it is being cooled by a negative pressure duct, or by completely eliminating the need for the air to travel back to the data center's air heat exchanger, we make large reductions in the amount of energy that needs to employed by air fans and blowers. This strategy plays an important role in our energy conservation effort, and is embodied in both our sealed chassis and sealed duct designs.

The final energy reduction principle that needs to be taken into account that out embodiment improves, is water condensation. In some data centers, as much as 40% of the energy being employed by water chillers gets used to remove (by condensation) water vapor from the cooling flow which then, apparently needs to get added back into the flow to keep IT people wandering through the data center happy. It turns out that there no longer is and ESD requirement on the minimum air content of the air being employed in data centers, which basically means that keeping the relative humidity below the point where condensation occurs in the equipment can now be achieved by simply making sure the dew point of the air in the systems being cooled is less than the temperature of the liquid coolant being employed to cool systems, saving roughly 10% of the energy employed to cool some data centers, especially those in humid localities.

Our sealed chassis embodiments make this possible by keeping the dew point of the air inside of the rack mount chassis below the temperature of the coldest liquid coolant employed. This is simply accomplished in an embodiment in which we pass slightly pressurized air through a cold trap that removes excess water from it before slowly bleeding it into the "sealed" chassis, that are allowed to slowly leak air back to the ambient, at a rate that guarantees that the average air content of the chassis remains dry enough to avoid condensing if and when it comes into contact with chilled surfaces.

When it comes to cooling air cooled enclosures in general, LHPLs make it possible to make great strides in efficient uniformly distributed air cooling, by the simple act of placing the LHPL condenser at the point in the chassis where the air flow is normally exhausted out of the chassis. In the two enclosures we have studied, 1 U rack mount chassis and desktop cooled chassis, the fans that are employed on the exterior surfaces of these chassis have provided high enough flow rates to in the case of a 1 U chassis only require a single blower (already employed to pull air out of the chassis) to cool a pair of 120 Watt processors (it normally takes four to eight 1 U fans to accomplish the same task) and a single 120 mm fan running at just 1800 RPM to cool a 500 Watt CPU sitting in either the PCIe bus of the system. In all of the chassis we have examined, including the 4 U chassis employed to cool four to eight Opteron multi-core processors, the existing fans on the rear wall of the chassis that we have examined have more than enough cooling fans to make it possible to cool all of the processors, without the need for CPU fans. Which is to say, all of the chassis tested, when their CPUs were cooled using LHPLs, could get by without the need for CPU cooling fans. Not only that, the CPUs that were being cooling in situations like the 4P/8P chassis, normally require very high air flow rates even with cooling fans that fit into 2 U tall spaces simply because the CPUs in the front row end up heating the air used to cool the rear row of processors. This problem goes away with LHPLs, making it possible to actually reduce the air flow rates on the rear wall while at the same time eliminating the four to eight fans typically used to cool processors. And, while we can't claim that air cooling does as good a job as water cooling, we have gone about as far as you can go with air cooling to maintain the quality of the heat being rejected. In addition to providing sealed ducts, more uniform distribution of cooling air across the chassis and the reduction of the ambient temperature within the chassis, we have also introduced LHPL condenser designs which employ counter-flow cooling, which results in increased exit flow air temperatures which in turn end up improving the efficiency of an air cooled data center's water chiller.

When it comes to liquid cooling, the embodiments provided make it possible to employ LHPL cooling with condensers that are either directly or indirectly cooled with chilled liquids including water, safely. A new method for interfacing all closed loop passive heat transfer devices to chilled liquids has been introduced which employs a cold plate along with what we call a cold spreader (that is thermally attached to the LHPL working fluid's condenser lines) that comes into contact with the cold plate when a rack mount chassis gets installed inside of a rack cabinet. This interface, while not quite as efficient as the directly cooled interface we are about to describe, in certain situations, like blade and COTS Single Board Computer (SBC) situations, makes it possible to cool these devices as well, without using the quick disconnects that direct chilled liquids require. To improve the quality of the heat being rejected by these split condensers, a counter-flow version is also embodied and examples are provided of how to employ the cold plates that are a component of a split condenser to also cool air that is either circulating within a sealed chassis or being passed through a chassis that is being evacuated either by internal fans or a negative pressure air duct.

The most efficient cooling that we believe can be obtained using LHPLs comes when they are cooled directly with chilled liquids housed in a sealed enclosure in which the remainder of the components within the enclosure are being cooled by either liquid cooled cold plates, air that is circulating about a chassis that includes cold plates that cool it and the PCBs in the chassis and that is driven by low energy fans or blowers or air that is being circulated through the sealed chassis that passes through a chilled liquid air heat exchanger that may be a part of a component that includes the LHPL's condenser. The condenser design that we created that did the best job of producing high temperature effluent employed counter-flow heat exchange and used a chilled water jacket that was made of a material that does not readily conduct heat in addition to employing a helical wire that was thermally attached to the serpentine shaped condenser pipe, forcing the liquid to take a longer path and simultaneously increasing turbulent flow.

The final claim in the disclosure is for a data center cooled with the afore mentioned devices in which the servers in the data center room is directly attached to the cooling tower, eliminating the need for air ducting, special insulation in the walls of the data center (to keep humid air out), the need for an air blower and finally the water chiller employed by the air blower, in localities in the United States, when on the hottest most humid days of the year, an evaporative cooling tower will return water to the data center room that is at least 30 C, which is to say for most locations as hot and humid as locations like Atlanta Ga., 365 days of the year.

DEFINITIONS USED

Loop Heat Pipe (LHP)

A Passive two phase heat transfer device that consists of an evaporator that contains a wick that effects heat transfer between the item being cooled and the LHPs working fluid and produces capillary pressure and a compensation chamber on its liquid input side along with a set of condenser tubes that transports the working fluid to and from a condenser.

Loop Heat Pipe Like (LHPL)

A device that contains all the ingredients of a Loop Heat Pipe or Capillary Pumped Loop that has some additional derivative feature such as a pump at any point along its condenser path designed to either increase the working pressure of the working fluid or extend its reach.

Capillary Pumped Loop (CPL)

A device that contains all of the ingredients of a Loop Heat Pipe but in which the compensation chamber is no longer situated at the entry point to the evaporator.

Standard Heat Pipe (HP)

A tube gets heated at its evaporator end where heat is applied causing its working fluid to vaporize before moving to the other end where it gets cooled and condenses and then returns to the evaporator end through a wick that lines the walls of the tube.

Two Phase Passive Heat Transfer Cooling Devices

LHPs, LHPLs, CPLs, HP, Thermo siphon and any similar device

Two phase Heat Transfer Cooling Devices

Any device that is a member of the Two Phase Passive Heat Transfer class of devices plus any device that transfers heat between an evaporator and a condenser that employs a pump to effect the motion of the working fluid.

Primary Heat Load

The sum of the heat being rejected by the "hot devices" within an electronic enclosure Secondary Heat Load The heat being rejected by devices other than those included in the primary heat load.

Thermally Attached

Techniques which connect a pair of thermally conducting devices together which improve heat transfer between the two such as soldering, the employment of heat conducting epoxies and thermal transfer products that use solids and pastes along with the use of clamping pressure.

SUMMARY

Methods were disclosed which make it possible to employ Loop Heat Pipe, Capillary Pumped Loops and other passive closed loop heat transfer devices to cool electronic components housed in electronic enclosures, including rack mount chassis housed in rack cabinets, desktop computers, COTs computers, telecommunications equipment, electronics employed in vehicles and virtually any electronic enclosure one can imagine in which either air or a chilled liquid can be provided to cool the enclosure.

The resulting methods made dramatic reductions in the amount of energy employed to cool electronic components housed in electronic enclosures while at the same time making dramatic improvements in other operating characteristics, including reliability, the amount of heat being reject to the outside world, the amount of noise produced, the size of the power supplies needed to power units, the cost to build and operate data centers and last but not least, the ability to cool very hot electronic devices housed in electronic enclosures that are densely packed.

The embodiments included designs for LHPL condensers, including air and water cooled condensers that employed counter-flow techniques, LHPL CPU heat spreaders, sealed chassis and sealed air ducts, methods for controlling the vapor content of air within sealed chassis, methods for connecting chilled liquid sources to condensers including split condensers that eliminate the need for quick disconnects and quick disconnects that are shielded from the chassis being cooled by a duct.

The methods included embodiments that make it possible to cool the majority of the data centers operating in the United States without having to employ either air blowers or air chillers 365 days of the year, reducing the acquisition costs significantly while at the same time reducing the energy consumed by 40% or more.

BRIEF DESCRIPTION OF THE DRAWINGS

The drawings are illustrative embodiments. The drawings are not necessarily to scale and certain features may be removed, exaggerated, moved, or partially sectioned for clearer illustration. The embodiments illustrated herein are not intended to limit or restrict the claims.

FIG. 12 is a different view of the chassis shown in FIG. 11, with all but the top most chassis penetrating through the sealing flap within the negative pressure air duct they are attached to.

DETAILED DESCRIPTION

Figure 1:
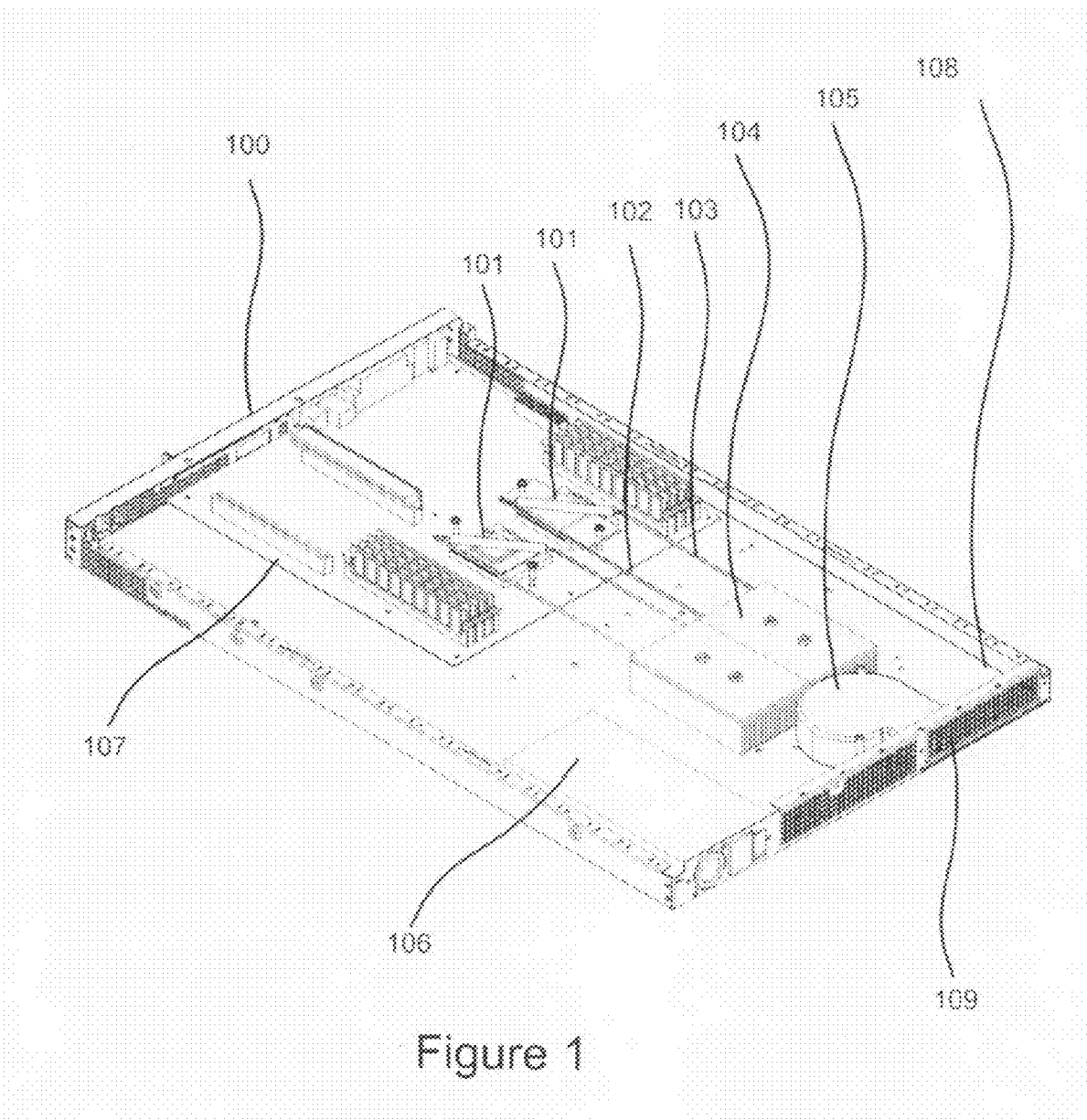
FIG. 1 is a perspective representation of an exemplary embodiment of a 1 U rack mount chassis that employs Ammonia Nickel Loop Heat Pipes to cool a pair of hot running CPUs.
Figure 2:
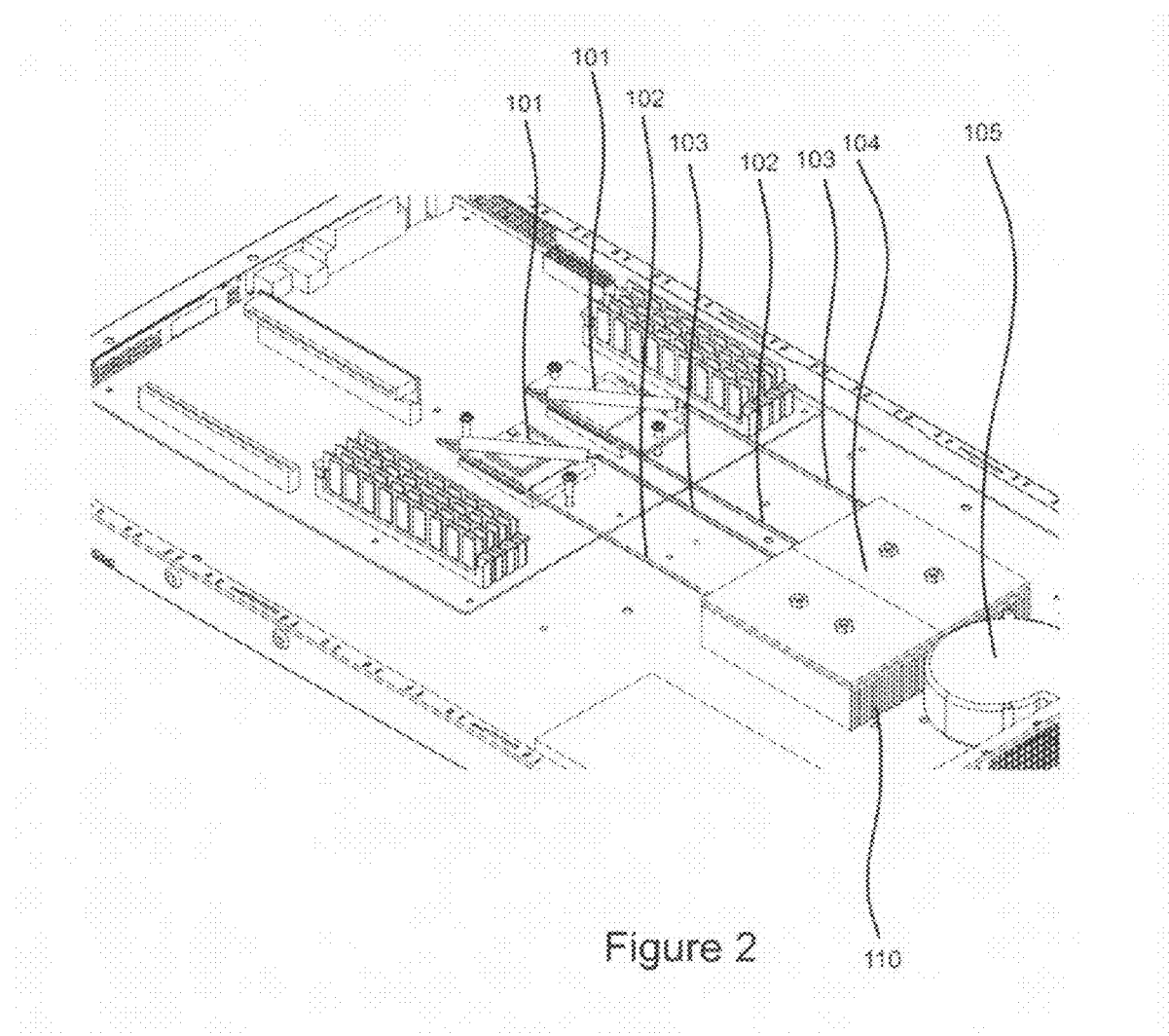
FIG. 2 is a perspective representation of the design shown in FIG. 1 shown in greater detail.
Figure 3:
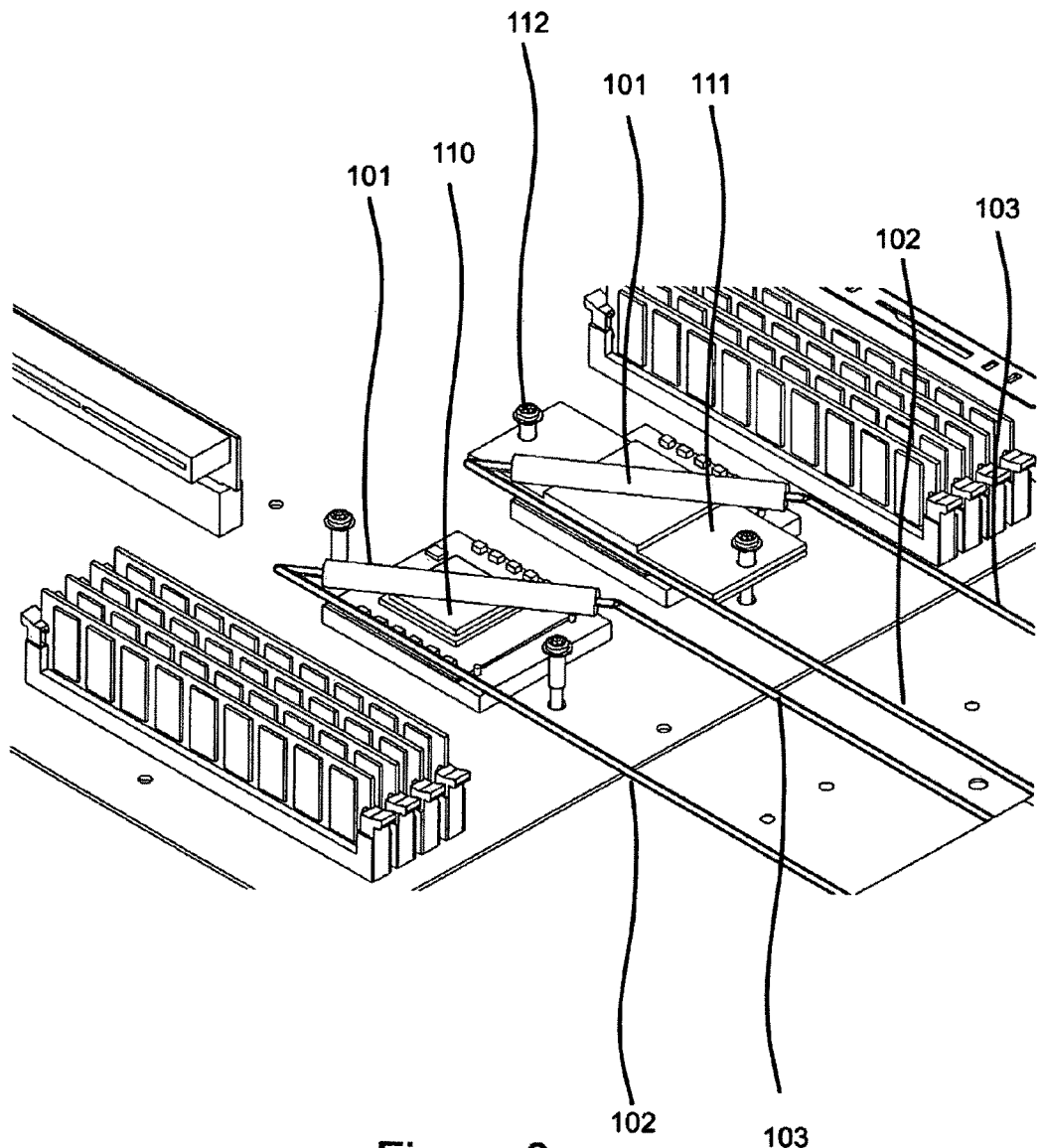
FIG. 3 is a perspective representation of the design shown in FIG. 1 shown in greater detail.
Figure 4:
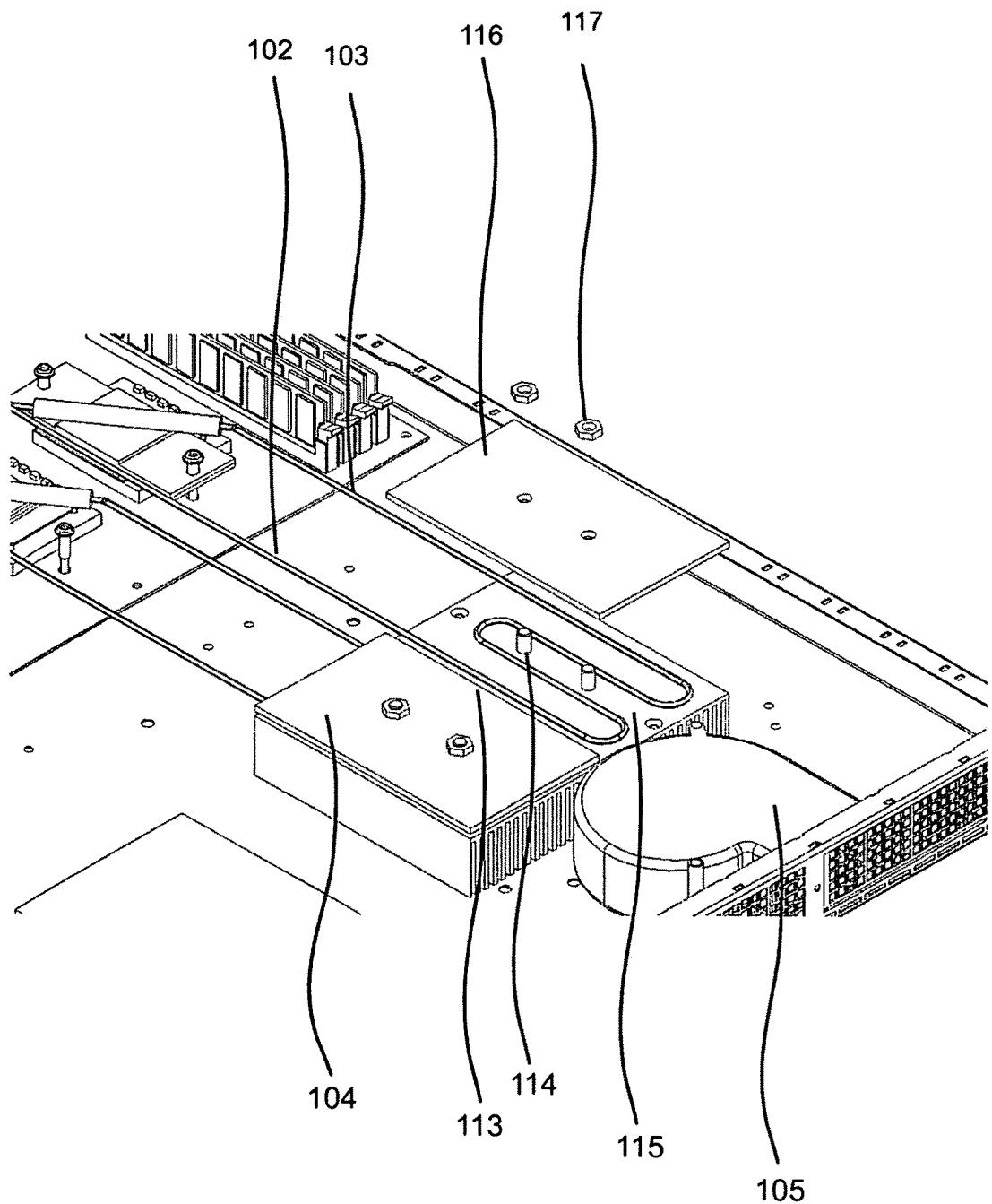
FIG. 4 is a perspective representations of the design shown in FIG. 1 shown in greater detail.

Referring in FIG. 1 of this disclosure, this figure provides a perspective representation of an exemplary embodiment of a 1 U rack mount chassis 100 that employs Ammonia Nickel Loop Heat Pipes to cool a pair of hot running CPUs. FIGS. 2, 3 and 4 are perspective representations of the same design shown in greater detail. Many of the drawings and figures include oblique perspective 3D views of full scale devices that we have experimented with or modeled and were designed to prove the concepts contained in this document. Frequent reference will be made to the specific exemplary embodiments presented of devices that demonstrate the principles claimed, but it is to be understood that the claims and inventions are not limited to the specific exemplary embodiments used to demonstrate the claims and concepts. Nor are the Loop Heat Pipe Like devices referred to limited to Loop Heat Pipes or for that matter the Ammonia Nickel Loop Heat pipes shown in all but one of the figures, but can include other Loop Heat Pipes made of different materials that employ different working fluids that have been described in prior art and publications.

Contained within the 1 U rack mount chassis 100 is a pair of CPUs that are mounted on a PC server motherboard 107 that are being cooled by a pair of in this exemplary embodiment, Ammonia Nickel LHPs whose evaporators 101 sit on the CPUs being cooled and whose working fluid is being cooled and condensed from a gas back into a liquid by the a condenser 104 using cool air flowing through the chassis by the exit blower 105 that is normally employed to pull air through 1 U chassis. The device being used to pull air from a chassis can also be a 1 U fan. This exemplary embodiment illustrates how the existing fan that comes with a 1 U chassis can also be used to cool a pair of CPUs using a condenser whose details are discussed below. This figure also calls out the condenser line 103 that returns the condensate back to the evaporator and the condenser line 102 that transports vapor from the evaporator to the condenser. The sharp angle shown in the drawing where the condenser line 102 attaches to the evaporator body 101, in the devices we used, was rounded. Also called out in this figure are the power supply 106, the rear wall of the 1 U chassis, 108, and the exhaust port employed by the blower, 109.

In this exemplary embodiment the rear exhaust device 105 that already is a part of existing 1 U chassis designs is used to cool both processors eliminating the need for between four and eight CPU cooling fans that are needed when heat exchangers are mounted directly on top of CPUs. This reduction in components, points of failure, noise and the need for electrical power is made possible by the passive nature of the loop heat pipes employed along with the use of a condenser whose finned heat exchanger has a much larger area than the fins typically used to cool these CPUs when they are mounted on a base plate that sits on top of the CPUs. It is this increased fin area that dramatically reduces the need for high speed air to cool the CPUs. The rear region of the 1 U chassis is being accessed here using LHP condenser tubing whose OD can be as small as 0.1" and carries the hot vapor that is being extracted from the wick inside of the LHP evaporator that is thermally attached to the CPUs and carries this vapor to the condenser where the heat it carries gets exchanged with the air flowing out of the chassis just before it leaves, eliminating recirculation within the chassis, reducing the need for increased air cooling velocities, all of which combine to make it possible for a single blower to cool a pair of CPUs.

FIG. 2 is a more detailed view of the exemplary embodiment shown in FIG. 1. In it we can now see all four of the condenser lines used to connect a pair of LHP evaporators with their condensers. In this figure the liquid return lines 103 and the vapor exhaust lines 102 can be clearly seen as well as the fins at the bottom of the condenser.

FIG. 3 is an even more detailed view of the exemplary embodiment shown in FIG. 1 in which we have exposed the left hand CPU 110 by eliminating the heat spreader 101 seen covering the right hand CPU 111. This figure also calls out the four screws that are exemplified by 112 that are used to clamp both heat spreaders to their CPUs as well as the evaporator shells 101 that contains the wick structure that pumps the primary coolant passing through the LHP and also exchanges heat between it and the CPU being cooled.

FIG. 4 is the first of many exemplary embodiments of a three piece condenser. All of the exemplary embodiments in FIGS. 1 thru 6 uses three piece condensers similar to the one pictured here. In this exemplary embodiment, the finned portion of the condenser becomes semi-permanently attached to the base of the 1 U chassis, greatly simplifying the removal of CPUs. This condenser design makes it possible to remove one or both CPUs by first removing the screws 117 and studs 114 that provide the pressure required to get good thermal contact between the condenser tubing 113 and the base plate of the heat exchanger 115 using a clamping plate 116 that can be easily removed to make it possible to remove heat spreaders 101 (in FIG. 3) that clamp the evaporator section to the CPU without removing the bulk of the condenser's body.

Figure 5:
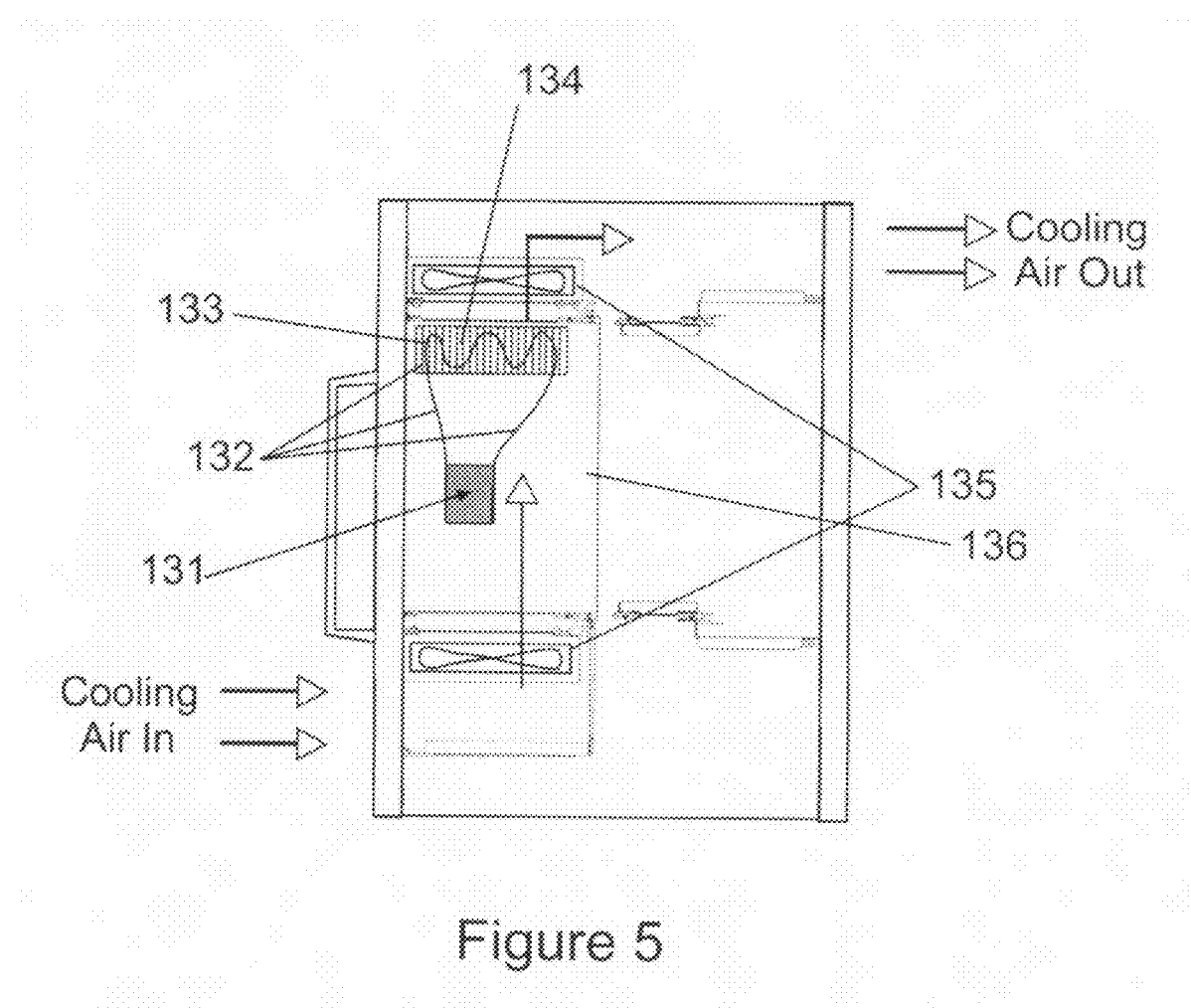
FIG. 5 is a sketch that demonstrates where to locate an LHP and its exit flow condenser used to cool SBC (single board computer) cards in a typical COTS (i.e. PICMG, VME or similar chassis) chassis that contains semiconductor devices that reject large quantities of heat.
Figure 6:
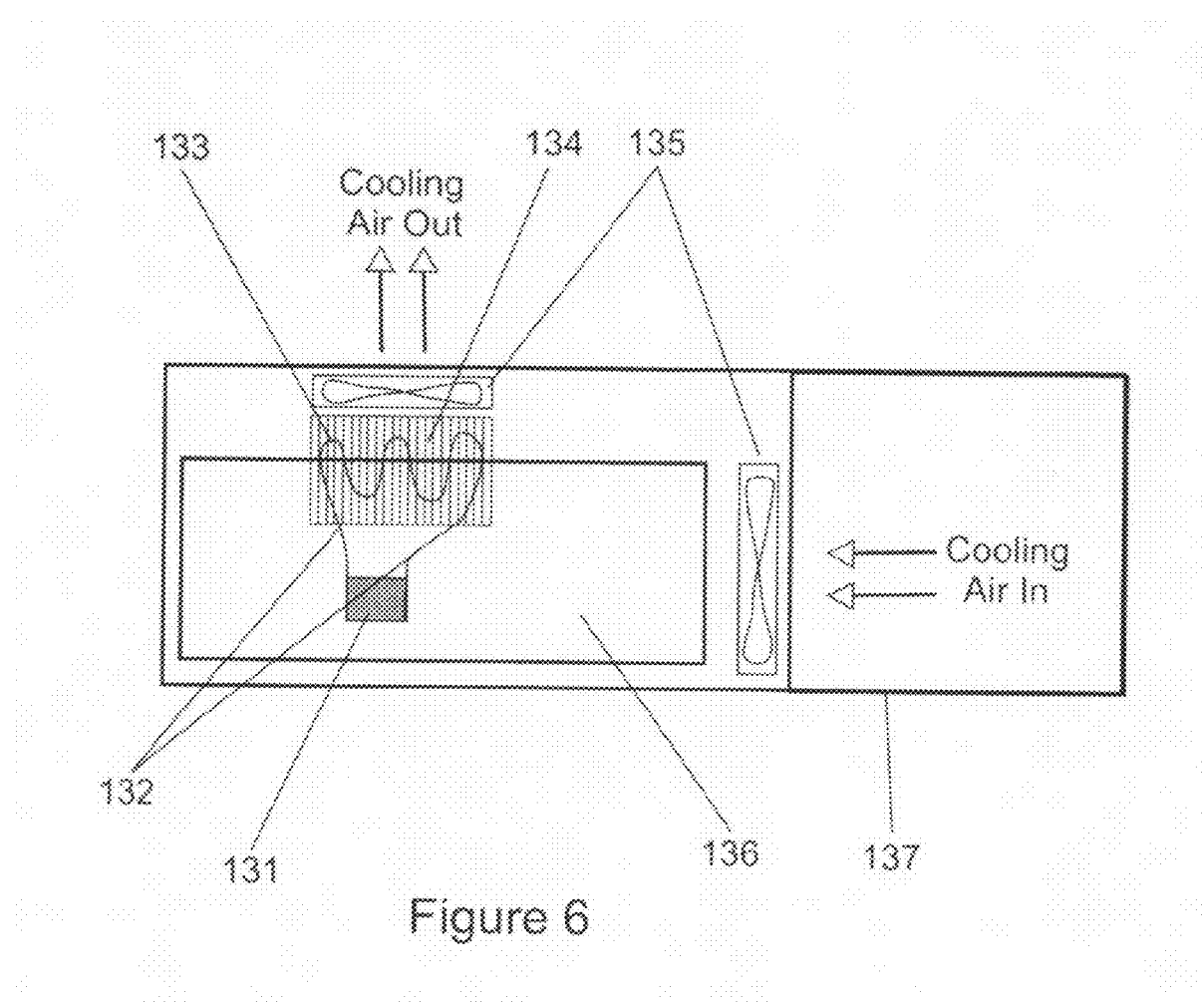
FIG. 6 is a sketch which demonstrates one method of cooling a PC chassis that contains an add in card (i.e. ISA, EISA, PCI, PCIe, HTX or similar) located in an "I/O" channel that contains a component which rejects a lot of heat and is cooled by an LHP and its condenser.

FIGS. 5 and 6 are sketches that demonstrate where to locate exit flow condensers used to cool SBC (single board computer) cards and similar devices upon which are mounted semiconductor devices that reject large quantities of heat, including but not limited to high power CPUs, GPUs and FPGAs all of which are designed to slide or fit into a chassis that includes some sort of backplane that connects these cards to either similar devices in the system or a motherboard. The cards that we are typically talking about include COTS style cards one well known form of which is called PICMG used in standard systems that are not limited to the ISA, EISA, PCI, PCIX or PCIe busses, even though these have become the standard and most popular busses for interconnecting such devices. Either of the techniques could also be used to cool what are today referred to as blades—PCBs that slide into blade chassis and which like COTS cards typically use card edge guides to guide them into a rear mounted backplane for which there is no common interconnect standards. Blades turn out to be just another form of SBC used in HPC (high performance computing).

In the case of a blade or SBC card mounted in a COTS or Blade chassis, an air path is normally provided for cooling which directs the air across the board in either a vertical or horizontal direction. Normally, COTS style SBCs are housed in special chassis. The solutions described herein could be used in situations where multiple rows of blades are cooled by air that is directed vertically through a plurality of them.

The ideal location for an LHP air-cooled condenser in this exemplary embodiment of the invention is at the location where the air normally exits the blade. FIG. 5 is a side view of an industry standard COTS PICMG chassis taken off of the web. In this commercial design a pair of fans (135) are used to bring air in below a CPU card (136) and pull it over the card and then exhaust it vertically. The route used causes the air to flow over the other components in the card before flowing over the LHP evaporator (131) that is mounted on a hot component like a CPU before flowing over the finned heat exchanger (134) that forms half of a split condenser whose other half is a serpentine shaped condenser line (133) that is connected to the evaporator with a pair of lines (132). The rising air leaves the region of the processor card helped by the second fan in this push pull arrangement.

FIG. 6 uses a similar technique to cool cards installed in the I/O channel of a typical PC motherboard installed in a PC desktop chassis that is shown lying on its side. In this case a heat exchanger is mounted between the top of the card and the chassis cover (i.e. top), which has been fitted with an exhaust fan that pulls air out of the I/O channel section of the chassis. The PC chassis (137) has a front section that normally contains hard disks and peripherals that gets followed by one or more fans (135). The air leaving the fans in the mid section of the chassis then enters the motherboard cavity of the box that also contains the peripheral interface cards (136) that get plugged into its "I/O Channel." FIG. 6 shows an I/O channel card in outline (136) that has a hot component on it that is thermally attached to an LHP evaporator (131) that employs a pair of condenser lines (132) to feed vapor to a condenser before returning liquid back to the evaporator. The serpentine (133) portion of the condenser is symbolically located as well as the air-cooled fins (134) that condense the vapor back into a liquid before returning it to the evaporator. Directly above the fins is a fan that exhausts air out of the box through the cover.

Figure 7:
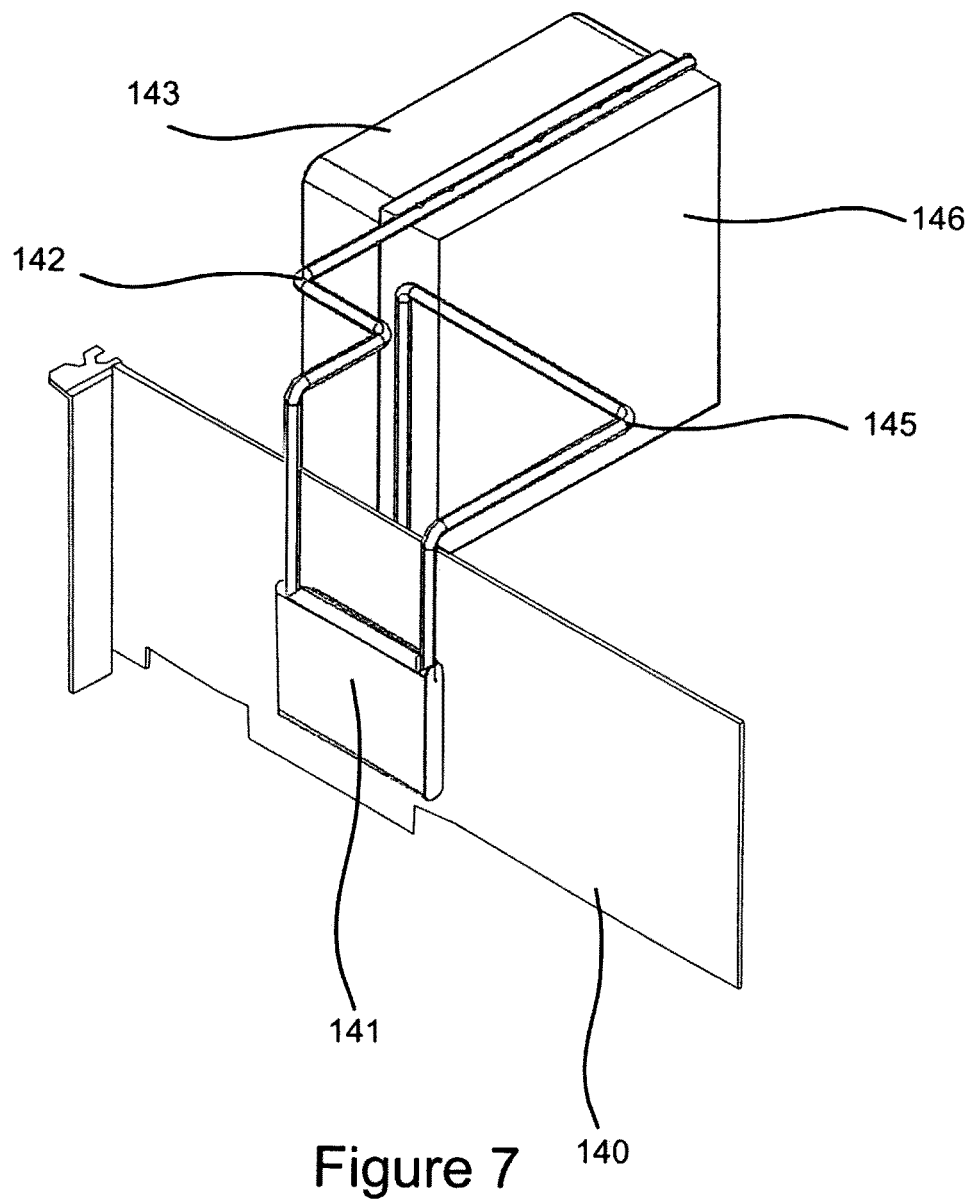
FIG. 7 is a perspective drawing of a PC add in card that is cooled by an LHP whose condenser fan is located on the rear wall of a chassis.

FIG. 7 is a 3D rendering of an exemplary embodiment of a PCIe card 140 that contains a hot device mounted to it that is being cooled using and LHP and exit flow cooling. The exit flow fan 143 in this case gets mounted in most PC chassis on the rear wall of the chassis and employs a 120 mm device to remove hot air from the chassis. The LHP evaporator 141 that is attached to the device(s) being cooled employs a pair of condenser lines: 145 carries the vapor from the evaporator to the condenser 144 while 142 returns the condensate back to the evaporator.

Figure 8:
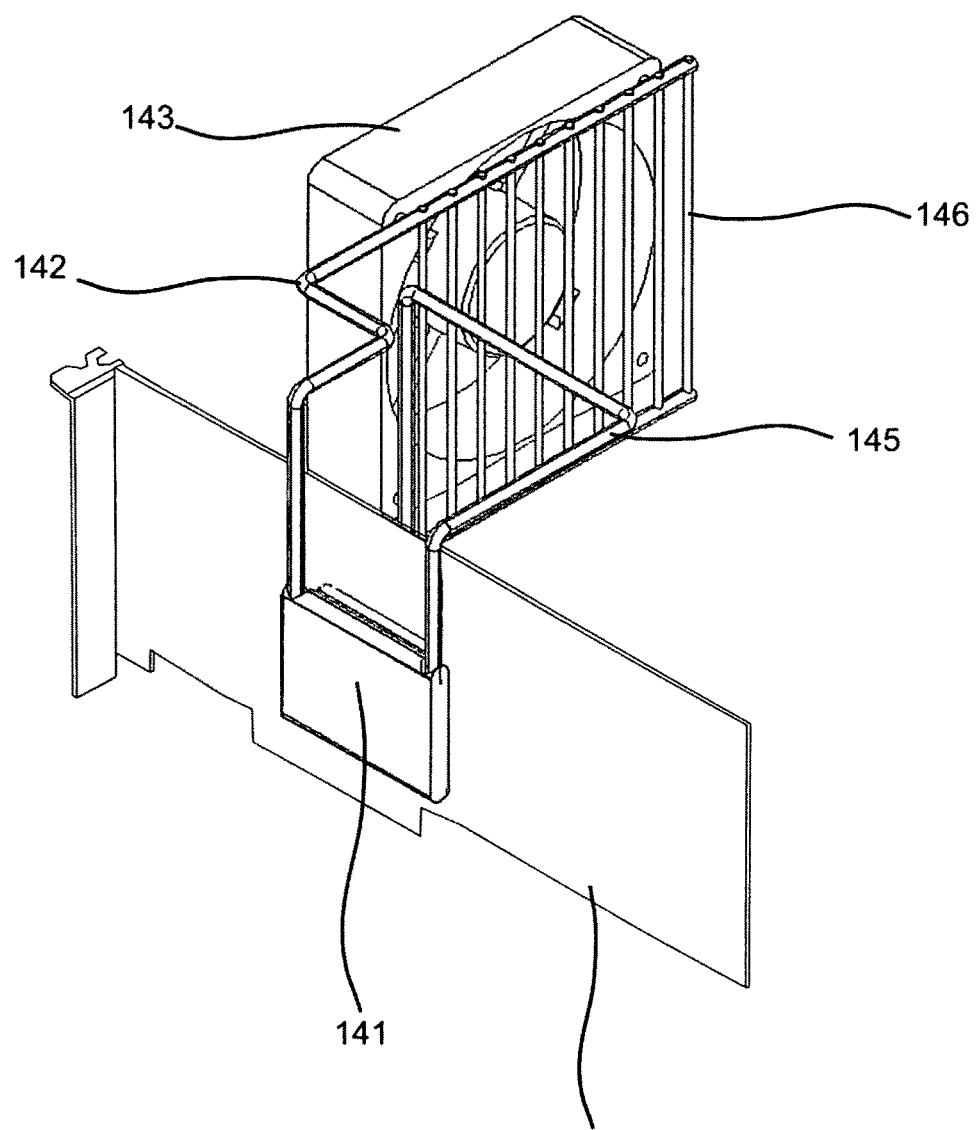
FIG. 8 shows in detail the LHP condenser shown in FIG. 7, including the fan used to pull air through the condensers cooling fins and a low pressure drop manifold within the condenser that improves the performance of a water copper Loop Heat Pipe.
Figure 9:
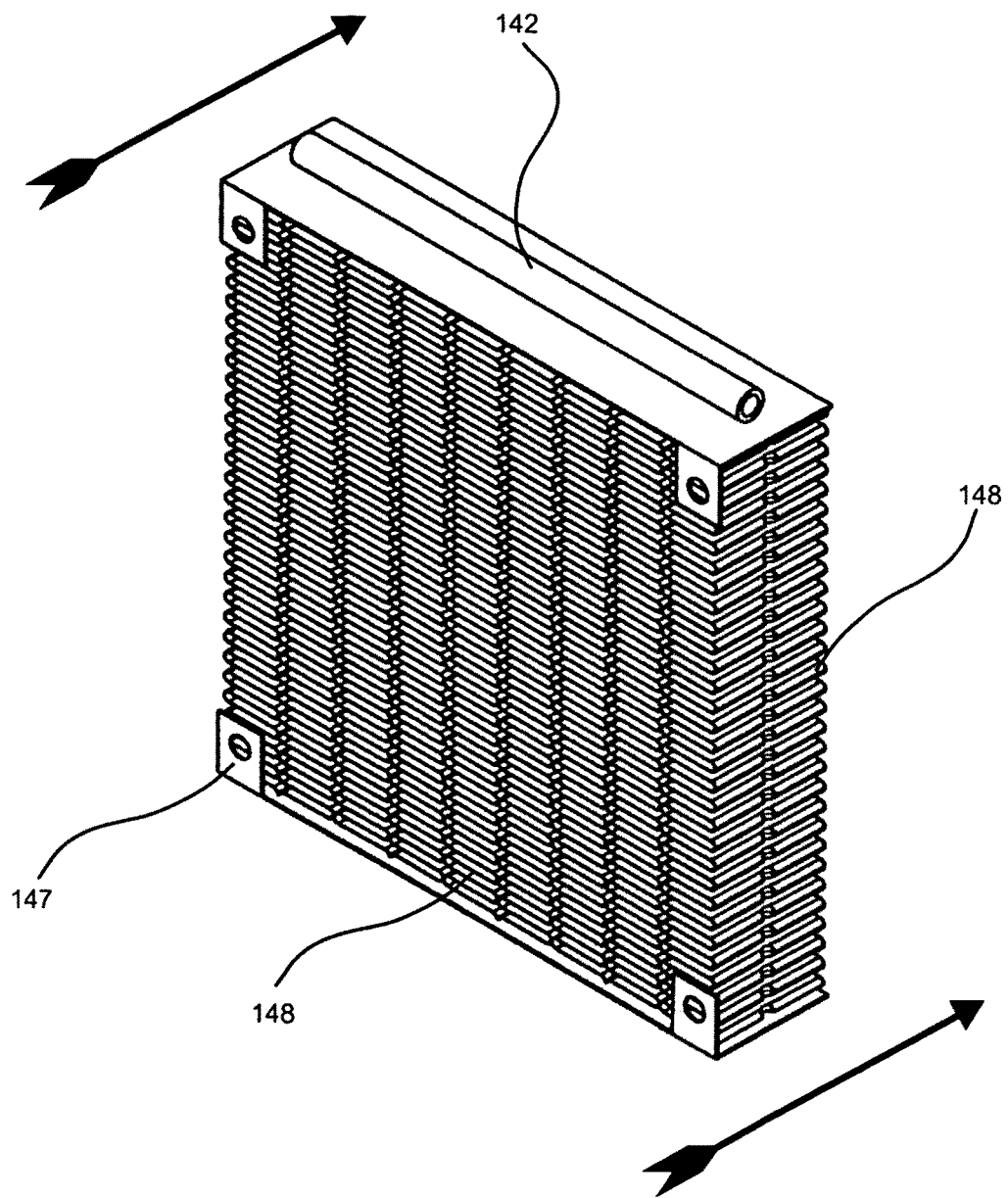
FIG. 9 is a perspective representation of a copper ribbon fin heat exchanger employed by the design shown in FIGS. 7 and 8.

FIG. 8. is a 3D rendering of the same exemplary embodiment shown in FIG. 7. In this drawing a plurality of vertical condenser lines 146 feed the vapor being condensed through the copper ribbon like fins of the exchanger whose approximate details are depicted in FIG. 9 along with the bolt holes 147 that attach the condenser to the fan that draws air through it and expels out of the chassis. Some details of the fan, 143, can also be seen in FIG. 8.

This condenser design employs a series of ribbon like fins seen in FIG. 9, 148, that are thermally attached to the small condenser tubes 146 that sit in the middle of the ribbon like fins which lie in a plane that is perpendicular to the axis of the air flow (depicted in FIG. 9 with large arrows). The plurality of condenser tubes makes it possible to spread the heat being rejected to the plurality of fins without having to use the technique that has been used in the past (i.e. adding ordinary heat pipes that get used to distribute heat within a heat exchanger), taking advantage of one of the major benefits of LHPs over standard heat pipes, and that is the ability of the wick to drive its vapor long distances, which in this case makes it possible to distribute the heat over a huge area of fin like devices that get used to transfer the vapor's heat to the air passing through them. In general, there are two features of condenser design that need to be taken into account in any LHP application. The first is adequate contact area: a condenser design that does not have adequate contact area between the primary vapor and the secondary coolant condensing the vapor will end up not condensing all of the secondary coolant back into liquid when the power being rejected exceeds a critical value. When this point is reached the LHP shuts down. The other is thermal resistance. The total thermal resistance of Loop Heat Pipes and LHPLs is essentially the sum of the thermal resistance of the evaporator and the condenser. Distributing the heat over a large area of fins minimizes the thermal resistance of the condenser helping to improve the overall efficiency of the LHP. This particular condenser has been used to reject up to 600 Watts of power, and while it doesn't have the lowest thermal resistance of the condensers we experimented with, it is ideal for high power devices being cooled by air.

Figure 10:
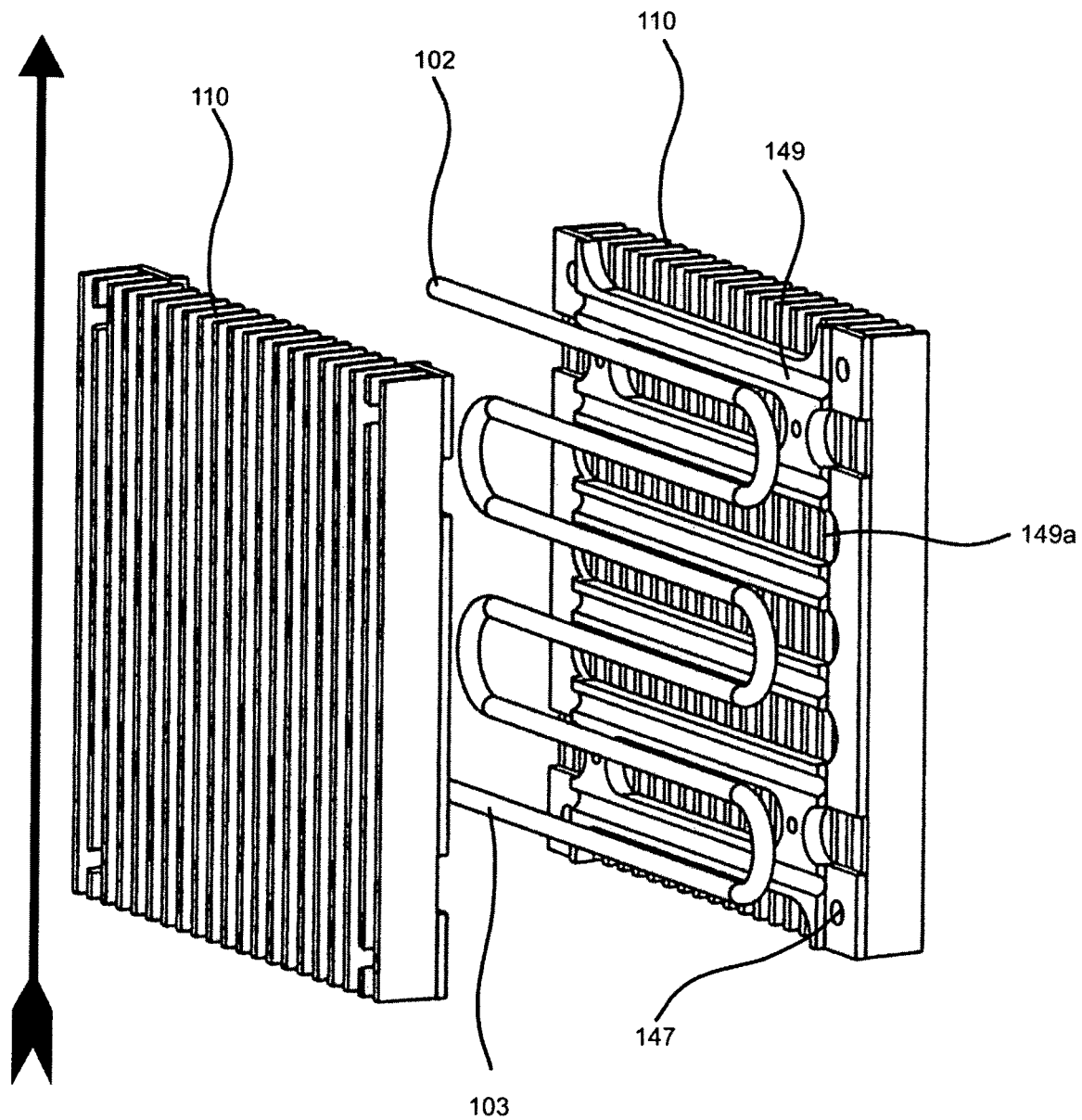
FIG. 10 is a perspective drawing of a set of Aluminum fins that have been arranged to provide counter flow cooling with air running the length of the fins cooling a serpentine LHP condenser pipe.

FIG. 10 is an air-cooled condenser designed to fit into rack mount chassis, such as the 1 U chassis shown above in FIGS. 1 . . . 4. This condenser has been designed for minimum thermal resistance employing a technique that we will also employ below in two other designs. The definition of the thermal resistance of an LHP involves only a pair of parameters, the delta T between the device being cooled and the outlet temperature of the secondary coolant that the condenser emits, divided by the power in Watts that is being transmitted by the device. The goal in any LHP whose thermal resistance we desire to minimize requires us to minimize the delta T between the device being cooled and the secondary coolant. This can be restated when it comes to the condenser, and that is the design that maximizes the temperature of the coolant will minimize the delta T. To maximize the coolant temperature one of the things we need to make sure is that the hottest primary coolant (i.e. the vapor leaving the evaporator) that enters the heat exchanger come into contact with the secondary coolant just prior to its leaving. In addition, if we really want to increase the temperature of the effluent we need to eliminate conduction paths which make it possible for the hot side of the condenser to be cooled by the cold side, which in this case is the side that first comes into contact with cold air. The design in FIG. 10 employs these general principles.

FIG. 10 is a 3D exemplary 3D rendering of an efficient counter-flow style air-cooled condenser. The condenser lines are arranged so that the vapor inlet 102 is at the exhaust end where the air that is traveling up the cooling the fins 110 leave the two finned halves. The primary coolant leaves the condenser pipe at 103 and then moves back to the evaporator. The two halves clamp together using bolts that are inserted into the left half and engage threaded holes on the right side (seen here) labeled 147. The condenser lines make thermal contact with the two halves in machined out groves 149 whose contour has the same radius as the condenser line. To help reduce thermal conduction from the hot end of the condenser fins (at the top in FIG. 10) the base plate that the fins attach to has been hogged out with a plurality of channels 149a that cut through the based plate. The direction of the air flow is vertical and is indicated by the large arrow.

Figure 11:
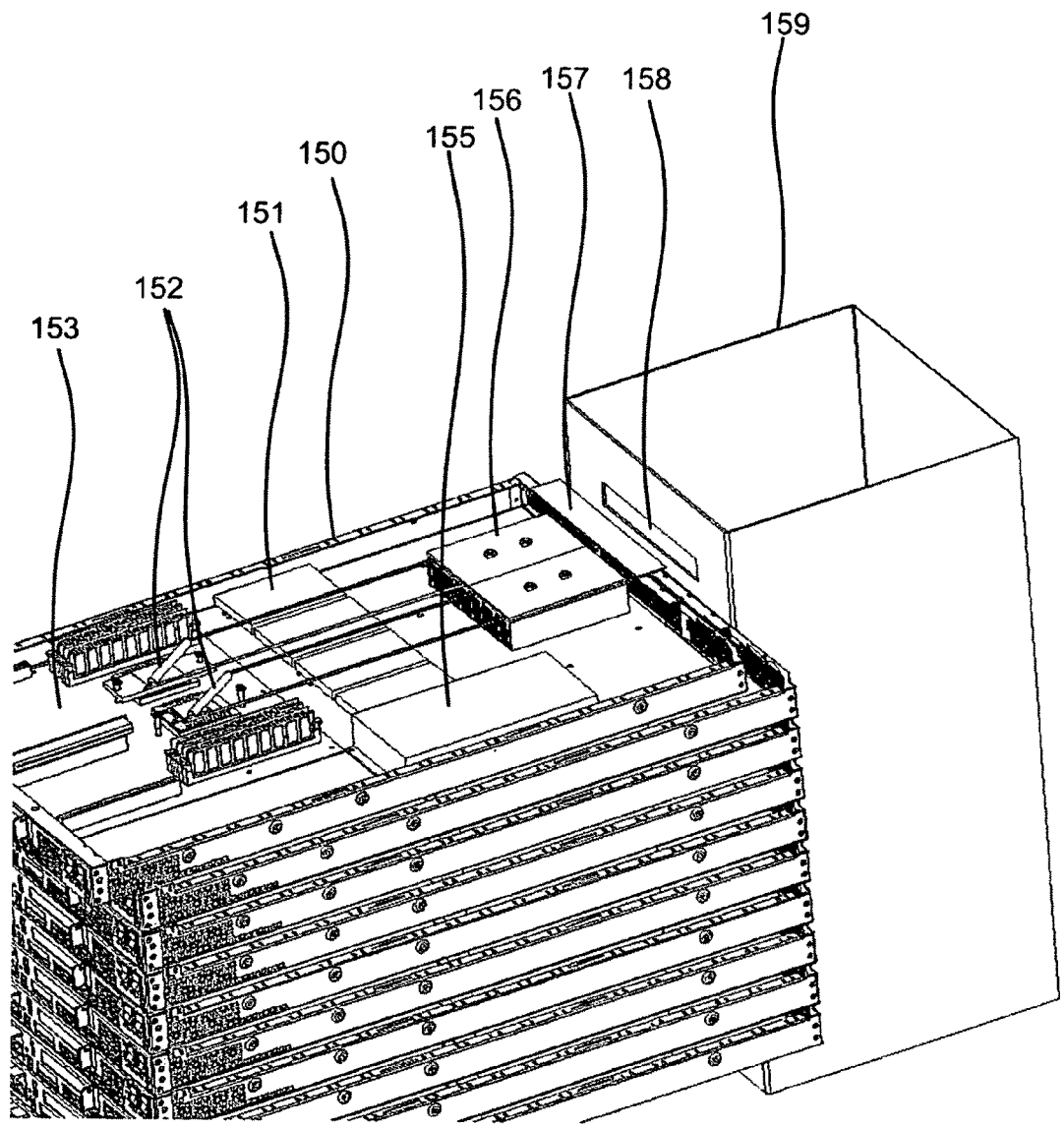
FIG. 11 is a perspective drawing that shows a stack of 1 U rack mount chassis, whose top most chassis is in the process of engaging an air duct used to remove air from all of the chassis in a rack cabinet.

FIG. 11 is a 3D rendering of an exemplary embodiment of a plurality of 1 U rack mount chassis that are being 100% air-cooled using a duct to draw air out of the chassis. The scheme employed is not limited to 1 U chassis, but can be employed by rack mount chassis of any height (1 U, 2 U, . . . NU, etc.). This approach eliminates the need for the exhaust fans employed in FIGS. 1 through 4, all of which employed either the 12V blowers or fans typically used to extract hot air from rack mounted chassis. The use of 12V fans to remove air is wasteful, as the power is most often provided by a power supply that converts AC to DC voltages. Such conversions are never 100% efficient and in general, employing power supplies within rack mount chassis to carry out unnecessary conversions is wasteful. The proper way to evacuate such a duct is using large AC fans located somewhere else in the system. A convenient way to evacuate such a duct is employing the large AC fans that often are mounted on the rear doors of a rack cabinet. Adding plenums (not shown in these drawings but obvious to anyone familiar with the art of fabricating ducts) that connect the duct to these fans is a simple way to simultaneously cut our recirculation within the rack cabinet and at the same time improve the performance of such fans. When this method is combined with water-cooled air heat exchangers placed in the path between the chassis and the duct, it makes it possible to return ambient air to the room eliminating the need for expensive refrigeration units that also take up a lot of space. The duct 159 in this exemplary embodiment has the air within it exhausted by a connection to some negative pressure source below the duct that in the case of an air-cooled data center that relied on its main water chilled heat exchanger only could be the main HVAC return line. The only difference between this exemplary embodiment and one that employed a vertically rising air column would be the orientation of the sheet metal tabs that get described below which get used to seal the duct when a chassis is removed. One of the most important features of the exemplary embodiment is the fact that there exists a seal between the chassis and the duct (typically a crushable material) as well as a method for closing off the slots in the duct that the air is being pulled through when a chassis is removed. One of the main benefits to the cooling of components within the electronics contained by the chassis is the ability to employ bleed air-cooling (i.e. admitting cool air into the chassis through vents placed about the chassis) that is not possible in a typical rack cabinet for the simple reason that there is no guarantee that the air that surrounds a chassis on its sides is cool. In fact, just the opposite, circulation paths frequently set up within rack cabinets about the chassis contained within that allow the hot air at the rear to make its way back to the sides and front. The system within the 1 U rack mount chassis in this exemplary embodiment is virtually identical to the systems rendered in FIGS. 1 . . . 4, employing a pair of LHPs whose evaporators 152 are seen along with the motherboard 153, a power supply 155, four hard disks 151 one of which is called out along with the chassis frame 150 and the split condenser 156 and the horizontal tab 157 that opens the blade that seals the slot in the duct 158 when the chassis gets fully inserted into either an open rack or a rack cabinet.

Figure 12:
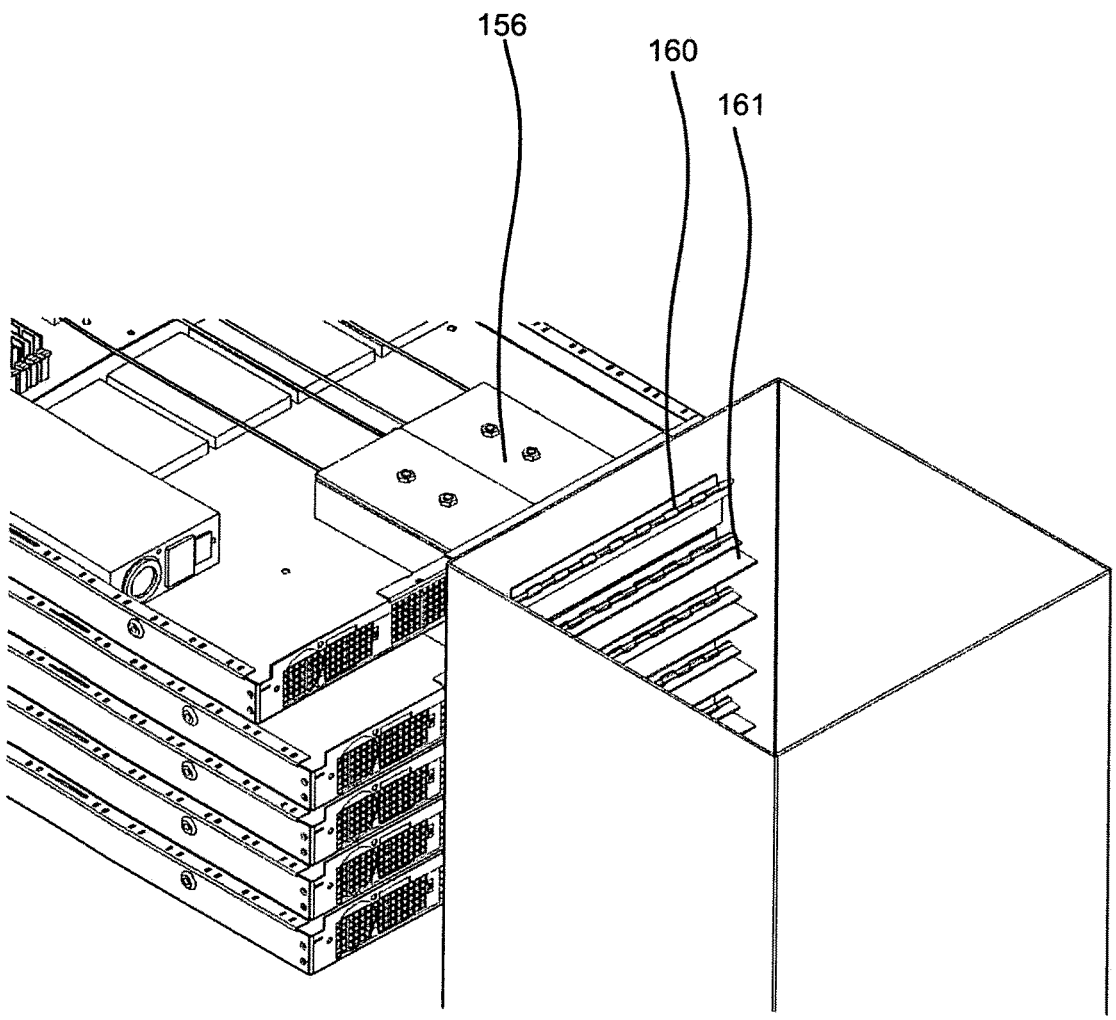

FIG. 12 is another view of the exemplary embodiment shown in FIG. 11. From this angle we can see the condenser 156 that is being cooled by the exit flow along with the hinge line 160 of the first spring loaded sealing plate 161 that is closed at this time because the chassis is not fully pushed into the rack or rack cabinet that holds it. The remainder of the duct sealing plates are pushed out into the air flow, enabling these other which chassis to exhaust their air into the duct.

Figure 13:
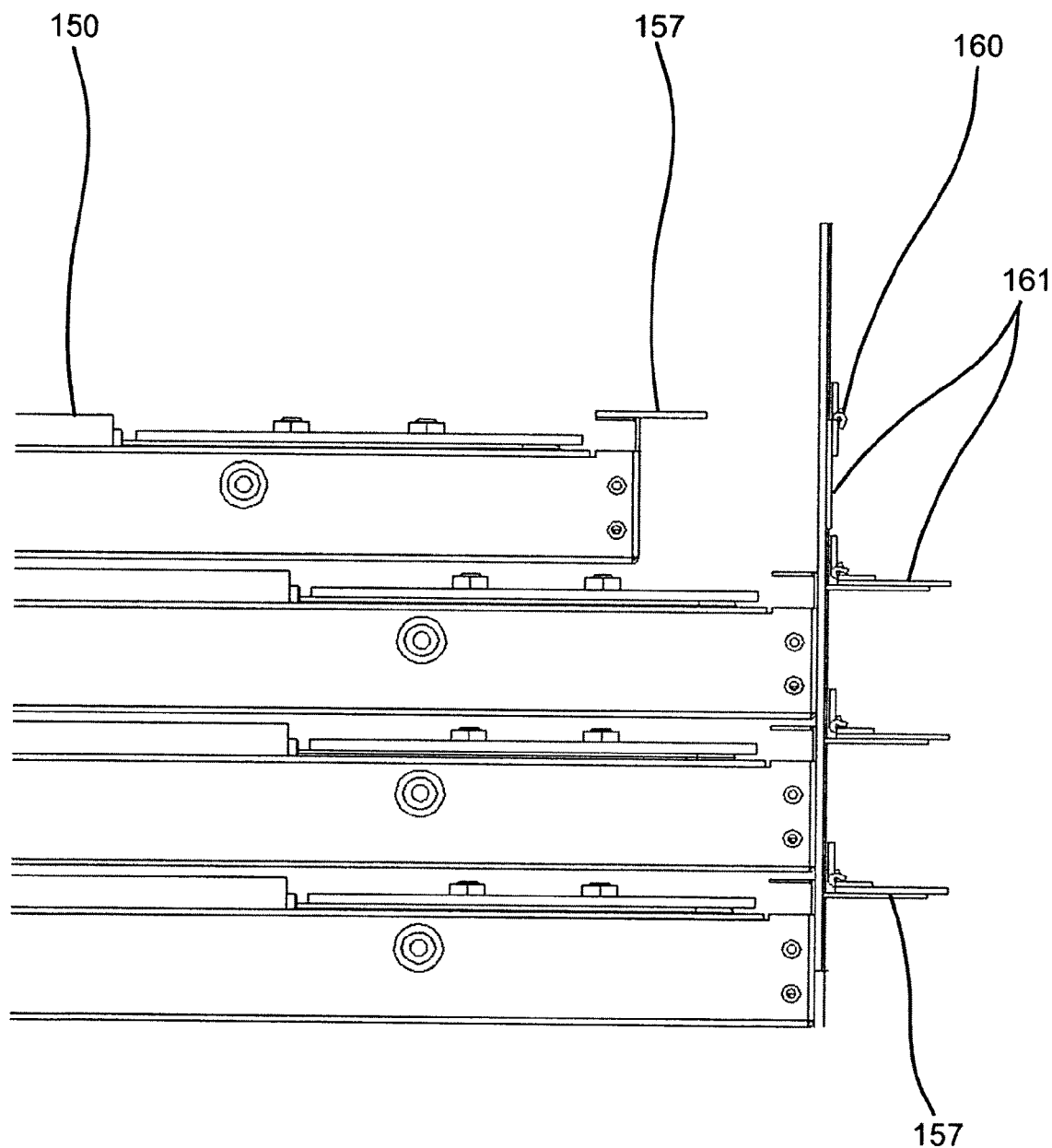
FIG. 13 is a cross section of the negative pressure duct shown in FIGS. 11 and 12 which demonstrates how a metal piece on the 1 U chassis forces open upon insertion, the spring closed flap which seals the duct when the chassis is not installed.

FIG. 13 is a side view of the exemplary embodiment shown in FIG. 11. The 1 U chassis 150 at the top of the stack of chassis can be seen to not be fully inserted into the open rack or rack cabinet. The horizontal tab 157 that gets used to push out the top duct sealing plate 161 along with the hinge line 160 can also be easily seen.

Figure 14:
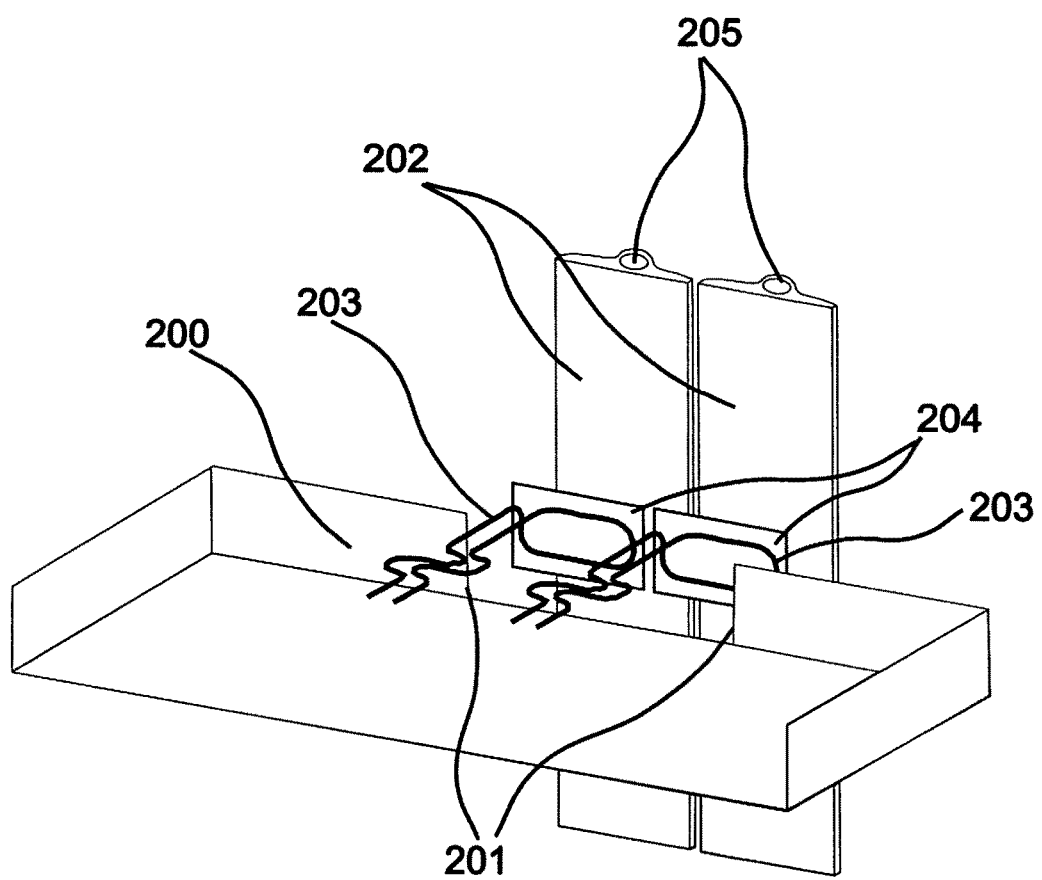
FIG. 14 is a perspective view of the rear of a 1 U chassis that contains an LHP whose split condenser protrudes out the rear and whose cold spreaders make contact with a vertically mounted water cooled cold plate mounted inside of a rack cabinet.

FIG. 14 is the first in a series of exemplary embodiments of what we call a split condenser. There are a number of issues that suggest that this is a good approach to cooling electronic devices that need to be "hot swapped" into and out of chassis that enable cards or chassis to be installed and removed while the remainder of the cards or chassis in a plurality of such devices continues to run. This method makes it possible to make and break thermal connections whose source of cooling is a chilled liquid, such as water without actually making or breaking the interconnect of a pipe that is carrying a liquid. In this first and simplest exemplary embodiment, a 1 U rack mount chassis 200, whose height is 44.5 mm and which has a slot 201 cut in its rear that in this case just happens to be 150 mm wide and is being cooled by a pair of split condensers, whose LHP condenser pipes 203 return back into the chassis from presumably its rear where they presumably cool a pair of hot running electronic devices. The dimensions of the chassis and the other components are not relevant to the explanation of the exemplary embodiment and need to be adopted to the particular situation by a chassis and thermal engineer familiar with all of the details. A chilled liquid flowing through vertically oriented pipes 205 located in the rear of a rack cabinet behind the chassis being cooled is used to cool a pair of vertical cold plates 202 that are thermally attached to a pair of cold spreaders 204 that are thermally attached to a pair of condenser pipes 203 that are thermally attached to them. There is no reason why the cold plates and their supply lines could not run horizontal. This exemplary embodiment did not include a convenient method for clamping the cold spreader against the cold plate that is cooling it, rather we employed a pair of bolts and nuts that were mated to holes in the cold plate (not shown). The clamping arrangement is an important part of the overall design, as it is needed along with a thermal interface material that helps make good thermal contact between the cold plate and spreader, for the apparatus to work. The design seen in FIG. 14 was implemented, and it was discovered that for copper cold plates and an aluminum heat spreader whose area was 3 square inches the upper limit that could be cooled when this split condenser was used with an LHP evaporator that we later discovered was potent enough to service a 320 Watt load, was 80 Watts. This demonstrates the importance of condenser design in LHPs and LHPLs, and suggested that we needed to increase the contact area in split condensers, which is what the following split condenser exemplary embodiments all do.

Figure 15:
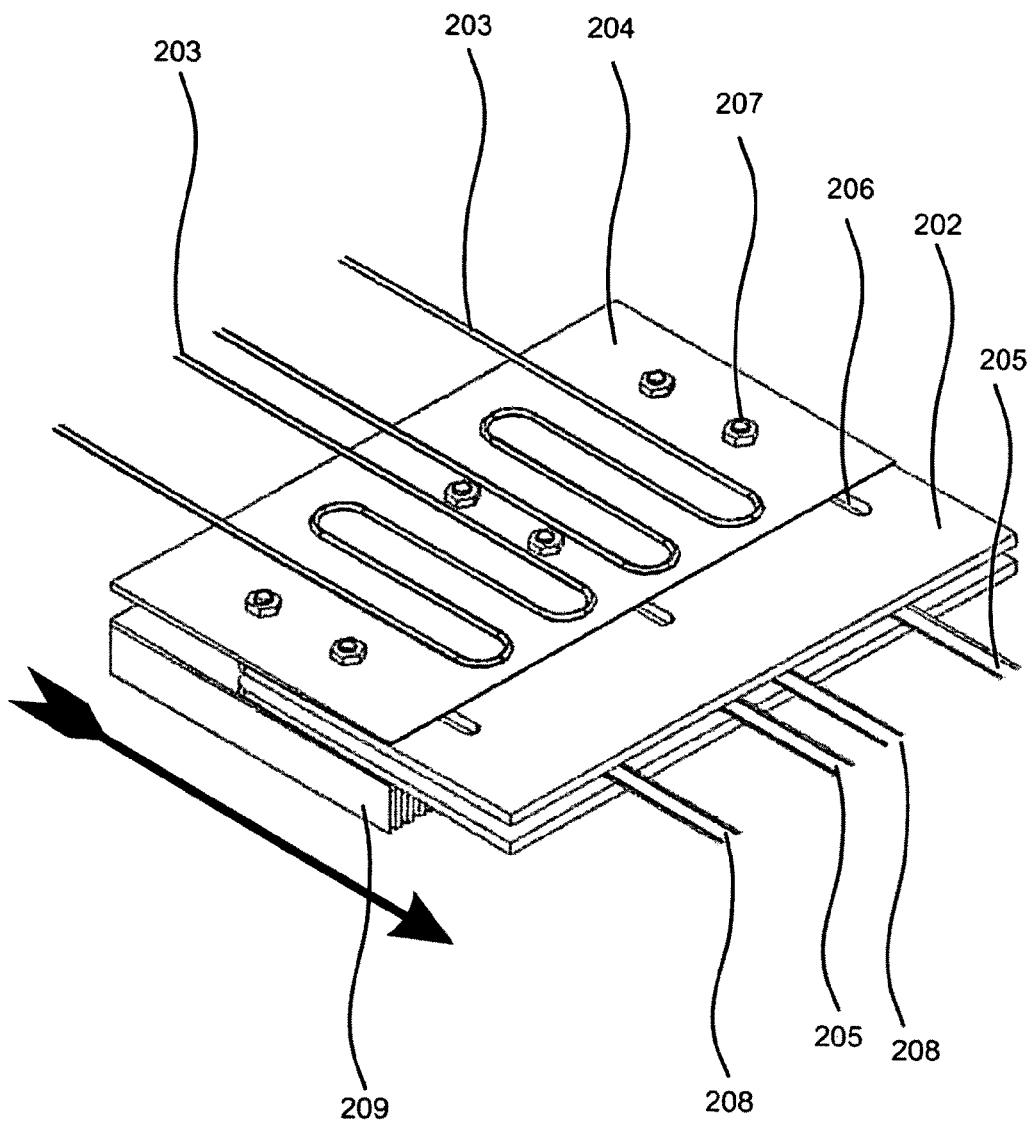
FIG. 15 is a detailed perspective view of a split condenser in which a male cold plate gets inserted into a female cold spreader that is attached to the condenser tubing of an LHP.

FIG. 15 shows a split condenser whose contact area between its cold plate and cold spreader is much greater than that depicted in FIG. 14. The cold spreader 204 that is in contact with the condenser lines 203 is actually a component that is part of a rack mount chassis (not shown in this figure) that is being inserted into a rack cabinet in a direction that is parallel to the large arrow drawn. Air whose direction of motion is also called out by the large arrow is being either drawn or blown through the air heat exchanger one of whose plurality of fins 209 can be seen in FIG. 15. The fins of this heat exchanger are cooled by virtue of the fact that their base is in thermal contact with the bottom plate of the cold plate whose upper plate is called out as 202. As it exits this particular split condenser (but not necessarily the chassis) exemplary embodiment it passes through a finned heat exchanger 209 that in this case sits below the cold plate 202. The split condenser does not need to employ a liquid assisted air heat exchanger, but can be created using a pair of cold spreaders both of which are used to cool LHPL evaporators or possibly a pair of air heat exchangers, depending on the nature of the devices housed in the rack mount chassis can contain any combination of primary and secondary heat loads. The cold plate in this instance is formed from a pair of identical metal pieces that may be sandwiched around a U tube through which a chilled liquid flows. In this possible exemplary embodiment the chilled liquid can be seen entering the cold plate 202 through a U shaped pipe 205 which exits the cold plate at 208. When the cold spreader and finned heat sink within a chassis in this particular exemplary embodiment passes over the cold plate, six bolts whose precise number is again a function of the mechanical design and the size of the split condenser that employ springs 211 shown in FIG. 16 get used to pull the cold spreader down on top of the cold plate when it is being inserted. The cold plate has slots 206 that makes it possible for the cold plate to enter the female cavity without hitting the clamping bolts 210. The cavity is prevented from closing up and preventing the cold plate from entering by six sleeves 212 seen in FIG. 16. A second set of identical chilled liquid pipes are drawn to the left but not labeled. There is nothing unique about the particular way in which the cold plate is fabricated. It could just as easily have been cooled using a single entrance and exit pipe that fed a serpentine section of pipe instead of a U channel or a channel that was machined inside of the cold plate that was intended to provide a counter-flow cooling path. The choice of the precise method used to cool the cold plate is a function of the design constraints, including the cost, heat being rejected and thermal resistance. There is also no need for the split condenser to sit inside of a chassis, it can be located behind the chassis in the rack cabinet and there is also no need for the male portion to be a cold plate: it is possible to employ a variation of the design in which the LHP condenser tubes are embedded within a male device that gets inserted into a pair of female cold plates.

Figure 16:
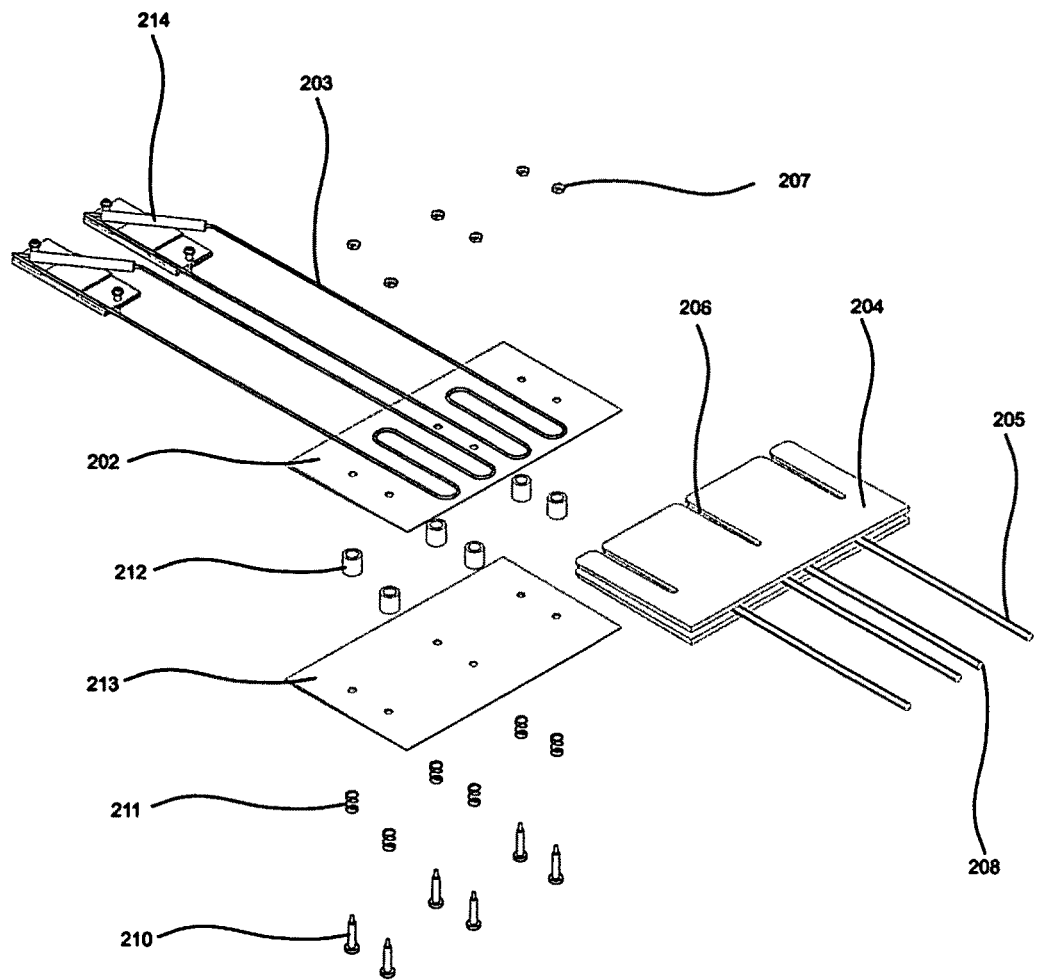
FIG. 16 an exploded view of the split condenser shown in FIG. 15 which also demonstrates how the condenser tubing links an Ammonia evaporator to it.

FIG. 16 provides the details of a one of many possible mechanisms that can be created to apply clamping pressure between a pair of female plates. The bottom plate in this exemplary embodiment could be a spreader plate (we did not draw any condenser lines on it for this case) or a shim plate that was used with an extruded air heat exchanger that is ultimately in thermal contact with the cold plate. For the cold plate 204 to be easily inserted between the cold spreader 202 and the bottom plate 213, it is necessary to provide an inclined plane whose surface is "greased" with a thermal bonding material. As the cold plate rides into position (and the motion in the case we are dealing is relative, the actual motion comes from the chassis being inserted: the cold plate is fixed and enters the female section as the chassis that contains it is inserted into a rack cabinet) the inclined planes of all four surfaces exert vertical pressure on each other which is resisted by a set of six springs. The bottom shim 213 of the heat exchanger in this exemplary embodiment is attached to the chassis. For this scheme to work, the height of the cold plate needs to be correctly set up so that at the end of the travel it comes into contact with the shim, as neither have a lot of vertical freedom. The upper cold spreader, though, is free to move up and down, easily bending the LHP condenser lines 203 which are both small and fairly flexible. The vertical clamping pressure is provided in this exemplary embodiment by six bolts 210 that pass up through six springs 211 before passing through the bottom plate 213 and a set of six sleeves that guarantee that the gap between the top 202 and bottom 213 of the female cavity stays open. The top of the bolt 210 has a shoulder and a smaller threaded section. The shoulder, screw and nut 207 make it possible to fix the end of the bolt to the cold spreader plate 202. When the cold plate is inserted, the springs allow the cold spreader to rise, while at the same time providing vertical clamping pressure on the entire assembly.

Figure 17:
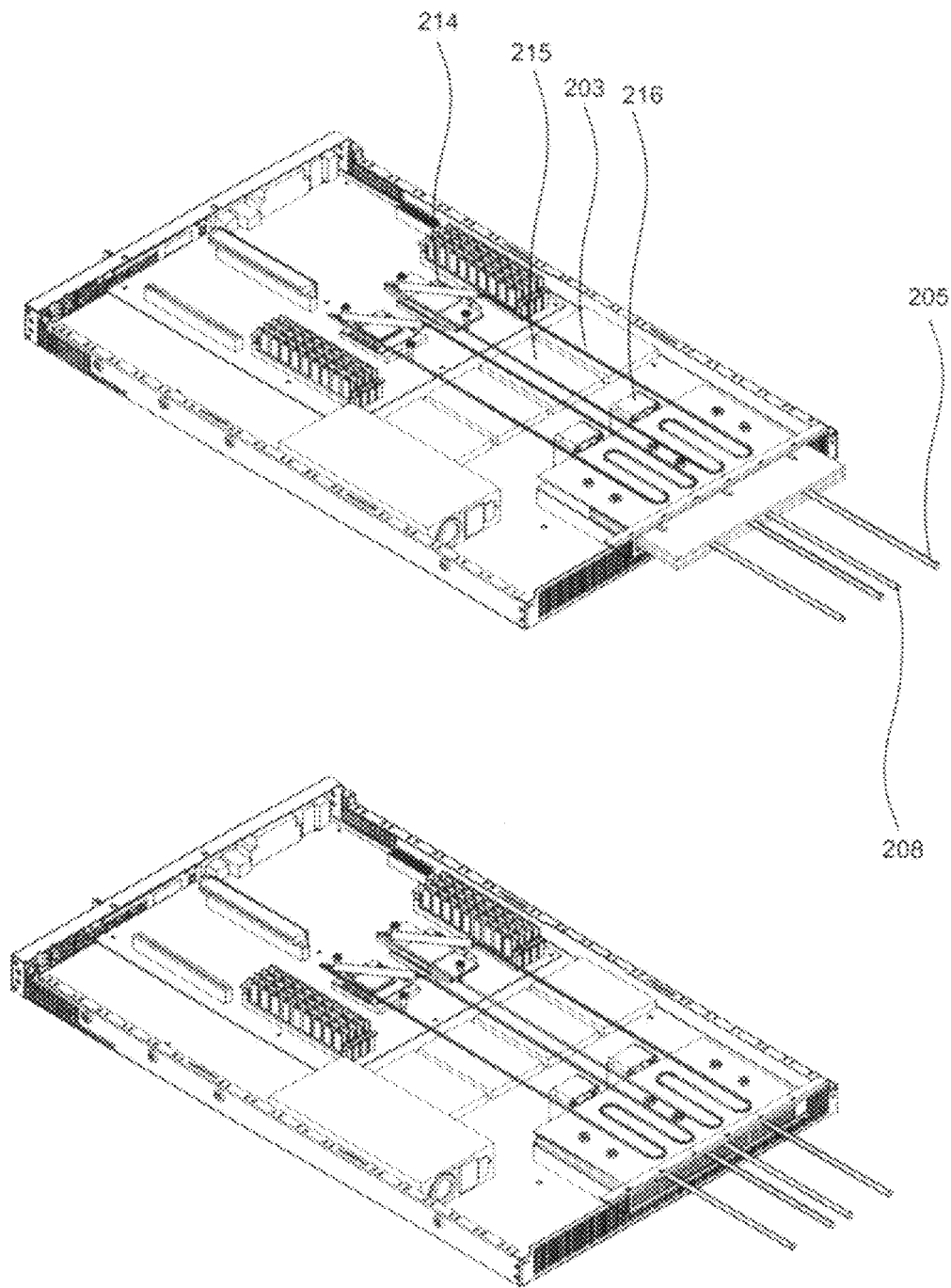
FIG. 17 contains before and after perspective views of the split condenser components described in FIGS. 15 and 16 coming together in a 1 U chassis.

FIG. 17 provides an oblique 3D view of the split condenser design detailed in FIGS. 15 and 16 placed inside of a 1 U rack mount chassis. In this exemplary embodiment two LHPs are being cooled one of which 214 is called out. The bottom half of the figure is identical to the top, and shows the same units after the cold plate is fully engaged. The total number of LHPs used to cool primary heat loads is a function of the number of motherboards being installed in the rack mount chassis: using current motherboard designs up to four processors can easily be mounted in a 1 U chassis and eight in a 2 U tall chassis. In FIG. 17 the bottom chassis has been fully inserted into its location in a rack cabinet or rack, as can be seen from the fact that the split condenser's cold plate is fully inserted within the combination cold spreader/liquid assisted air heat exchanger. This chassis happens to be a 1 U rack mount design, but the size of the rack mount chassis is not fixed: the chassis employed may be smaller or larger. Care has not been taken in this figure to make the modifications to the chassis that one might make to improve its cooling performance. For example, the rear wall of the chassis contains breathing holes in it that are left over from the normal manner in which power supplies get installed (i.e. near the rear wall). The drawing calls out one of four hard disks 215 and a pair of standard high speed 1 U fans, one of which is labeled, 216. These figures do not show a baffle that couples the fans to the air heat exchanger that forms the lower half of the female split condenser. In the top half of the figure, the cold plate can be seen entering the heat spreader air heat exchanger combination as the chassis gets inserted into a rack cabinet that contains a cold plate mounted on pipes. Some additional supporting structure for the cold plate will probably need to be provided as well. The cold plate is stationary and is permanently attached to a pair of chilled liquid pipes that typically would reside within the rack cabinet behind the chassis (see FIG. 20). The bottom half of the figure shows the chassis fully inserted into the heat spreader air heat exchanger split condenser combination. In situations where there is adequate air flow leaving the chassis and fin area between the air leaving it and the fins, this particular arrangement is one of those that makes it possible to return the air leaving the chassis to the ambient temperature of the air in the room eliminating the need for refrigeration units that take up space in rack mount chassis in situations where the heat being rejected within a rack cabinet exceeds 25 KW. Again, we should point out that split condensers are not limited to rack mount chassis and when used in rack mount solutions are not limited to 1 U chassis.

Figure 18:
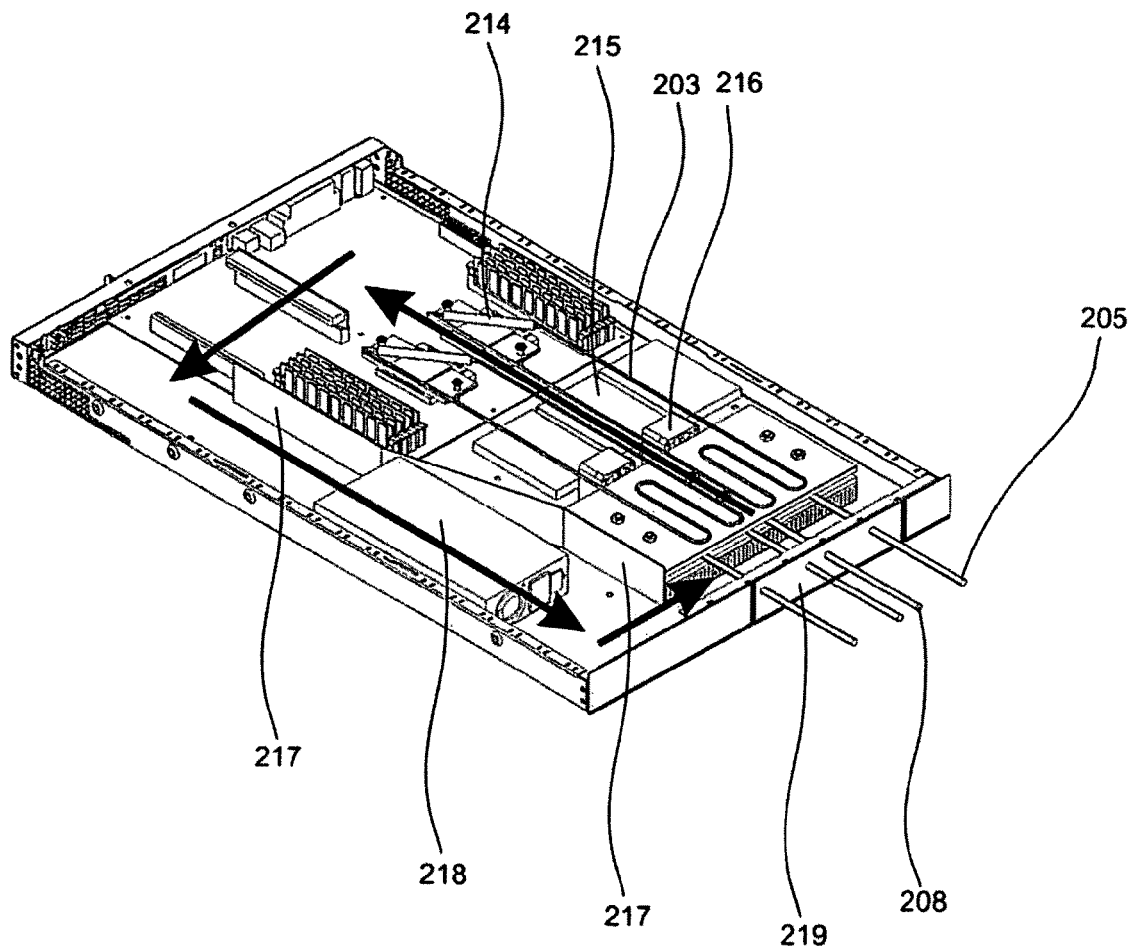
FIG. 18 is a perspective drawing of a 1 U chassis that employs a 1 U chassis that is sealed and uses the fans in both the power supply and ahead of the split condenser to circulate cooling air within the chassis using the lower half of the split condenser to cool this air.

FIG. 18 is an oblique view of a similar exemplary embodiment of the same split condenser, in which we almost seal the chassis off from the air in the room or the rack cabinet. One of the goals of this design is to let ambient air into the chassis proper slowly and not to employ ambient air in the cooling scheme. The large arrows seen within the region of this 1 U rack mount chassis depict the circulation pattern of the air within the chassis. A pair of fans 216 sucks air through the split condenser air heat exchanger that is no longer called out but whose fins can easily be seen sitting beneath the remainder of the split condenser. In this figure we are primarily calling out new features that have not been presented in the prior split condenser designs that start with FIG. 15 and end with FIG. 22 below. The fans are interfaced to the split condenser using a baffle not depicted here. The airflow pattern is created using a containment baffle 217 that forces the air leaving the fans to travel to the front of the chassis before being sucked back to the rear of the chassis after it passes around the baffle. The airflow is helped by the positioning of the power supply 218 whose fans accelerate the air passing through before it turns the final corner and again passes through the finned heat exchanger that is part of the split condenser depicted in FIG. 18. This chassis partially isolates the internal air within the chassis from the air within the room and rack cabinet. In the rear, a plate 219 that is attached to the cold plate's water supply lines 205 and 208 has been added to seal the back slot in the chassis using a compression gasket at the point where the chassis is fully inserted into the rack cabinet and the cold plate is fully inserted in the split condenser. While this chassis does employ several fans, some of which might need to run at high speeds, it still consumes much less energy than a typical 1 U chassis, that can require as many as 18 fans to cool the electronics. This energy savings is a direct result of the fact that the primary load of the unit amounts to over 60% of the heat being rejected and this heat is being directly rejected to a chilled liquid instead of air. Not only that, the air that is circulating within the chassis will have very little need to leave it, eliminating the need for air-cooling outside of the chassis. This eliminates the energy typically expended within rack cabinets and the data center room to move air while at the same time eliminating the need for large heat air heat exchangers located within or adjacent to the rack cabinet to handle the high heat loads that densely packed rack mount chassis can produce. With new semiconductor devices hitting the market that reject as much as 500 Watts, it becomes possible to create 1 U rack mount chassis that reject up to 2 KW. Such rack mount chassis can reject up to 80 KW when installed in a 40 U tall rack cabinet. Solutions like the one shown in FIG. 18 are able to handle heat loads of this magnitude and are much more energy efficient than solutions which employ direct water cooling to cool CPUs instead of the factor of 100 more energy efficient two phase cooling provided by LHPLs. In addition, keeping the circulating air path within the chassis itself (instead of letting the air wander about a rack cabinet or out the rear door to the data center's CRAC unit heat exchanger) dramatically reduces the energy required to reject the secondary heat loads.

Figure 19:
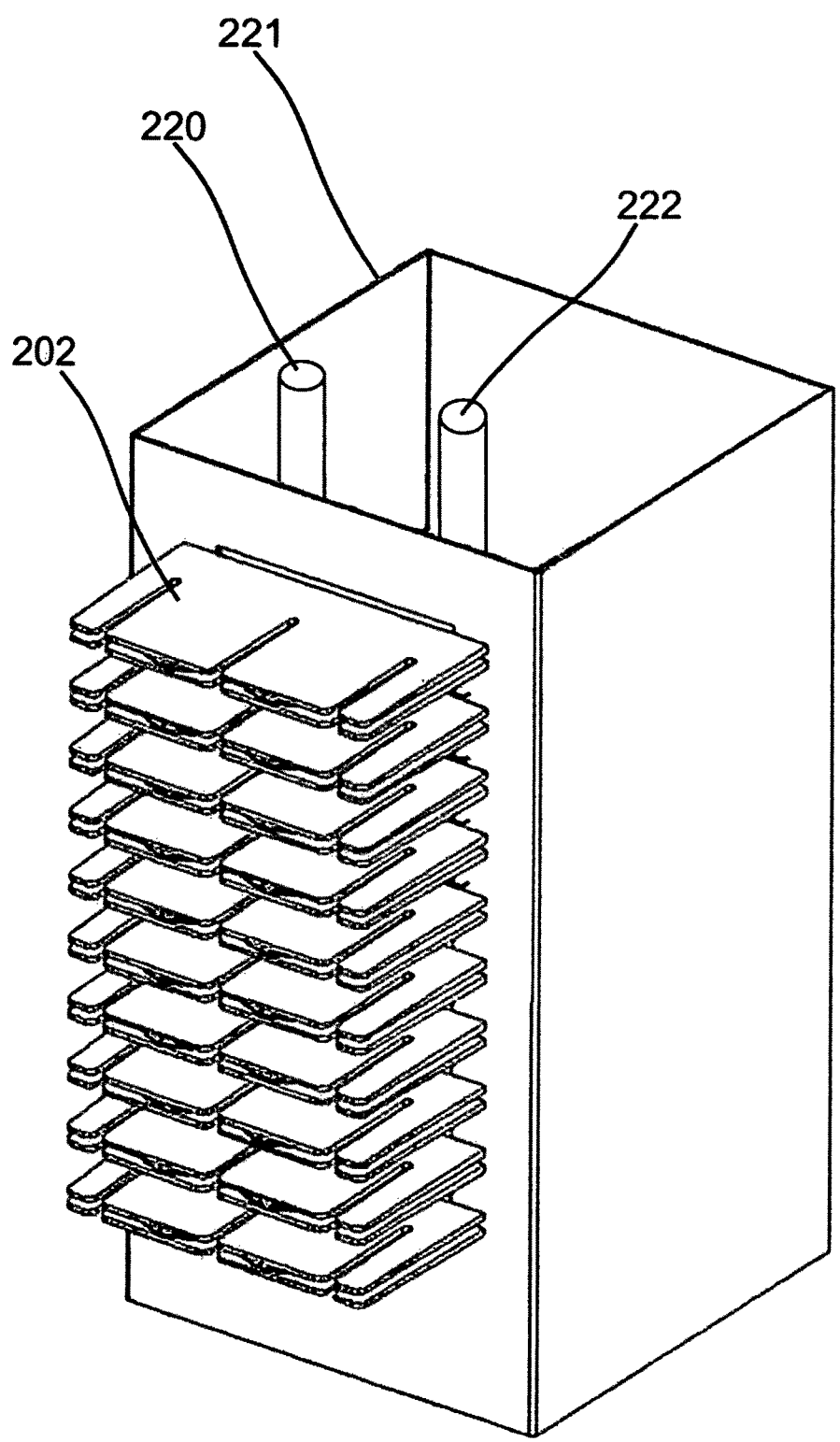
FIG. 19 is a perspective view of a stack of split condenser male cold plates that protrude from a negative pressure air duct used to cool 1 U chassis that attach to it.

FIG. 19 is an oblique view of a section of duct 221 that may be used to exhaust the air out of a group of rack mounted chassis (not shown here). The design that is shown in detail in FIG. 20 employs a rack mount chassis, which may be 1 U tall, which may not need any fans at all within the rack mount chassis. This design provides secondary cooling using the duct to suck air through the chassis while at the same time cooling the air that passes through the air heat exchanger that is a part of the split condenser seen in FIG. 20. The primary and secondary heat loads are rejected using a plurality of chassis that employ a plurality of split condensers 202 that can be seen in FIG. 19. This particular duct employs the rack mount chassis seals described in FIGS. 11, 12 and 13. A pipe 220 is used to feed cold water to the plurality of cold plates seen and another pipe 222 gets used to return the hot water produced to the next cooling loop in the series that carries the rejected heat to the cooling tower. The pipes that carry the secondary coolant to and from the split condenser are labeled 205 and 208 as seen in FIGS. 15 through 18. The precise location of the pipes 220 and 222 within the duct is not important and can change as a function of many design parameters.

Figure 20:
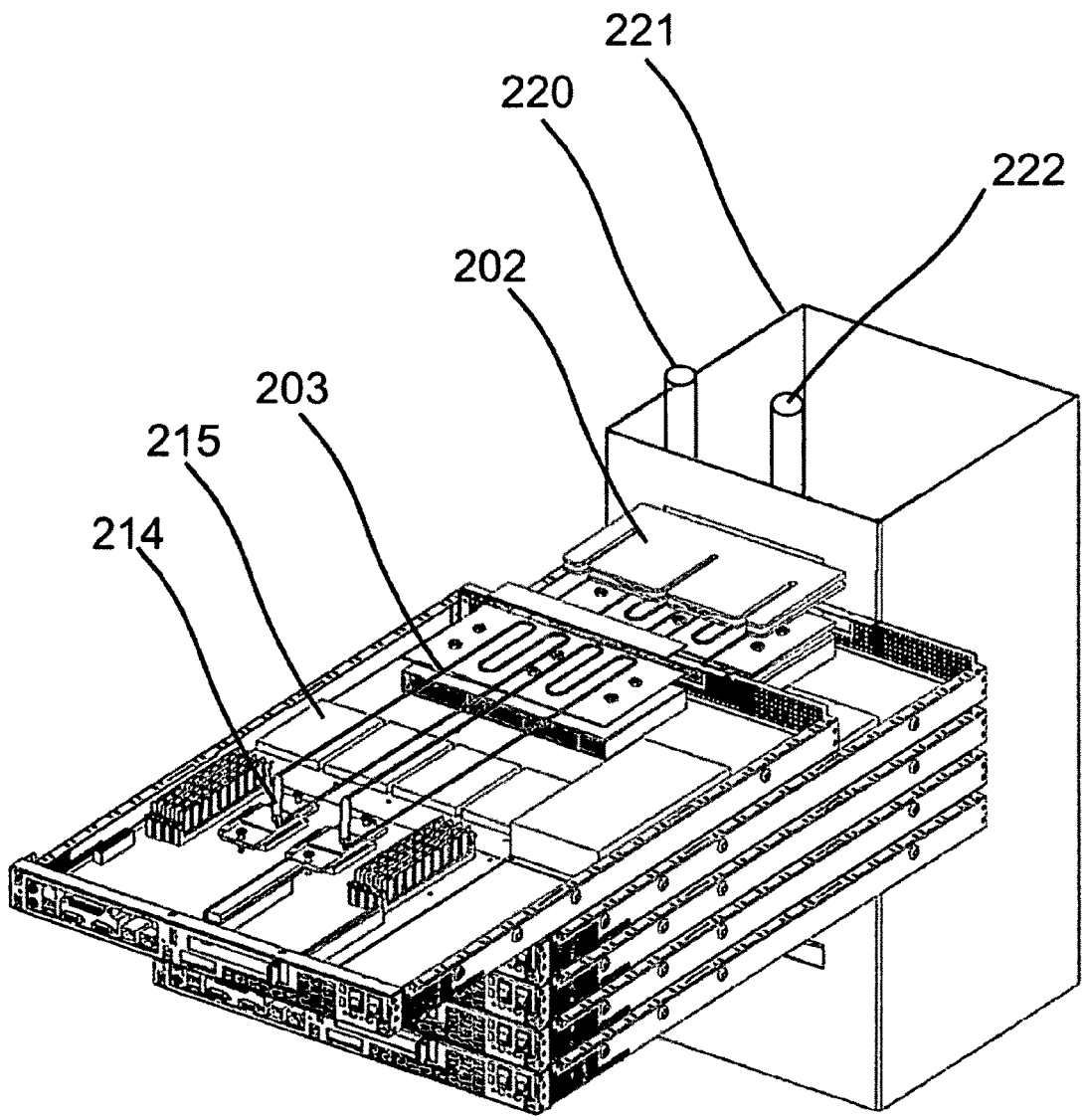
FIG. 20 is a perspective view of a stack of 1 U chassis that employ split condensers that attach to the duct in FIG. 19 and employ the negative pressure duct to remove hot air from them.

FIG. 20 is an oblique view of a 100% air-cooled plurality of split condenser equipped 1 U rack mount chassis, most of which are installed within either an open rack or rack cabinet (not seen) that employs a duct 221 to remove air from the rack mount chassis being cooled. The pipe 220 that feeds cold water to a plurality of cold plates 202 and the pipe 222 that returns the hot water to the next cooling loop, can also be seen. The top most 1 U rack mount chassis has still to be slid into place in the rack cabinet, making it possible to see its cold plate 202. Within the topmost chassis we have labeled the heat spreader 203, a hard disk 215 and an LHP that is used to cool one of the two processors being cooled in this exemplary embodiment. Also visible in this figure but not market are a second LHP, memory, power supply, three more hard disks and a motherboard. This system employs the 1 U rack mount to duct sealing method described above.

Figure 21:
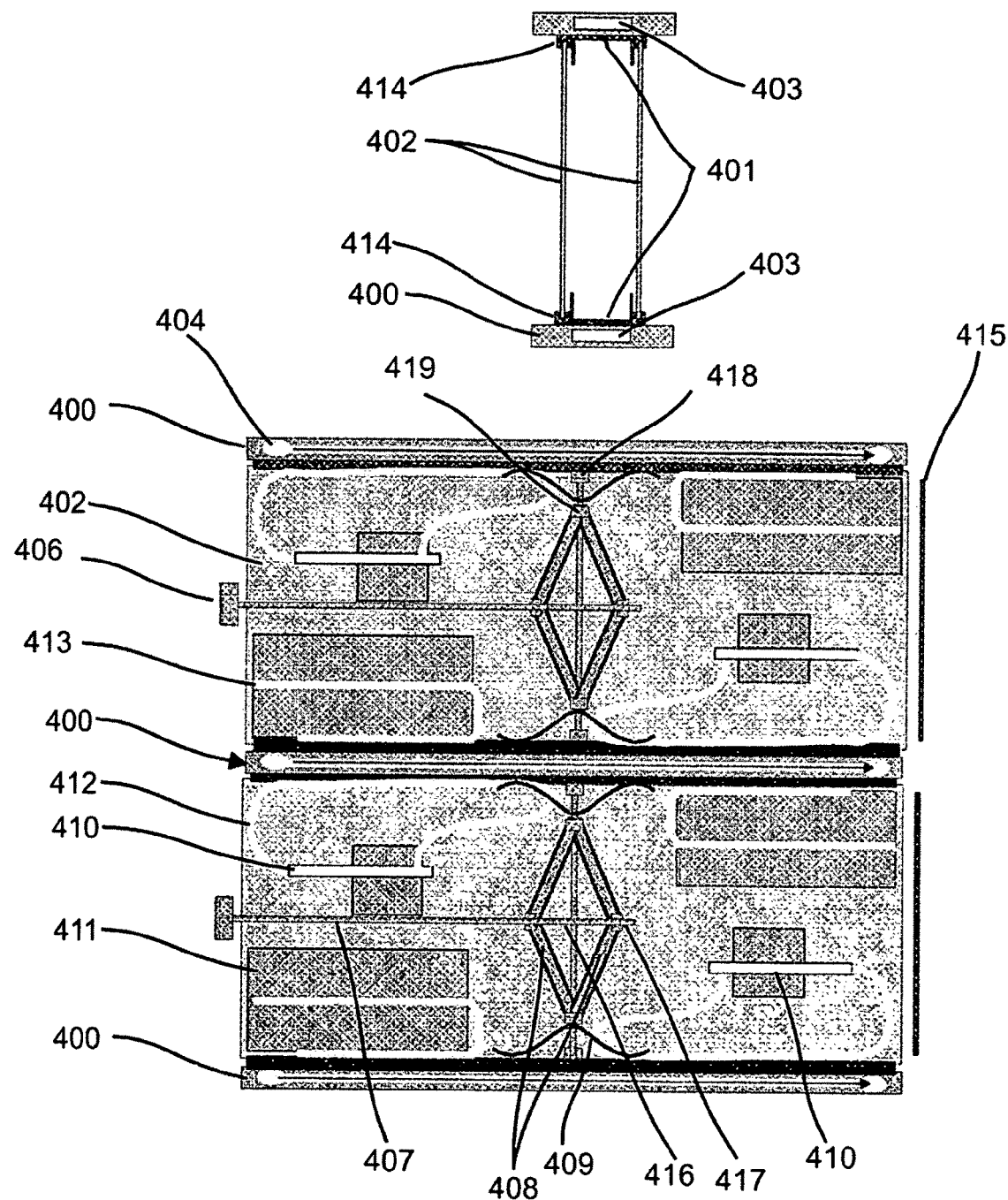
FIG. 21 contains a pair of side views of an LHP split condenser designed to cool processor blades that employs a combination of cold plates that are fixed into the chassis and cold spreaders that are attached to the blades which slide into place and employ a scissors jack to provide the thermal contact interface pressure.

FIG. 21 depicts a pair of "blades," single board computers that are designed to slide into an enclosure that has a backplane 415 that is designed to accept mating sockets that provide the blade's PCB 402 with the power needed for its electronic components to function. This approach to split condenser design does away with a rear exit interface to a chilled liquid. What we do instead is employ cold plates 400 above and below each of the blades being cooled. These cold plates presumably receive their coolant from pipes that run up and down the sides of the enclosure used to contain the blades and which get delivered to them at the front (left side in FIG. 19) of the chassis, delivering the coolant to a channel in the rear before it leaves to go back to the return pipe. What makes the design unique and novel is the use of cold spreaders 401 that are made of U channels and which upon insertion of the blade into its enclosure, make contact with the cold plates, top and bottom. Once installed and seated in the sockets that mate with the backplanes 415, a scissors jack 407,408,416,417, 418,419 is employed to apply the clamping pressure to a spring 409 the cold spreader channel which is in thermal contact with both LHP condenser lines in this exemplary embodiment and standard heat pipes which are being used to cool DIMM modules with a copper heat spreader that fits over the modules and is thermally attached to them.

The upper portion of the figure is an end on view of the blades inserted into the chassis. The end view provides a detailed description of the cooling arrangement. A pair of cold plates, 400, each cooled by a liquid stream 403 is employed to cool the components on the blade employing a split condenser. The blade PCBs 402 slide into the enclosure using "card edge guides" 414 that are designed to both guide and hold the PCB as it slides into place. Between each of the card edge guides used by adjacent blade PCBs we have inserted a "U channel" 401, at both the top and bottom of the blade. These U channels provide the metallic component that defines the cold spreader and are in thermal contact with the cold plates, LHP condenser lines 412 and DIMM module heat pipes, 413. The blades are inserted into the electronic enclosures with their U channel cold spreaders 401 making light contact with the cold plates 400 that they will become thermally attached to after the board is completely inserted into the enclosure. For the channels 401 to make good thermal contact with the cold plates, 400, it is necessary to apply pressure to them.

In this kind of situation there are few possibilities for creating this pressure. The method we have chosen to provide the clamping pressure, which is certainly not unique but does demonstrate a possible approach, is to employ a scissors jack with arms 408. The jack is engaged using a knob 406 that comes out the front of the blade and uses a shaft 407 and threaded nuts 417 to squeeze the two arms 408 of the scissor together, creating a vertical compression stress on the springs 409 that in turn is applied to the channels 401. The squeezing action is effected using a pair of threaded nuts, 417, one of which is called out and is opposed by a second in each jack. As the threaded section of the shaft 416 turns the two nuts 417 get pulled together putting opposing forces on the springs, 409, one of which is being used to exert pressure on each of the cold spreaders 401. The sleeve 419 rides up and down on a vertical shaft not called out which attaches at its end to a cold spreader with a female attachment 418 that holds it snuggly to the channel.

The cold plates 400 are obvious in the side view and we mark the cold (404) and hot (405) liquid coolant channels that feed them at the top as well as the LHP 410 and its condenser lines 412 that get used to cool the processors which sit beneath them. The memory region of the card 413 is also called out as well as the device used to cool the DIMM modules, which employs an ordinary heat pipe 411 whose condenser is also thermally attached to a cold spreader. The balance of the components on the board that dissipate energy can be easily cooled using a copper mask that fits over them and is attached to them using a thermal interface material that is in turn attached to either the LHP of the heat pipe used to cool the DIMM modules. Or alternatively, the ground planes of the PCB can be thermally attached to the cold spreaders using a flexible sheet of copper made of shim stock that is soldered to the PCB and gets inserted between the cold spreader and the cold plate.

For this blade cooling solution to work, the thermal resistance of the split condenser defined by the cold spreader and the cold plates has to be adequate. In situations where the cards are spaced on 1 inch centers and are 18 inches deep, this solution provides 36 square inches of interface area between each of the cold spreaders and their cold plates. Based on earlier experiments this ought to handle at least 500 Watts of power per card. Sixteen of these devices packed into a chassis that is 7 inches (i.e. 4 U tall) will reject 8 KW, and in a 40 U tall rack cabinet this results in a cooling system that will handle 80 KW! This cooling solution also turns out to be much more efficient than any blade cooling solution that employs air and direct water cooling, both of which require additional power. The power densities here are high enough to suggest that the resulting water might even be hot enough to be sent directly to a cooling tower bypassing a systems water chiller. But, since we haven't built one of these units, we feel it is premature to make this claim, especially considering the fact that the split condenser here does not employ counter-flow principles like the unit we are about to describe.

In general, split condensers are not as efficient as the direct liquid cooled condenser design that we terminate this disclosure with. When working with them, one becomes aware of the fact that raising the temperature of the output flow is a non-trivial exercise. What makes it difficult to raise the temperature of the output flow from a water-cooled condenser, be it direct or indirectly (i.e. split condenser) cooled is the fact that for any design that employs heavy copper plates to exchange energy there are thermal conduction shorts that the plates enable which takes heat out of the hot side of the condenser and exchanges it with the cold side, reducing the delta T across the condenser and reducing the temperature of the effluent. The only way to eliminate this problem is to isolate the hot and cold sides of the condenser from each other. The design in FIG. 22 does precisely this.

Figure 22:
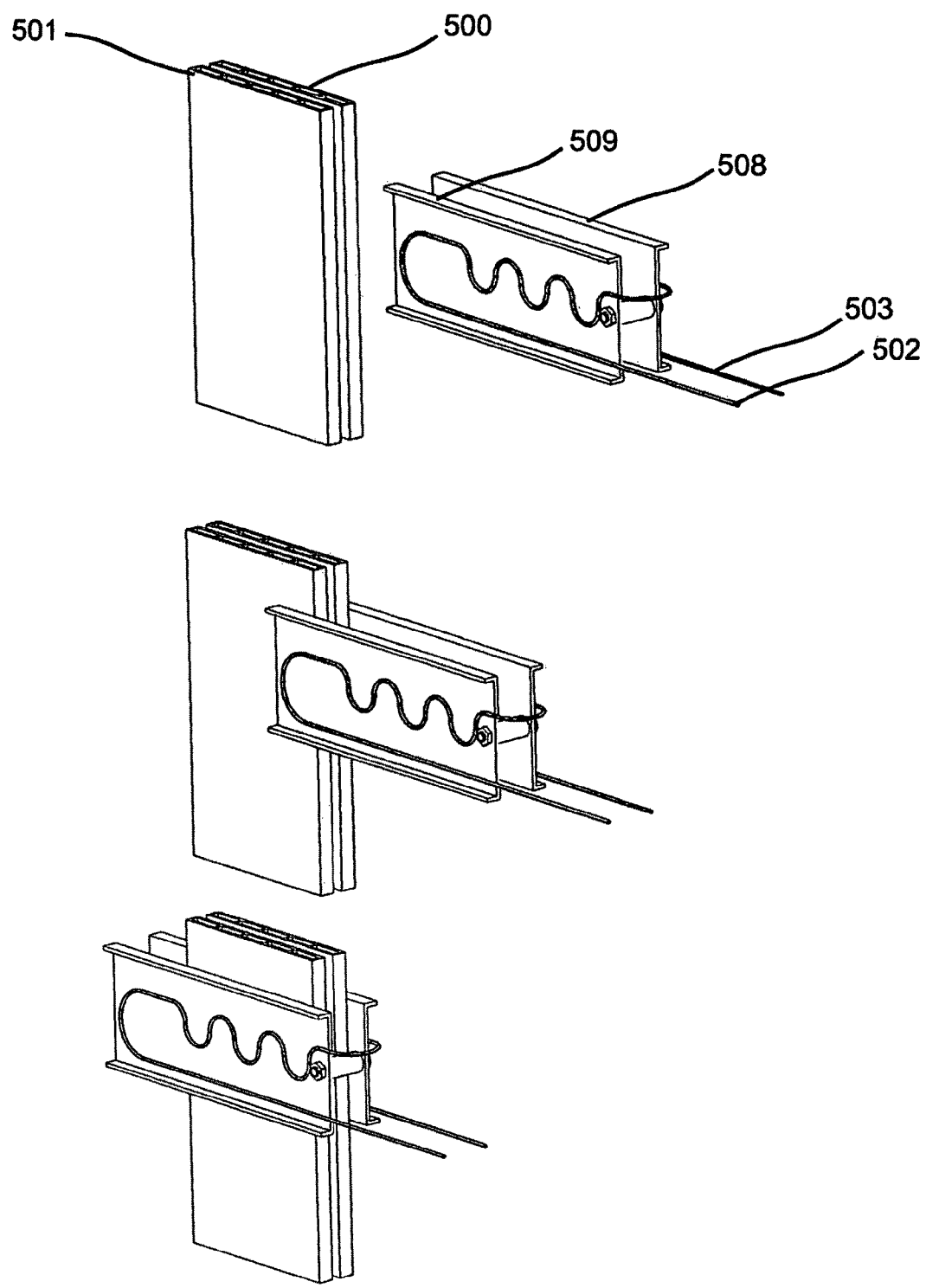
FIG. 22 is a before and after sequence of perspective drawings which demonstrates how to make a split condenser that employs a counter flow architecture and which employs a cold spreader that sits outside of a chassis and makes contact with a partitioned cold plate that is vertically mounted inside of a rack cabinet.

FIG. 22 depicts a split condenser designed to sit behind a rack mount chassis inside of a rack cabinet. The cold plates 500 and 501 in this oblique 3D view may extend from the bottom of the rack cabinet to the top or over a more limited region that gets repeated at intervals to control the amount of heating that each section of cold plates needs to handle, making it possible to adjust flow rates and resistance to flow in such a manner that the maximum amount of heat gets transferred per Watt of energy expended pumping coolant through the cold plates and back out to either a chiller or cooling tower. In FIG. 22 of cold spreaders 508 and 509 that are shown in different stages of being brought into their final mating station as the rack mount chassis or blade that they are attached to is inserted into rack cabinet or blade chassis. Neither the rack mount chassis or the blade or for that matter the structure that holds them in place behind the rack mount chassis or blade, is drawn.

The cold plates 500 and 501 may be created from extrusions, as depicted, that internally contain channels through which a coolant flows. In this case we show five such channels, but the number as well as the thickness of the channels is not to be inferred from these drawings. In this particular exemplary embodiment, five rectangular channels that conduct the coolant being used to cool the cold plate. The precise shape or number of channels is not important, but the material needs to be a good thermal conductor such as aluminum. The cold plates are mounted vertically inside of the rack cabinet with their secondary axis parallel to the direction that rack chassis take during their insertion into the rack cabinets. This makes it possible for their cold spreaders 508 and 509 to slip in over the cold plates 500 and 501 as a chassis is inserted.

Cold spreaders that have larger widths than those drawn that were modeled for 1 U rack mount chassis can be created in situations where the vertical extension of the chassis or blade being cooled is large. There is also no limitation on the number of cold plates and spreaders that may be mounted parallel to each other behind the chassis or blade held within a rack cabinet or blade enclosure, provided that space is left for other things to connect up to the chassis or blade, which in the case of a blade is at least a horizontally oriented PCB called a backplane. Creating a cold spreader that is wider than those shown here, but not as wide as the chassis or blade it is attached to is tall, makes it possible to increase the contact area of the cold spreader and cold plates, as does creating cold plates and cold spreaders that extend deeper into a rack cabinet or blade chassis. This design is not limited to just the two types of electronic enclosures just mentioned. In the case of COTS systems such as PICMG systems, these split condensers could easily be deployed just as easily for PICMG processor cards as they are employed here for blades. Increasing the contact are of the cold spreaders and cold plates makes it possible to cool devices which rejected very large amounts of energy. Alternatively, by taking advantage of the fact that LHP evaporators may be ganged together it makes it possible to cool a plurality of processors connected to a single split condenser whose contact area is large.

Figure 23:
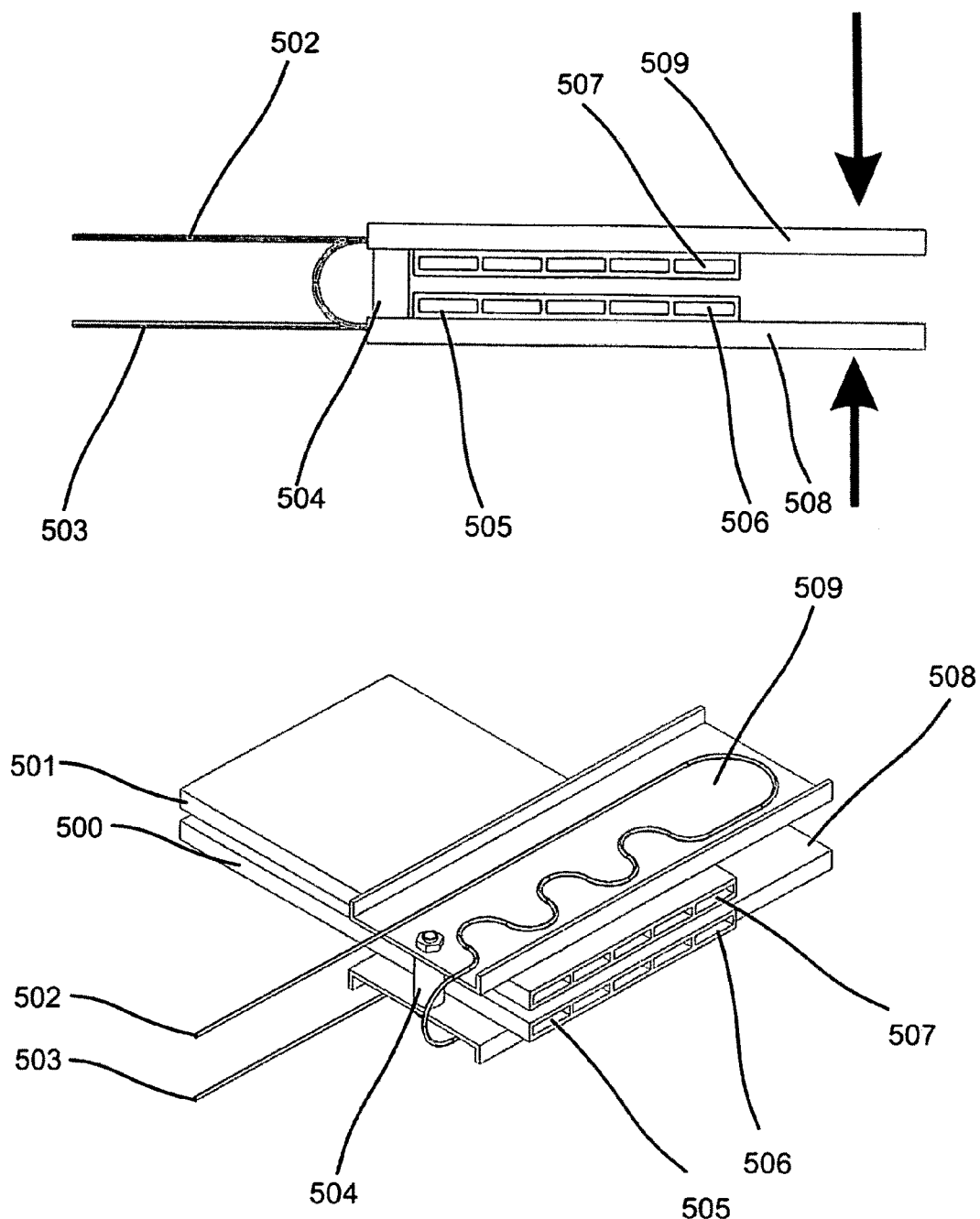
FIG. 23 is a perspective view of the design details of the split condenser shown in FIG. 22.

FIG. 23 call out more details in the design. Some provision must be made for holding the two channels at a precise distance from each other so that when finally clamped together, the make good thermal contact with the cold plates across their entire contact area. The mechanism that provides this separation at one end of the cold spreader is a bolt, sleeve and nut combination, 504. When the device is clamped (from the other end) this bolt keeps the end it is attached to from separating.

The upper portion of FIG. 23 is a downward looking view (what you would see looking down inside of a rack cabinet) that clearly shows the nature of the extrusions and their channels. The vapor in this particular exemplary embodiment arrives in LHP condenser pipe 502, and then proceeds to go all the way to the end of the top channel (in the bottom half of FIG. 22) before turning around and making thermal contact with its channel. The implications for this arrangement are that the channel carrying coolant labeled 507 will end up being in thermal contact with the hottest vapor coming off of the LHP evaporator, therefore it must be the last channel in the sequence, if our goal is to produce hot coolant. The liquid coolant channels within the extrusions are to be set up so that coolant flows sequentially through them, starting on one side and ending up on the other, in this case starting in channel 506 and ending up in 507, after passing through all of the intermediary channels one by one. Starting at the cold end with the LHP condenser line 503 that returns the condensed liquid vapor to the LHP evaporator, we discover that it makes thermal contact with channel 506 to begin with. What this means, is that starting with channel 506, and progressing towards channel 505, each channel gets progressively hotter as the coolant moves down the line. When it reaches the end, it shifts from the bottom extrusion to the top and then progresses down that line of channels until it finally arrives at 507, the end. Note that we employ a serpentine shaped condenser line on both sides of the cold spreader whose job it is to "spend some time" exchanging heat sequentially with each of the cold plate channels it passes over, whose temperature decreases as the vapor cools making it possible in some instances to sub-cool the primary coolant. We employ a pair of extrusions, for the simple reason that to maximize contact area it pays to employ a male female arrangement, and since in this case we are also attempting to maximize temperatures by also providing a counter-flow heat exchange situation it helps if we can at least divide the cold plate into two separate cold plates that are not in thermal contact with each other, as this is the only way we can be sure to minimize thermal shorts that bypass our cooling solution and bring down the temperature of our effluent. In an even more aggressive exemplary embodiment that we have chosen not to detail here, the cooling channels that the cold plates are made up of could be thermally isolated from each other, employing a material that is not a good conductor of heat to sit between each of the channels. However, one suspects that no matter how good a job one does with this approach to counter-flow cooling, the best performance and the smallest thermal resistance will ultimately be obtained using a device yet to be discussed which employs direct liquid cooling of a counter flow heat exchanger. This is not intended to demean the value of this exemplary embodiment. There are situations where it becomes difficult to employ liquid quick disconnects. This exemplary embodiment provides a solution for that combines efficiency with performance and can be scaled to reject very large quantities of heat more efficiently than the heroic devices being invented that use a combination of blowers, pumps and compressors mounted inside of rack cabinets.

Figure 24:
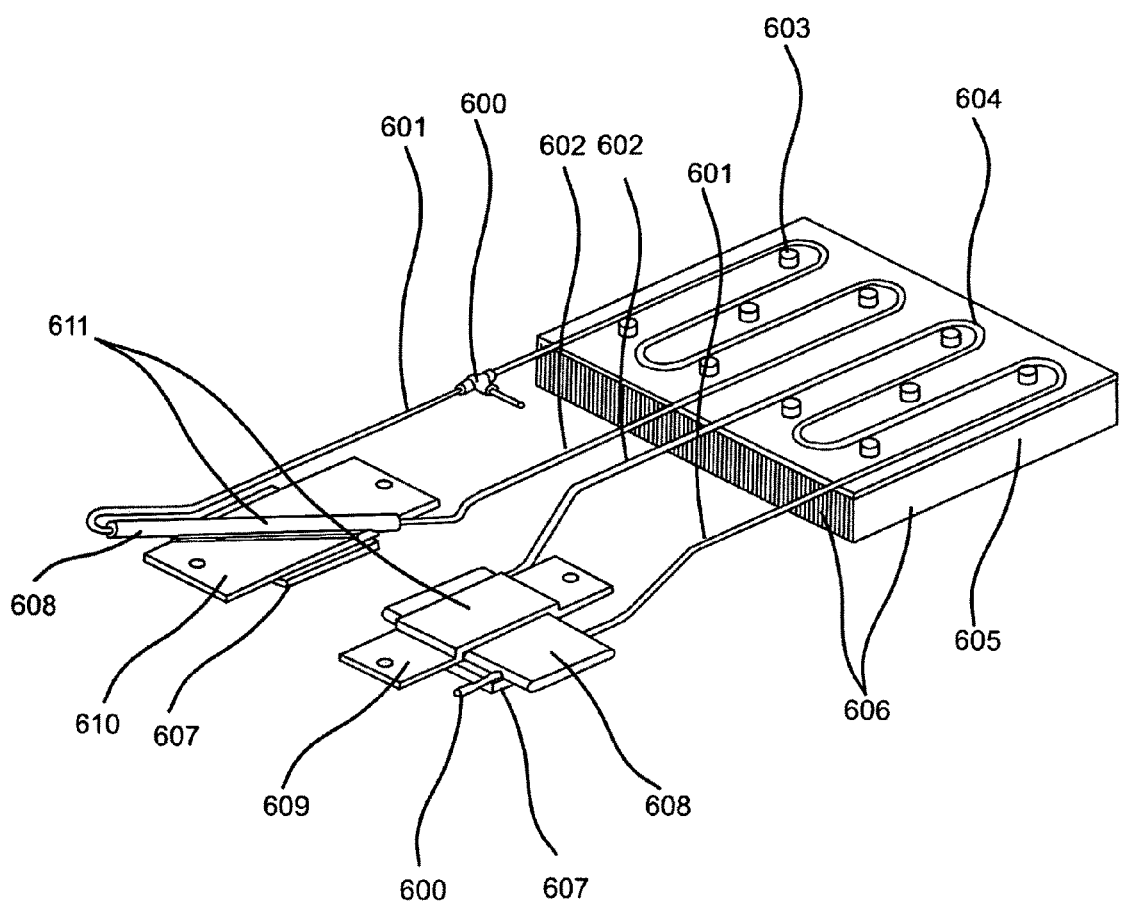
FIG. 24 is a perspective view of how both an Ammonia and water LHP can be employed within a 1 U chassis and used to interface a common set of condenser fins.

FIG. 24 demonstrates how two different LHP types, one with a cylindrical evaporator and another with a box shaped one can be mounted on processors and reject their heat to a condenser whose fins 606 and base 605, they share.

Starting with the liquid return line 601 of the left hand cylindrical LHP, we observe that both LHPs employ serpentine shaped condenser lines 604 that get clamped to the base 605 of an air-cooled heat exchanger whose plurality of fins 606 can also be seen. The serpentine condenser line gets clamped to the base plate 605 by pressure exerted against it by a clamping plate and screws that connect to the plurality of studs, one of which, 603, is called out and all of which are mounted into the base plate 605. An exploded view of the clamping plate can be found in FIG. 4. Each of the serpentine condenser lines start off as a vapor feed line 602 that takes the hot vapor coming off the LHP Evaporator's wick and carries the vapor to its respective serpentine condenser sections. The liquid return inlets of both LHPs include a compensation chamber 608 that essentially is a hollow area inside of the evaporator proper that gets used to store liquid that gets forced to the evaporator as the LHP heats up. The remainder of the evaporator contains the wick and the vapor exhaust ports, neither of which can be seen here, as no claims are being made in this document for the details that pertain to the internal details of LHP evaporators. The region of the evaporator shell near where the wick resides is called out by 611.

In the case of the cylindrical evaporator on the left hand side, a copper heat spreader 610 that sits between the device being cooled and the thermally active region of the wick gets employed to transfer heat between the device being cooled, whose socket 607 is called out. The sealed tubes that get used during manufacture to fill the LHPs with working fluid 600 are also called out. The evaporator on the right hand side is basically flat and gets used in situations where the pressure of the working fluid at temperature is roughly equal to atmospheric pressure. Because it can be made of rather thin sheet metal, the thermal resistance between its wick and the heat spreader of the CPU beneath it is less than the cylindrical design on the left. The right hand evaporator is held in contact with the CPU being cooled using a clamp 609. The cylindrical evaporator on the left hand side is designed to work with more volatile working fluids, which become active under smaller heat loads and whose pressure in the operating temperature range of most CPUs and GPUs is large enough to require a strong shell to contain it.

Figure 25:
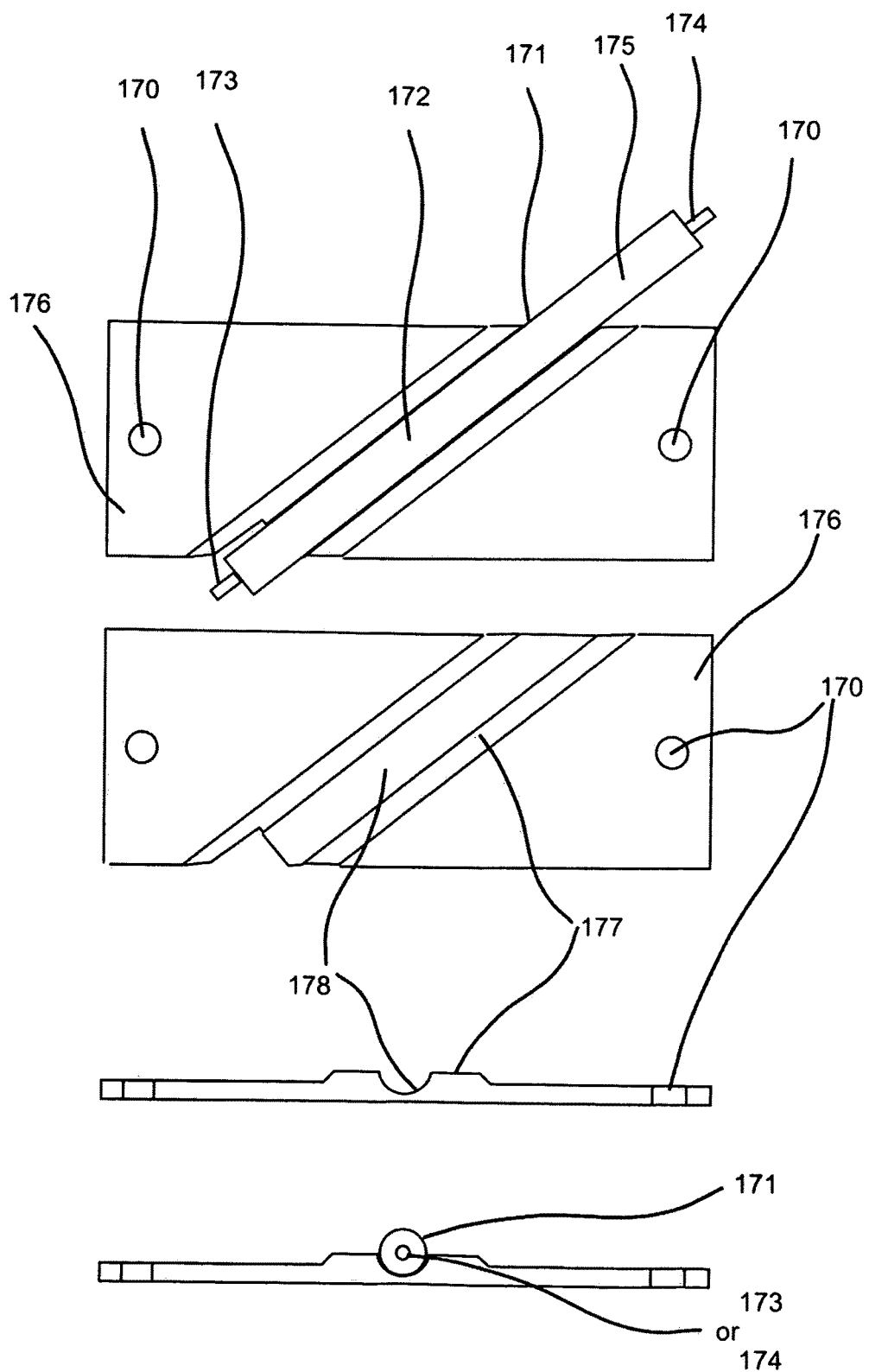
FIG. 25 is a cross sectional view of the copper heat spreader used by the Ammonia LHP evaporator shown in FIG. 24.
Figure 26:
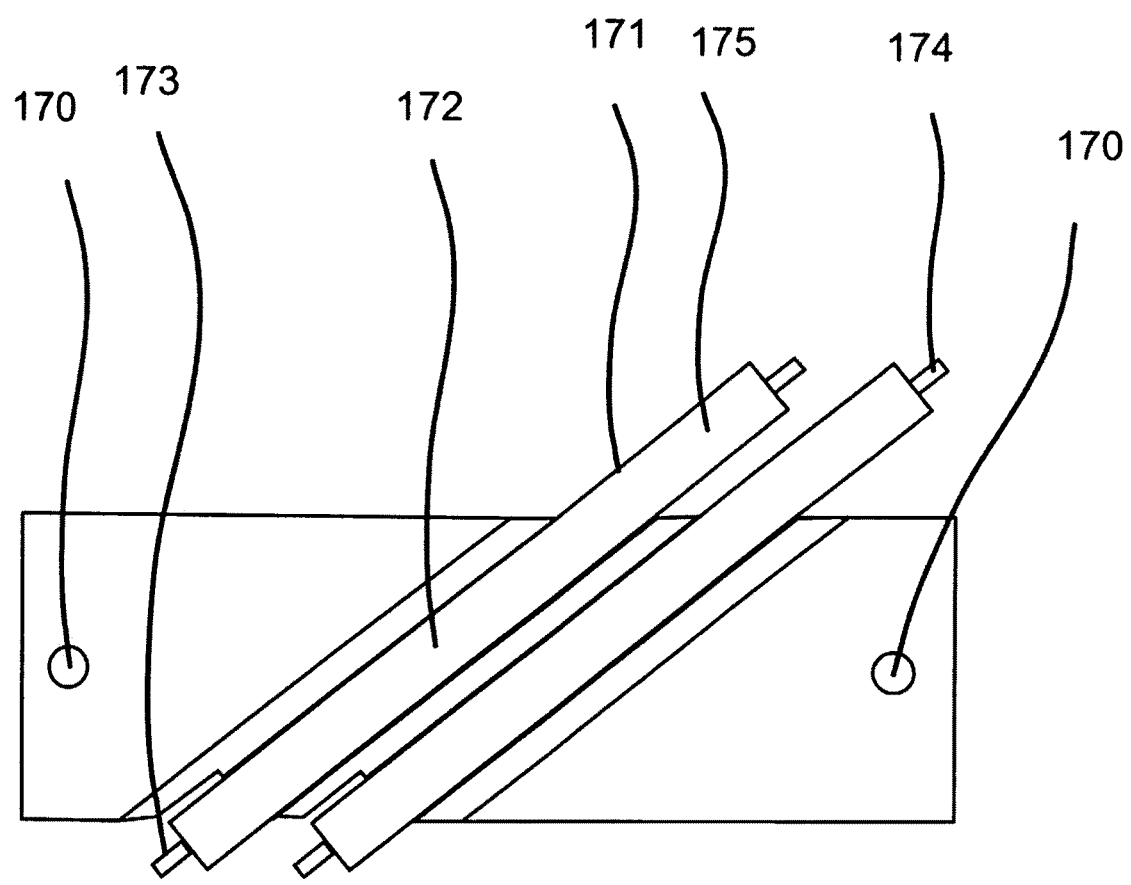
FIG. 26 demonstrates how it is possible to employ a pair of Ammonia evaporators mounted on the same copper heat spreader.

FIGS. 25 and 26 depict heat spreaders that are designed to interface a cylindrical evaporator with the device being cooled. The evaporators in these pictures employed a working fluid whose pressure runs between 10 and 20 atmospheres when used to cool devices rejecting energy at 65 to 100 C. The high pressures require that the evaporator be made of a strong material. The cylindrical structure 171 is ideal for containing high pressure gases. The diameter of the cylindrical shells 171 employed is only 0.3 inches, which is just slightly larger than the tubing used to make standard heat pipes. However the condenser tubing (173 and 174) is only 0.1 inches, which is much smaller than the ¼ inch tubing used in heat pipes. This is partly a result of the fact that higher pressure working fluids have higher densities, making it possible for them to carry the same heat as water using much lower flow rates. The evaporators seen here were made of Nickel and interfaced to copper heat spreaders using solder. Two heat spreaders 176 are shown, one that employs a single evaporator (FIG. 25) and another (FIG. 26) that contains two. When cooling a 1" square device, it is actually possible to mount three evaporator shells on a single heat spreader to obtain a maximum heat rejection of three times that available from a single evaporator tube. The peak power that this design ought to reject working with a 100.degree. C. semiconductor device is close to 1000 Watts-25 times the amount of heat being rejected by ordinary heat pipes that take up roughly the same amount of headroom in a chassis, and whose outside diameter is actually greater than that of the condenser pipes used here!

The items called out in the two figures are: clearance holes 170 for the motherboard spring loaded clamping bolts, the return liquid intake line 174, the region 175 of the evaporator where the return fluid gets stored internally and which is called the compensation chamber, the shell 171 itself, the region of the shell 172 where the internal wick converts liquid to gas and produces the pressure gradient that drives the cooling loop and the condenser exhaust port (173). To reduce thermal resistance between the evaporator wick internal to the evaporator shell and the device being cooled, a shoulder 177 was introduced in the heat spreader. In addition, the cavity 178 that was milled into the heat spreader was also designed to minimize thermal resistance by reducing the amount of copper between the bottom of the shell and the bottom of the heat spreader as much as possible.

The only difference between the heat spreader shown in FIG. 26 and that already examined, is the fact that the spreader in FIG. 26 has two evaporators soldered to it. Otherwise, the numbers that are called out here are identical to those called out in FIG. 25.

Figure 27:
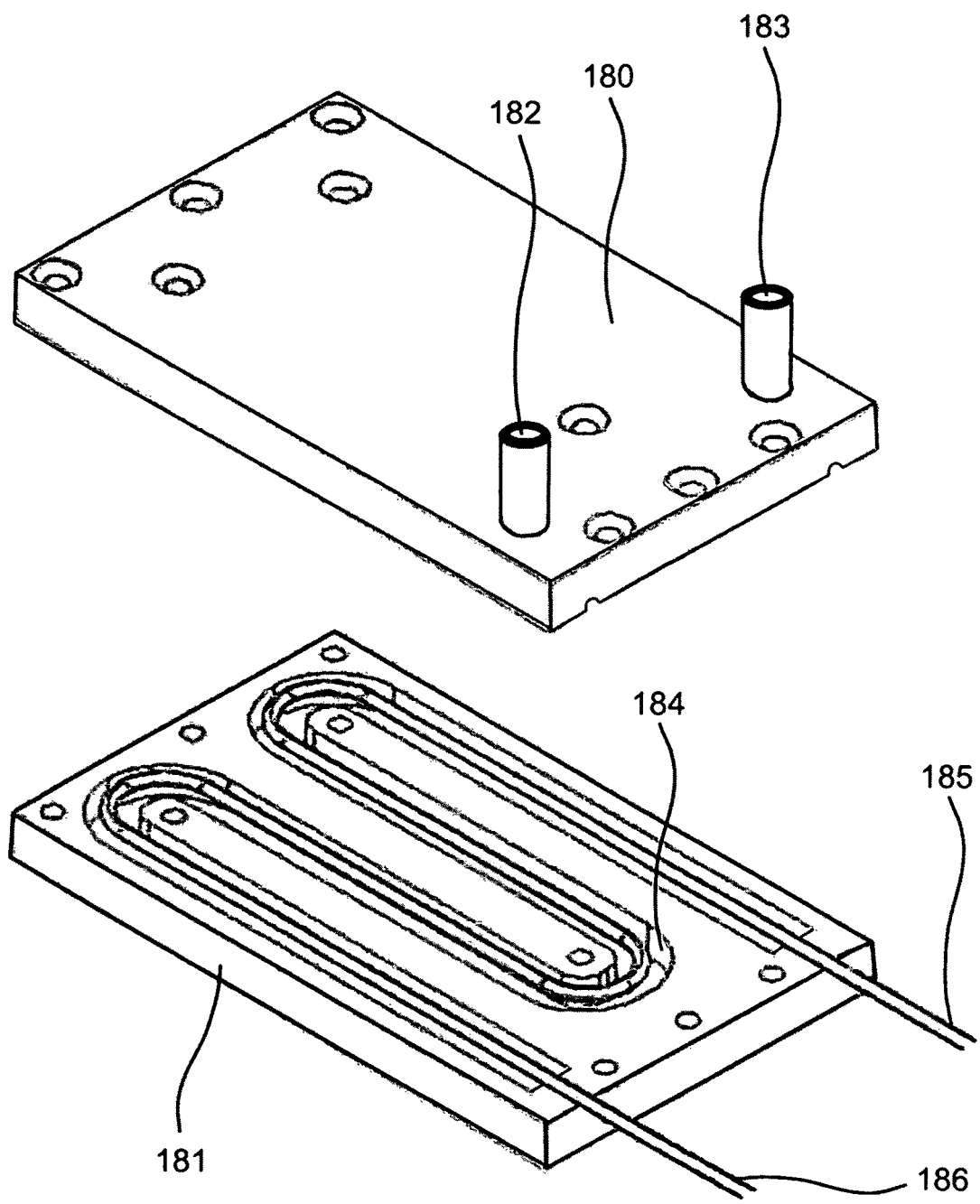
FIG. 27 is a perspective view of a serpentine shaped condenser tube that has been enclosed within a jacket through which a cooling liquid like water is passed to cool the condenser tubing.
Figure 28:
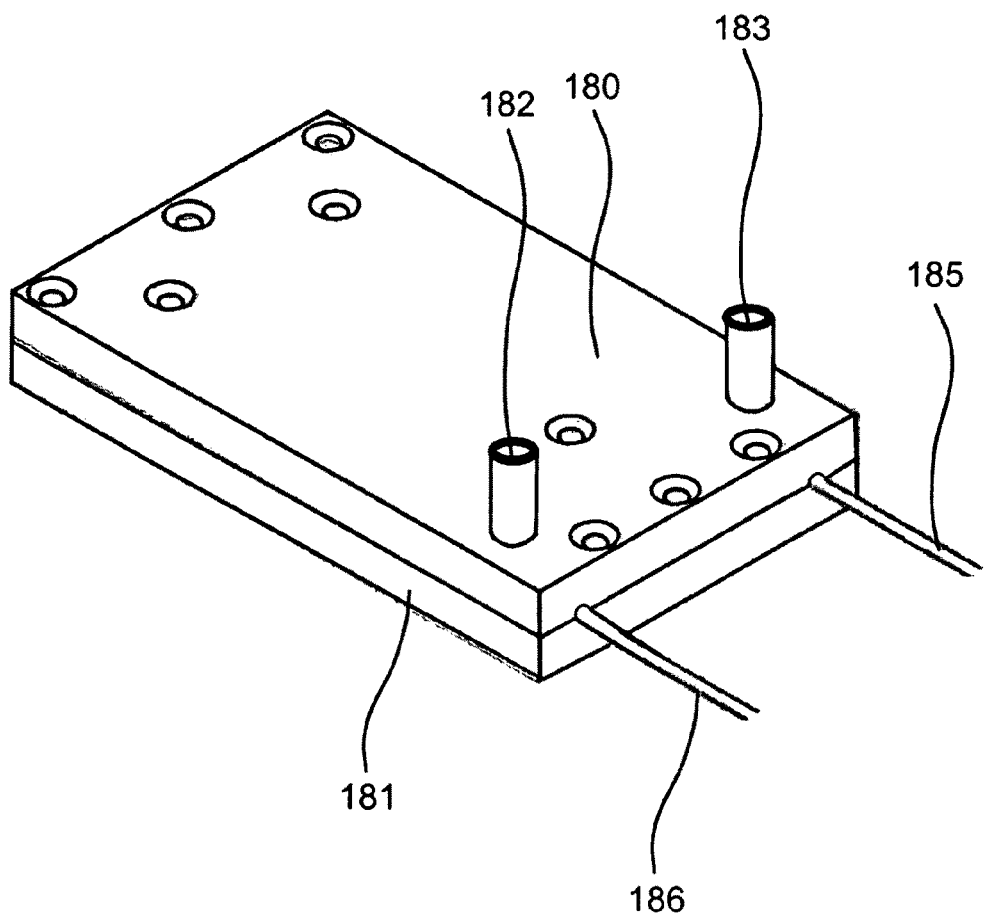
FIG. 28 is a perspective view of the water jacket first drawn in FIG. 27 showing the condenser tubing coming out and vertical entry and exit ports used to circulate coolant through the jacket.
Figure 29:
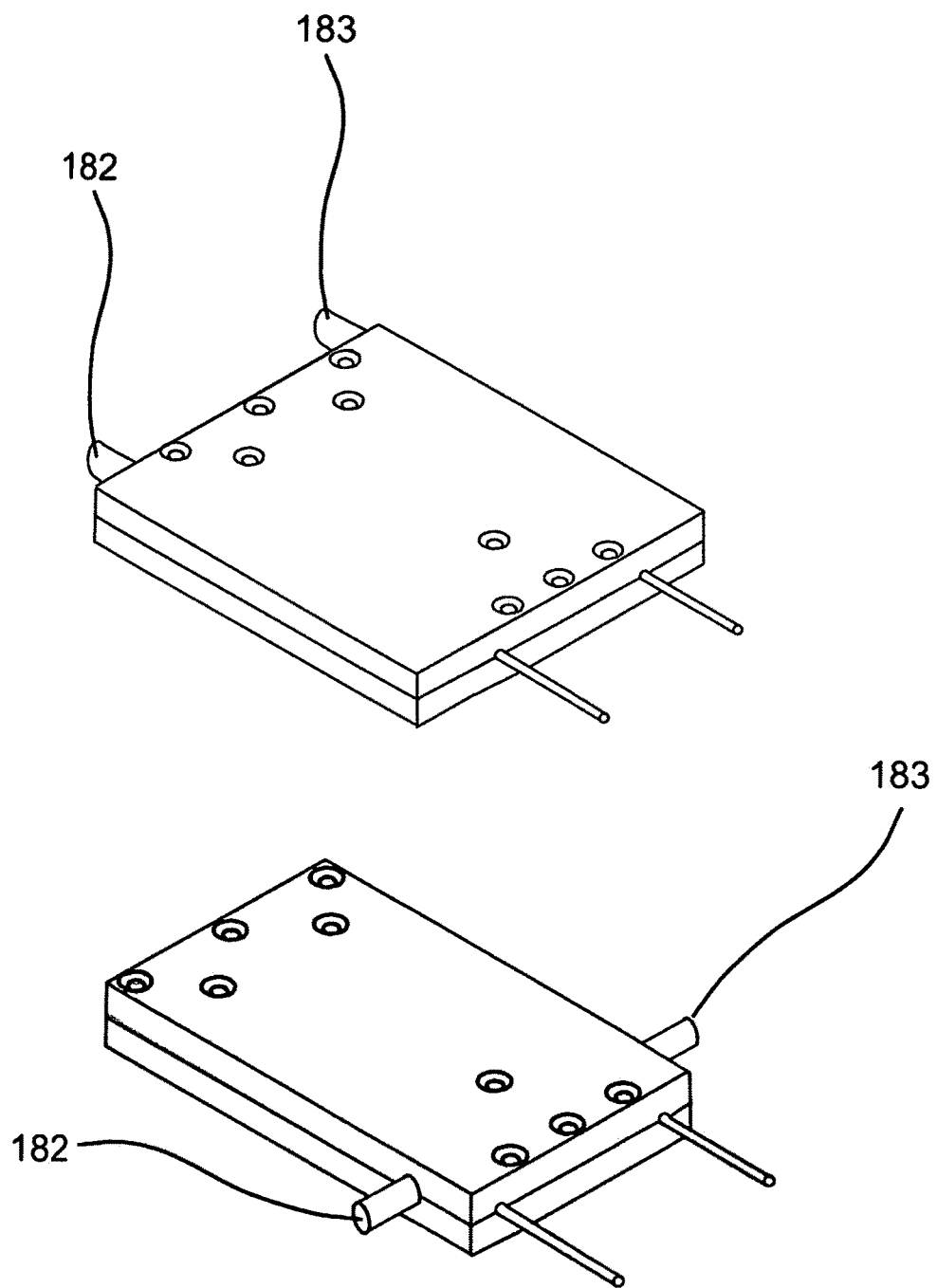
FIG. 29 is a perspective of the jackets shown in FIGS. 27 and 28 with the entry and exit ports moved to locations which provide more convenient access.

FIGS. 27, 28 and 29 are for a direct liquid cooled counter flow heat exchanger that was designed to make further reductions in LHP thermal resistance. At the time that we designed these devices, our goal shifted from simply cooling hot processors, to rejecting a secondary coolant that was as hot as possible, and certainly much hotter than the air that is typically rejected by rack mount chassis and rack cabinets into data center rooms. Using this device overall LHP thermal resistances of 0.15.degree. C./Watt were achieved, making it possible to cool a 100 Watt CPU and maintain a die temperature as little as 65.degree. C. using warm intake water whose temperature was 30.degree. C., while producing output water as hot as 50.degree. C. A similar device that also employed a coolant jacketed serpentine heat exchanger was able to cool a device rejecting 320 Watts operating at higher temperatures. LHPs and LHPLs that satisfy this criterion are capable of operating in climates as hot and humid as Atlanta Ga. driving evaporative cooling towers, whose output hits 30.degree. C. on the hottest most humid days of the year.

The exact form of the liquid cooled condenser exchanger is not critical. The liquid jacket can be as simple as a pipe that encloses the condenser line. The distance that the condenser pipe travels while encased in a water jacket is. And, when the goal switches from simply condensing the primary vapor to condensing it while at the same time producing the hottest secondary coolant, then other things become important as well. These include preventing heat leaks across the condenser while at the same time making it possible for the smallest secondary coolant flows to be fully taken advantage of. All three criterion can be met in LHP and LHPL condensers making LHPs and LHPLs probably the best devices available for not only efficiently transferring energy off hot running semiconductor devices but also producing secondary coolant flows whose temperatures are as hot as possibly can be obtained.

FIG. 28 shows what the assembled unit looks like. This particular exemplary embodiment was made of two pieces of plastic, 180 and 181, that were machined and attach together using 9 screws that passed through the upper piece of plastic 180 and engaged threaded holes in 181. The orientation of the devices is not critical, provided that the liquid is flown through the channel 184 (FIG. 27) in a counter flow manner in which the hot vapor arrives at the end of the heat exchanger opposite the point where the hot liquid return is situated. In both figures, we assume that 186 is the vapor input line, which makes 182 to hot water return. The chilled (but possibly warm in summer months when Free Cooling is being used) coolant enters the heat exchanger from the opposite side through pipe 183 near the point where the condensed primary coolant 185 returns to the LHP evaporator.

The ability of the LHP evaporator to accomplish the three critical tasks starts with their ability to drive primary coolants through long lengths of condenser tubing making it possible to employ large heat contact areas between the primary and secondary working fluids. Making the condenser jacket out of a thermal insulator solves the second problem. The third problem, making it possible to get good thermal conduction between the primary and secondary coolants even when the secondary coolant velocity has been reduced, is made possible in our case by the use of a helically wound device that we thermally attach to the condenser pipe which is made of a thermally conducting material that may take the form of a wire or foil that has been helically wound about the condenser pipe and is thermally attached to it. Adding this helical shape to the condenser pipe doubles its area while at the same time forcing the liquid to take a much longer helical shaped path through the heat exchanger. In addition, it breaks up boundary layers that inhibit heat conduction when a fluid is simply allowed to flow along a pipe. The net effect on the ability of the device to provide adequate condensation while at the same time employing liquid (i.e. water) coolant flow rates as low 1 CC/sec, is large and plays a crucial role in decreasing the overall thermal resistance of LHPs and LHPLs.

A critical person might want to know what is so different between this situation and the one where direct water cooling is used to cool a CPU, ignoring all the energy wasted in pumping water. After all, now that we have efficiently gathered energy off of the device being cooled, the next thing we are doing is using it to do the same thing that direct water cooling does, which is to heat water. As was the case with the LHP wick, whose wick has a huge internal contact area, the critical aspect that makes efficient heat transfer possible at the condenser end of LHP and LHPL devices, is the area that is available to carry out the transfer, with the devices that have the largest contact areas, resulting in the smallest flow velocities and hence, the smallest loss of energy to devices that enable high speed flows. It turns out that the effective heat exchange area of the condensers pictured in FIGS. 27,28 and 29 is around 4 square inches. Employing a helical foil or wire doubles the area to around 8 square inches. The typical heat exchanger that used in direct liquid cooled CPU heat exchangers employ a liquid that is directed at a surface whose area is around one square inch, which might get doubled to two, using bumps. While this provides us with a four to one advantage, the actual advantage when it comes to producing a coolant that is heated is actually greater because in our case the liquid has to pass from one end to the other of the condenser line, and at each station along this path, the temperature of the vapor that is heating the secondary coolant rises, whereas in the case of a silicon die being cooled by exposure to a heat spreader that is in turn being cooled by water, the spreader itself and mixing within the plenum opposite the contact surface end up providing thermal energy short circuits as well as recirculation within the flow itself. All of which makes it difficult to produce a liquid coolant whose delta T across the inlet and outlet is large. The corollary to the situation where the delta T is reduced, is the velocity (and the energy put into it) needs to be increased.

FIG. 29 shows alternate exemplary embodiments of this design that have liquid coolant inlet and outlet ports (182 and 183) in locations that make feasible many different ways to employ these devices in semiconductor cooling situations.

Figure 30:
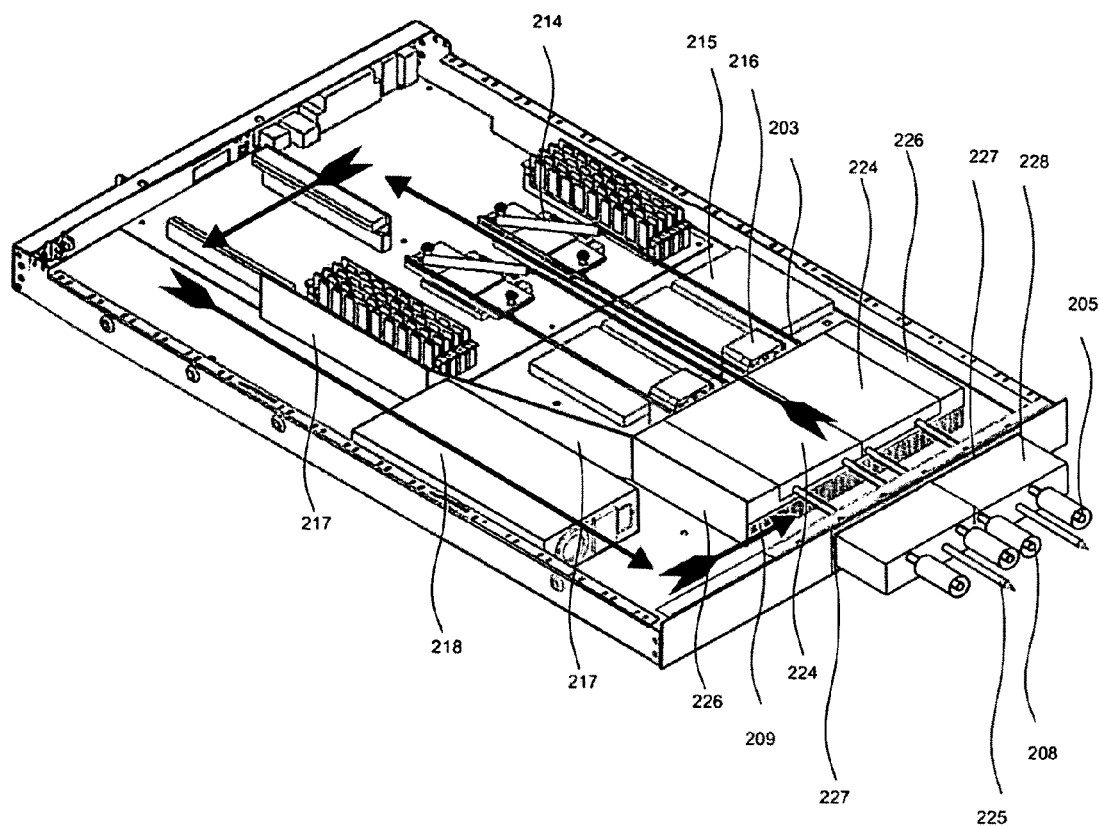
FIG. 30 is a perspective view which shows a sealed 1 U chassis in which a jacketed LHP condenser is employed along with internal circulating fans and a set of quick disconnects at the rear of the chassis for providing it with the liquid coolant that cools all of the components within the chassis.

FIG. 30 is an oblique 3D diagram of a specific exemplary embodiment of a very efficient method for cooling electronic devices enclosed in an electronic enclosure that has direct access to a chilled liquid coolant that implements one of the general claims made by the disclosure. The electronic enclosure drawn happens to be a 1 U rack mount chassis, but may be any electronic enclosure with direct access to a chilled liquid manifold. The specific implementation drawn here employs a particular method of delivering chilled coolant to the electronic enclosure but any method that suffices to deliver coolant to the enclosure will also work. The main features of the exemplary embodiment include:

1) The use of energy efficient passive devices of any type, including LHPs, LHPLs and ordinary heat pipes to remove the primary heat load from the devices rejecting it and to deliver this heat load to one or more efficient direct liquid cooled heat exchangers.

2) A method for removing the ancillary heat load and transferring this heat load directly to a chilled liquid, that may employ one or more methods including combinations thereof, including direct liquid cooled closed loop air circulation, passive connections between the ancillary components and a chilled liquid cold source such as a cold plate, chilled liquid cold plates in contact with PCBs enclosed by the enclosure and circulation of air within the chassis in a closed loop that does not involve the use of a chilled liquid air heat exchanger. The last method was specifically included in the list of ancillary methods to allow distributed cold plates within the chassis to directly cool the PCBs that reject most of the ancillary heat (outside of the primary loads) including motherboards and power supplies while at the same time employing circulating air within the chassis to gather up the remainder of this heat and allow it to be inexpensively exchanged with the PCBs being cooled by cold plates, which just happen to contain a lot of copper distributed over large surface areas. The specific exemplary embodiment in FIG. 30 is for a "sealed 1 U chassis" that employs a pair of LHP evaporators 214 that are cooled by a pair of counter flow LHP heat exchangers 224 previously described, to cool a pair of processors. This particular exemplary embodiment is similar to that shown in FIG. 18, with the exception that we have now replaced the split condensers (that employ permanently connected liquid connections) with a liquid cooling system in which we employ quick disconnects 205 and 208 (note we are calling out two of the four liquid feed lines and are using the same numbers we previously did for the hot and cold chilled liquid lines to now point to the quick disconnects that they are attached to. The quick disconnects happen to be female components, but they could just as easily have been male. They protrude into a small optional duct (not shown) that surrounds the main liquid feed mains and employs the same or a similar chassis to duct sealing arrangement as was previously employed with the negative pressure air duct. Within the duct sits a mating device that in this case happens to contain four male interconnects as well as a pair of guide holes that interface the guide pins 225 (one of which is labeled) seen here. This method of using pins that get larger as they expand into a guide hole for automatically connecting together couplings that carry liquids is similar to the ones employed in computers to align sockets that need to accurately mate. The purpose of this optional duct or shield 228, though is quite different. Enclosing the main liquid feed lines in a sealed duct and then avoiding the use of internal connections within the rack mount chassis itself, greatly reduces the possibility of liquid leaks within a chassis that may also be receiving electric power at 110 AC, 240 AC or 300 VDC power. The crushable seal 227 that makes contact with the duct can also be seen here.

Beneath the LHP counter flow heat exchangers can be seen the fins 209 of a liquid cooled air heat exchanger. The liquid that feeds the air heat exchanger in this exemplary embodiment just happens to come from a distribution block 226 that surrounds and contains the heat exchangers and includes a liquid cooled base plate that is thermally attached to the fins. The liquid that cools the air heat exchanger does not have to be shared with the heat exchangers and the precise order in which the liquids that cool the LHPs and the air get applied, is up to the engineer designing the system and the inclusion of other methods, which such as a method for bleeding air at a particular relative humidity into the rack mount chassis. Another pair of lines could have also been employed to supply the liquid assisted air heat exchanger or two of the four lines in FIG. 30 could have been split within the chassis and used to cool the primary load LHP heat exchangers while the other two were employed to cool the air heat exchanger.

This method uses a similar technique described in the exemplary embodiment in FIG. 18 to handle the secondary heat load, which is to circulate air within the chassis proper. The large arrows in FIG. 30 display the path taken by the closed loop air-cooling circuit employed. The actual path employed is not fixed. Any path that returns cooling air that has been heated by the secondary load, back to the liquid assisted air heat exchanger inlets, will suffice.

What is different about the method is its use of direct liquid cooling of the primary LHPs or LHPLs along with the fact that it can combine direct liquid cooled air heat exchangers, cold plates and air circulating without the use of liquid assisted air heat exchangers. In the exemplary embodiment displayed in FIG. 30, the secondary heat load is being picked up by a closed loop sealed air flow that stays within the chassis that passes beneath the LHP heat exchangers before being accelerated by a pair of fans 216 (one of which is called out) that could just as easily been one or more blowers before passing over a line of hard disks that could just as easily been located at the front of the chassis or omitted altogether and under and over the motherboard before turning the corner defined by the baffle 217 on the left hand side of the chassis interior and then passing through the power supply 218 where it gets accelerated again before reaching the entry plenum of the liquid assisted air heat exchanger that sits beneath the LHP primary load heat exchangers and then being sucked up again by the cooling fans that are the primary drivers of this closed loop cooling circuit. The intention here is to seal the chassis, using a positive pressure technique that slowly bleeds dry air into the chassis when the temperature of condensing surfaces within the chassis are below the relative humidity of the air in the room. In poorly managed data centers, up to 10% of all energy gets devoted to condensing and then humidifying the airflow. This is done to make the data center more convenient for humans and to reduce ESD. It turns out that in well designed and grounded circuits, such as those employed within rack mounted chassis, the ESD requirement has now been eliminated. However, care still has to be taken not to condense water vapor out within the chassis.

The two things that make this method so extraordinarily energy efficient are the very low thermal resistance of the LHP primary heat load cooling mechanism combined with an efficient as possible approach to recovering the secondary heat load. The latter has been greatly improved over other methods that combine direct chilled liquid cooling of the primary load (which is two orders of magnitude less efficient than the passive techniques employed here) with circulating air, by minimizing the energy required to circulate the air and also by employing optional PCB cold plates where possible to minimize the amount of air-cooling required in addition to keeping the length of the path used by the closed loop air circuit, much smaller than other solutions which often take the air on excursions that are a few to many meters in length.

Figure 31:
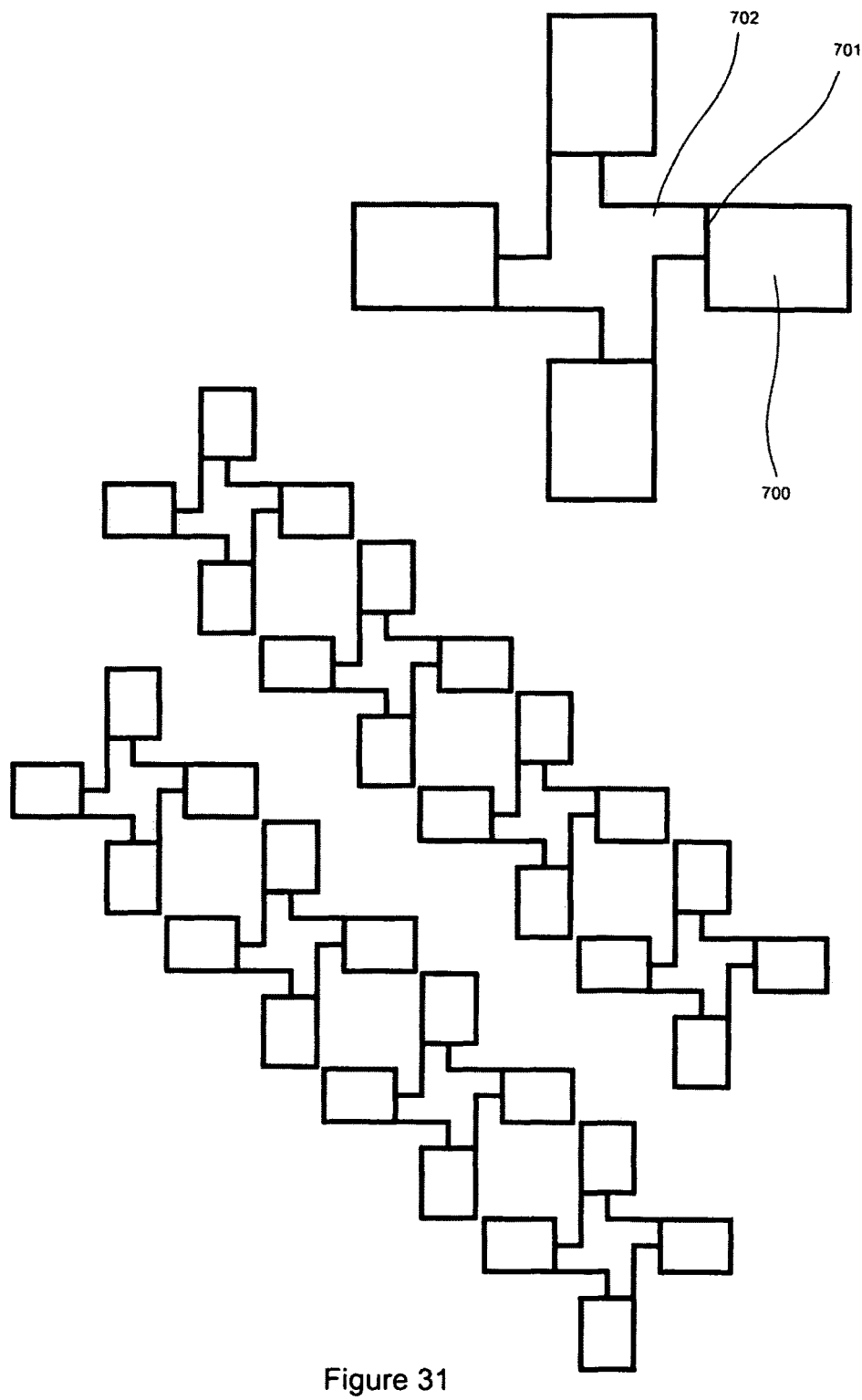
FIG. 31 shows a method of laying out rack cabinets in a data center that are attached in groups of four to a negative pressure duct.

FIG. 31 demonstrates how rack mounted chassis 700 that are being serviced by ducts 702 that provide either negative pressure air or chilled liquid manifolds can be employed to cool a plurality of rack mount chassis installed in racks or possibly cabinets. The rectangles labeled 700 in the grouping in the upper left corner represent four rack cabinets or open racks containing rack mount chassis that employ seals 701 that connect them to the duct 702 employed to provide these cooling services.

This particular implementation uses a common service duct to handle four groups of rack mount chassis. The potential here is to be cooling 50 and 80 KW per rack cabinet or open rack, making it possible for each of these service ducts to have to provide as much as 300 KW in power while rejecting roughly the same amount of energy to a liquid flow. A gram of water heated up 20.degree. C. can carry 20*4.184=83.7 Joules of energy. Dividing 300,000 Joules/sec by 83.7 reveals that it takes 3584 grams per second of water, or 3.58 Liters per second which is equal to 0.96 gallons per second to carry off this much heat. However, the delta T that we used here, 20.degree. C., is really quite large, and could only be achieved using the LHPs we describe in this disclosure that employ very efficient counter-flow heat exchangers. For any other method, the typical delta T would be around 5.degree. C., which would increase the water flow rate needed to service a group of four racks up to 4 gallons per second. For the grouping shown below a delta T of only 5.degree. C. would result in a flow rate of 32 gallons per second or 1920 GPM. When you start to deal with flow rates of this magnitude, it becomes necessary to become water supply concentric, which is what our approach to creating this network of ducts is.

Figure 32:
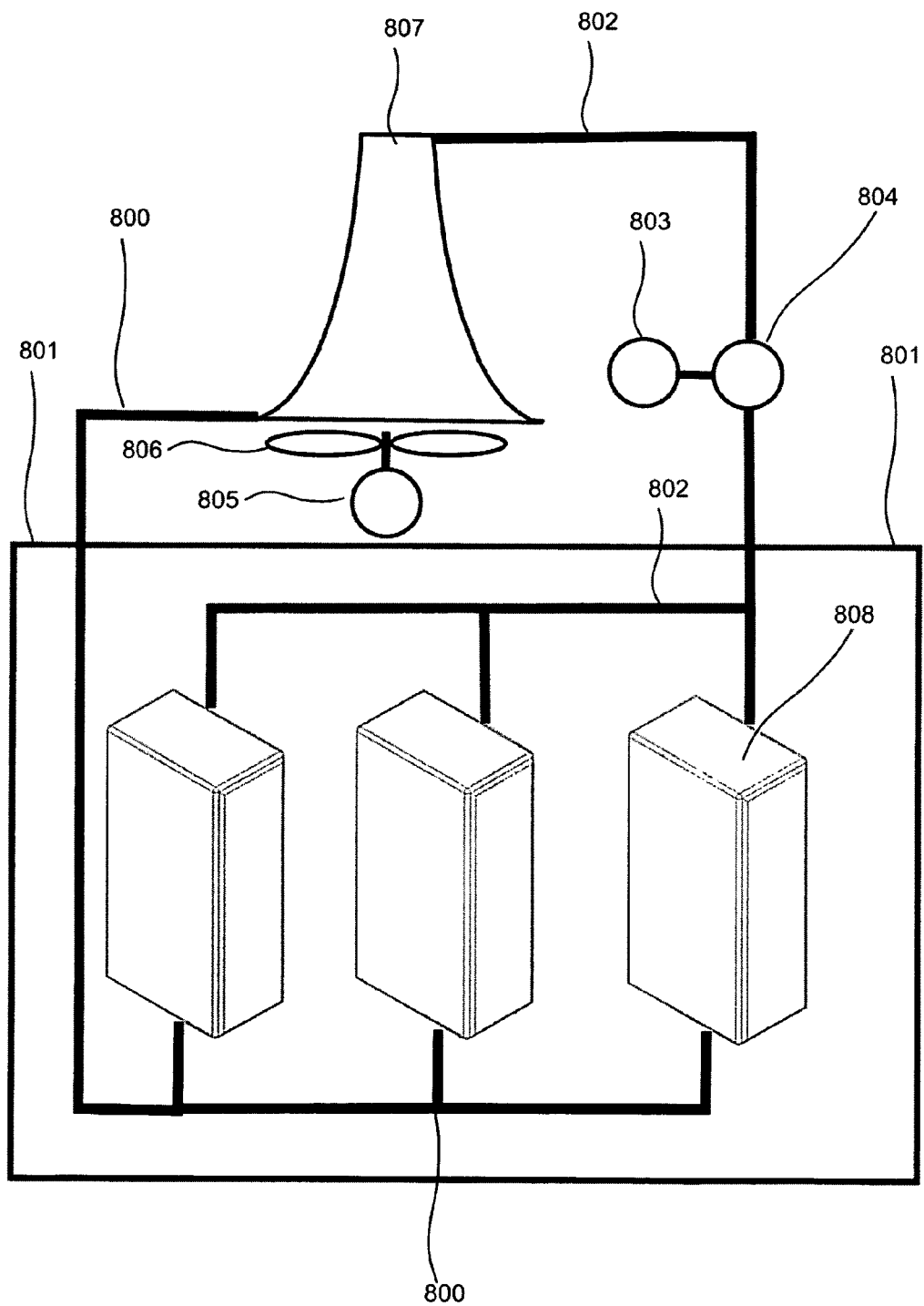
FIG. 32 is a schematic drawing of a data center that employs three rack cabinets, a cooling tower and circulation used to move coolant directly between the chassis in the rack cabinets and the cooling tower.

FIG. 32 demonstrates how a cooling tower 807 can be hooked up directly to a data center, whose data center room 801 contains a plurality of rack cabinets 808 is sending chilled water to the cooling tower through a pipe network 802 that includes a pump 804 that is driven by an electric motor 803. The precise manner in which the chilled water and the connections to the cooling tower are to be created, are to be designed by experts in the field. This drawing is just an exemplary embodiment of a way that the author believes such a system could be set up. The cooling tower may or may not need a cooling fan 806 driven by a motor 805, depending on its architecture and size, but one has been provided in this schematic presentation. The chilled water that results leaves through a network of pipes 800 and returns to the data center room and its rack cabinets 808.

Figure 33:
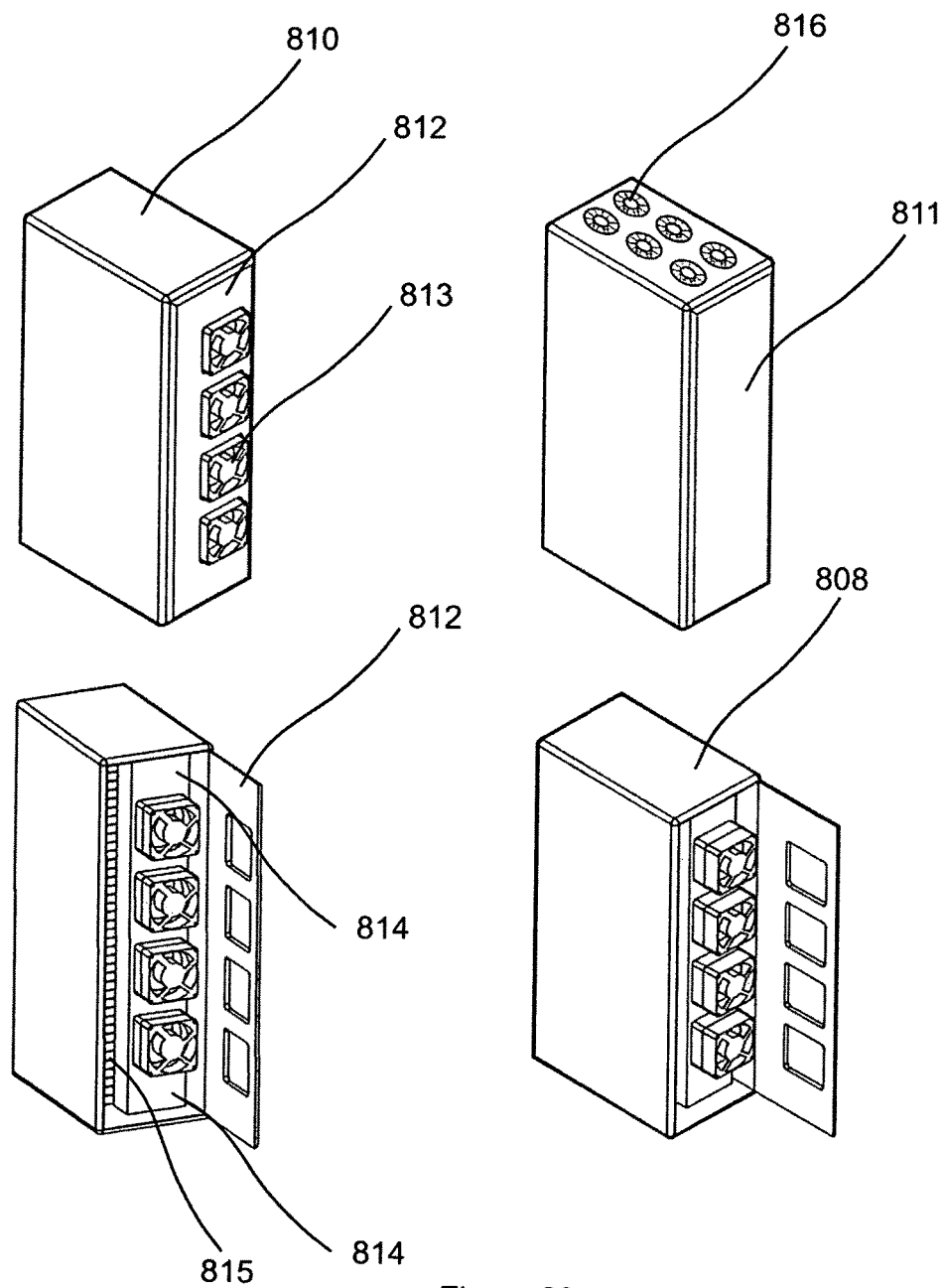
FIG. 33 shows several different view of rack cabinets which employ cooling ducts and fans.

FIG. 33 shows four different rack cabinets 811 in different orientations. The one in the upper right corner employs six fans in its top panel to evacuate the air from the cabinet, which can be provided to this "fan tray" by an internal duct. The upper left cabinet is pictured with its door 812 closed, revealing four large fans 813 that protrude from it two inches. The top panel for this unit 810 is also called out. The unit on the lower right, has a lead line 808 that is intended to point to the entire unit, to remain consistent with FIGS. 32, 33 and 34 and like the unit on the lower left, it also provides a view of the fans 813 and the duct 814 that they sit on as well the door 812. The unit in the lower right hand corner provides a view of the rack mount chassis 815 within the cabinet. The duct which is sealed to them 814 can now be clearly seen.

Figure 34:
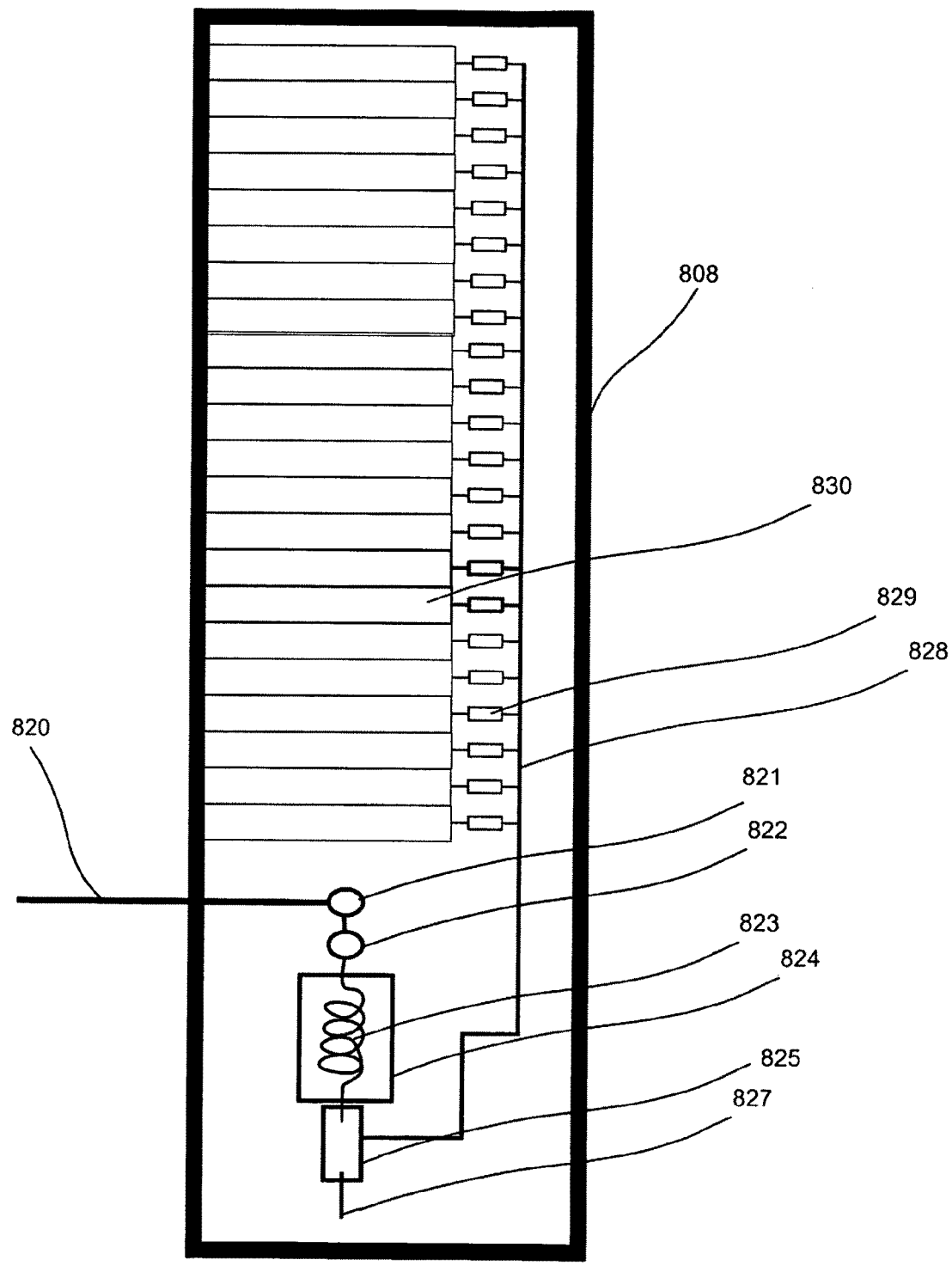
FIG. 34 is a schematic of a device used to produce dried air for insertion into a group of sealed chassis contained in a rack cabinet.
Figure 35:
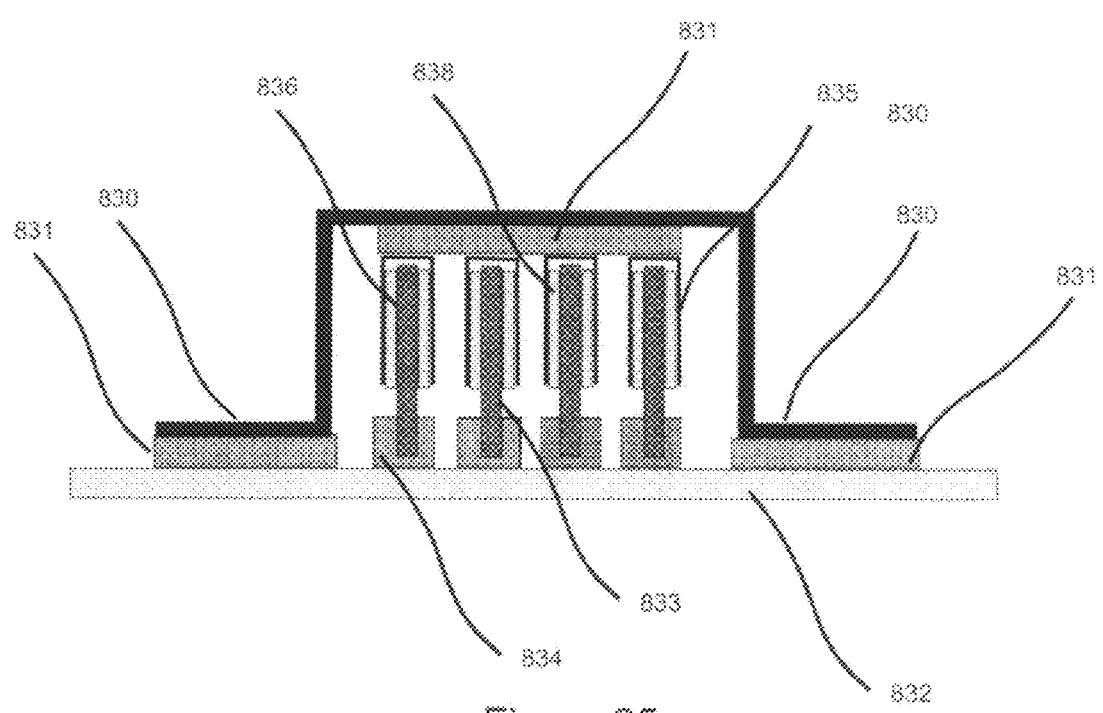
FIG. 35 is a cross sectional view of a device intended to remove heat from a group of DIMM modules.

FIG. 34 is a schematic representation of a primary closed loop system 900 that uses a split condenser. A processor 902 or other device (not necessarily restricted to an electric device) is thermally attached to an evaporator 904. A hot working fluid 906 exits the evaporator and travels to a condenser 908 via a first line 910. When the fluid 906 has moved through the condenser 908, the fluid 906 returns to the evaporator 904 via a second line 912. The condenser 908 cools the fluid 906 to create a phase change in the fluid 906 from gas to liquid. Within the evaporator 904, the fluid 906 undergoes a phase change from liquid to gas. A plurality of compensation chambers 914 may be included in the first line 910. In the embodiment illustrated, the evaporator 904 includes a capillary pump 920.

In an embodiment where the working fluid 906 is single phase (liquid or gas without a phase change), an optional pump 940 is required to move the fluid 906.

Several hundred million heat pipes are manufactured every year, most of which end up in computers. The majority of these devices employ a single tube through which heat vapor flows to carry heat away while at the same time employing a capillary device such as a wick to return the working fluid from the cold condenser to the hot evaporator. The "heat pipe" was likely invented at Los Alamos during the second world war. It is a derivative of the thermosiphon invented by German bakers in the $19^{th}$ century, which like Loop Heat Pipes (LHPs) and Capillary Pumped Loops (CPLs) differ from ordinary heat pipes by virtue of the fact that two tubes are used instead of a single one to transport vapor from an evaporator to a condenser and then a second tube transports the condensate back. The problem with heat pipes is the returning liquid transported by a wick is limited in the length and velocity by viscous drag in the wick and also by heat transfer between the opposed flow. The first improvement was a heat pipe where the returning liquid moved through a tube with a wick therein that eliminated the interference loss but still suffered from evaporator dry out when the distances between the evaporator and condenser were large or the heat being rejected was large (U.S. Pat. No. 3,543,839). Such devices can masquerade as LHPs or CPLs, but their performance is only slightly better than an ordinary heat pipe. All five of these devices have different heat transfer performance characteristics, many of which disqualify them for use cooling electronic components housed in devices like servers. One of our goals in this section has been to differentiate the different passive heat transfer devices from each other, to provide examiners with the incite needed to understand the benefits of the LHPL devices at the heart of our claims. Much of the passive heat transfer prior art that appears in the patent literature never makes its way into peer reviewed engineering journals because of their embarrassingly poor performance curves or their another glaring drawback that is not obvious, such as their inability to work properly when tipped on a side or upside down.

A study of Thermosiphons used to cool a computer was conducted by Hewlett-Packard (HP) (http://www.hpl.hp.com/research/papers/2002/thermosyphon.pdf) that demonstrates the orientation problem. This study employed a "microchannel" like evaporator design that has additional problems that the LHPL evaporators we employ do not, including instabilities caused by bubbles that cause them to boil over at high heat loads. Simply comparing the results of the HP study with ours we discovered that even with small distances separating the evaporator and condenser their performance was at a distinct disadvantage their thermal resistance of 0.41 C/W was roughly twice as large as ours cooling a similar load sitting at three times the distance. However their device turns off when tipped or turned upside down while our device may work in all orientations at peak power, which is the reason that HP has rejected the use of a thermosiphon in its commercial computer products.

CPLs and LHPs (Loop Heat Pipes) were invented roughly 12 years after the first heat pipe with a separate liquid return line, at the same time in the United States and Russia for use in space vehicles. They work in all orientations and can be distinguished from each other by the location of their Compensation Chamber (CC): in CPLs the CCs are located in the liquid return lines while LHPs have CCs located within their evaporators. We use the term LHPL (Loop Heat Pipe Like) in this document when discussing devices which have CCs in either or both their evaporators and liquid return lines in addition to devices derived from them that include a vacuum pump in the vapor line. CCs play a crucial role in the start-up characteristics of all passive heat transfer devices and in the case of LHPs enable an important feature called auto-regulation, in which the working fluid moves out of the condenser into the CC as the heat being rejected increases. This effectively results in an increase in the volume of the condensation channel as the power goes up, increasing the condensation rate in the condenser which in turn enables the rejection of increased heat loads. Without a CC in the evaporator you lose this important performance feature which is unique to an LHP. A number of the mislabeled prior art devices do not include CCs guaranteeing poor performance at high power. The disadvantage of putting a CC in the liquid return line is a more complicated start up that can require that the CC be heated to move the liquid stored in the liquid return line into the evaporator to avoid dry out. We solve this problem below for situations where a CC in the liquid return line might prove useful by embedding a computer in our cooling system which we employ for regulating the operation of the device as conditions change, which includes attaching low power refrigeration devices such as a TEC (thermoelectric cooler) to the CC.

A major benefit of our approach to LHPL design is the performance of our evaporators whose high volume vapor output may make it possible to dramatically reduce the number of fans required to cool a 1U chassis by distributing the rejected heat using a set of condenser fins with large area. The high pressure vapor we produce makes it possible to reject heat over a large set of fins without the use of ordinary heat pipes, which are often used to improve the performance of a set of heat exchanger fins by moving heat away from the entry point in a heat spreader out to the fins. LHPs eliminate this need and at the same time guarantee that the thermal resistance between the working fluid and the fins themselves is minimized, which reduces the thermal resistance of air cooled condensers. This performance feature takes advantage of the LHP classic evaporator wick design which employs escape channels in the condensation zone to minimize pressure losses in the wick. We frequently found devices labeled CPL that were missing either a CC or escape channels or both. One such device a condenser that depended on gravity to return liquid to the evaporator (i.e. it was a thermsiphon). A peer reviewed publication for this device cooling a 1U chassis enabled us to compute its thermal resistance which turned out to be roughly a factor of two worse than our equivalent design. The crucial LHPL parameter that needs to be reduced to improve energy efficiency is thermal resistance. The bottom line on any invention is its commercial viability. Variations on the basic LHP or CPL designs that have been proven to work but do not result in improved cooling performance or which turn off when tipped or turned upside down are by definition, not commercially viable.

Figure 38:
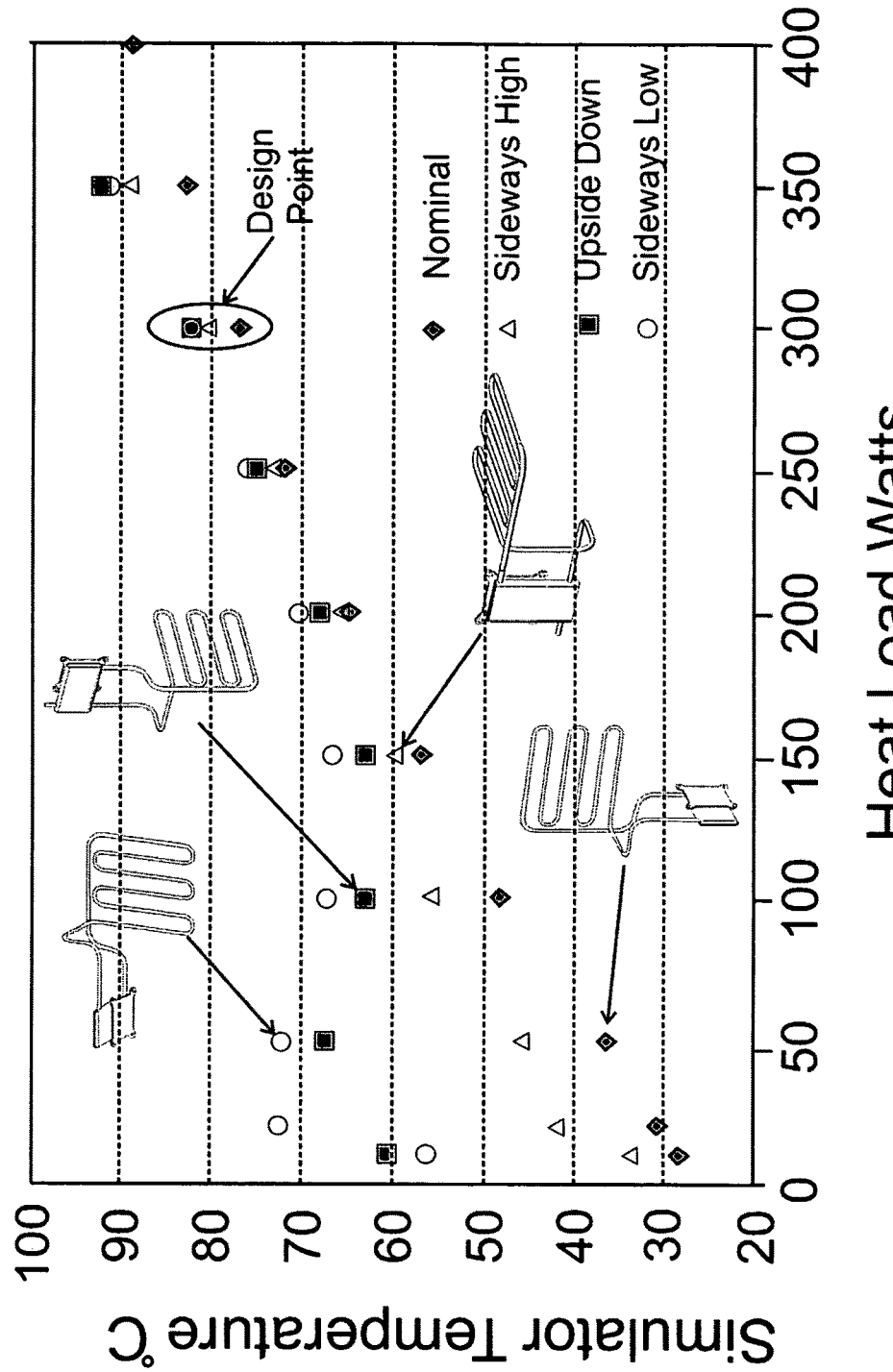
FIG. 38 is a performance curve of the right hand LHPL in FIG. 37.

All passive heat transfer devices are sensitive to orientation. LHPs and CPLs are the least sensitive, with their typical dependencies being peculiar start up characteristics, which may include a performance curve which starts to quickly rise at low power before falling off and then rising again. FIG. 38 in the specification is a performance curve of a GPU cooler designed to keep that device at 85 C or less, at all power rejection rates up to 300 Watts in all orientations. We have tested a device that employed 8 heat pipes, using them to cool a CPU mounted in a tower style computer. The device was able to reject up to 320 Watts when aided by gravity, but its performance fell to just 70 Watts when turned upside down. This device when vertically oriented appears to function as a hybrid device: part heat pipe and part thermosiphon.

Another drawback of some heat pipe based Tower CPU coolers is the fact that the rejected heat is not carried to the periphery of the tower chassis, and is free to move about raising the ambient temperature within the chassis forcing the exhaust fans mounted on the periphery to pull more air through to cool everything. By contrast, the GPU LHP whose performance we highlight in FIGS. 36, 37 and 38 could be used to cool CPUs just as easily as GPUs. Mounting the LHP condensers on the fans used to extract air from the chassis ends up eliminating the need for the fans employed by heat pipe enhanced CPU coolers which combine heat pipes, fins and fans into a five inch tall unit that sits on top of the CPU being cooled. Our approach reduces fan count, fan power while at the same time reducing the exhaust flow rate needed to cool secondary heat loads by reducing the ambient temperature within the chassis, one of whose side effects is hotter exhaust which improves the efficiency of HVAC water chillers.

Another major problem for LHPs turns out to be heat conduction through the evaporator shell into the CC (which is inside the LHP evaporator) at low power. When the heat being rejected by the evaporator moves backwards into the CC by conduction through the evaporator shell, it heats up the working fluid entering from the liquid return line. At high powers this heating effect is handled by the forward motion of the working fluid through the CC. To improve low power performance we have added to this disclosure cooling devices that extract heat from the evaporator shell in the vicinity of the CC that include finned heat exchangers and heat conducting strips. The net benefit of these cooling devices can be as much as a 10 degree reduction in the temperature of the semiconductor device being cooled. The benefits of CC coolers can be seen in FIG. 52. Other devices could easily be employed for this purpose, tiny coolers with embedded blowers, ordinary heat pipes that reject heat to near by cool objects, liquid cooled cold plates and thermoelectric (TEC) coolers. TEC coolers could also be used to reposition working fluid in the CC at shut down or start up to avoid dry out. Their use for this purpose presupposes the existence of a control device which turns them on at start up or shut down.

For many years the emphasis in the LHPL prior art arena has focused on creating evaporators that can reject higher and higher heat loads. We recently demonstrated a device that can reject 1000 Watts/cm.up.2. Our prior art includes evaporator that employ evaporator wicks with vapor escape channels that reduce the pressure losses associated with the vapor leaving the wick and entering the vapor line. One consequence of this approach is evaporators that can sustain a larger pressure drop across their wicks than devices using other geometries. The wicks themselves are typically made from sintered metal particles that are chemically compatible with the working fluid. A new evaporator was disclosed herein that makes it possible to inject heat into a flat evaporator on two sides at the same time. Except for this new form of evaporator, the design features of the wicks we employ are covered by prior art (U.S. Pat. No. 6,892,799).

One of the problems encountered in LHPL designs, is gathering up the heat from both the primary and secondary devices being cooled. In GPU designs in particular, a metal heat spreader is often attached to the GPU itself as well as the nearby components that cools these secondary heat rejecting devices. The heat is typically transported to a set of long parallel fins using as many ordinary heat pipes capable of being placed above the GPU itself. The upper limit to this approach becomes the contact area above the GPU that is free to accept ordinary heat pipes. It only takes a few heat pipes to consume all of this area and the distance that the heat has to be transported often limits the effectiveness of this approach by requiring that larger heat pipes be used to reject heat to portions of the fins that are farthest from the GPU. The space limitation that limits ordinary heat pipes in this application is not a problem for LHPs, whose evaporators can reject 500 or more Watts per square cm of heat spreader area. The remaining problem includes gathering the heat from the near by secondary heat sources and conducting that heat to the LHPL's evaporator. A unique design we have come up with is a flat oblong evaporator that can absorb rejected heat on two sides at the same time, making it possible to cool the secondary components with either a heat spreader or ordinary heat pipe attached to one side while the other side cools the GPU itself. This evaporator could also be used to remove heat from a pair of semiconductor components at the same time, each of which has been located on either side of its flat sides.

Figure 36:
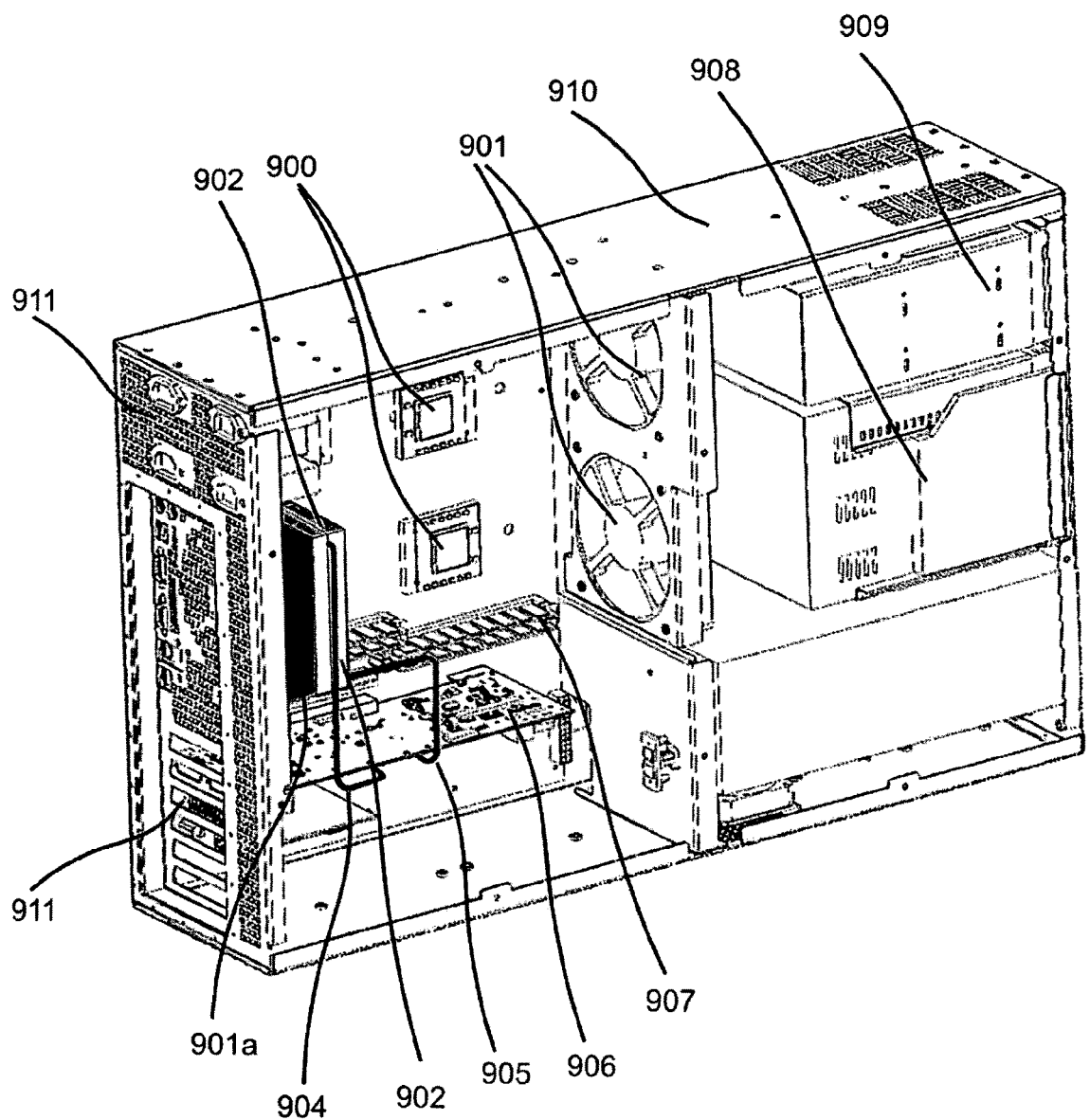
FIG. 36 is a PC Tower Chassis with an LHPL cooled GPU card that employs an existing chassis cooling fan.
Figure 52:
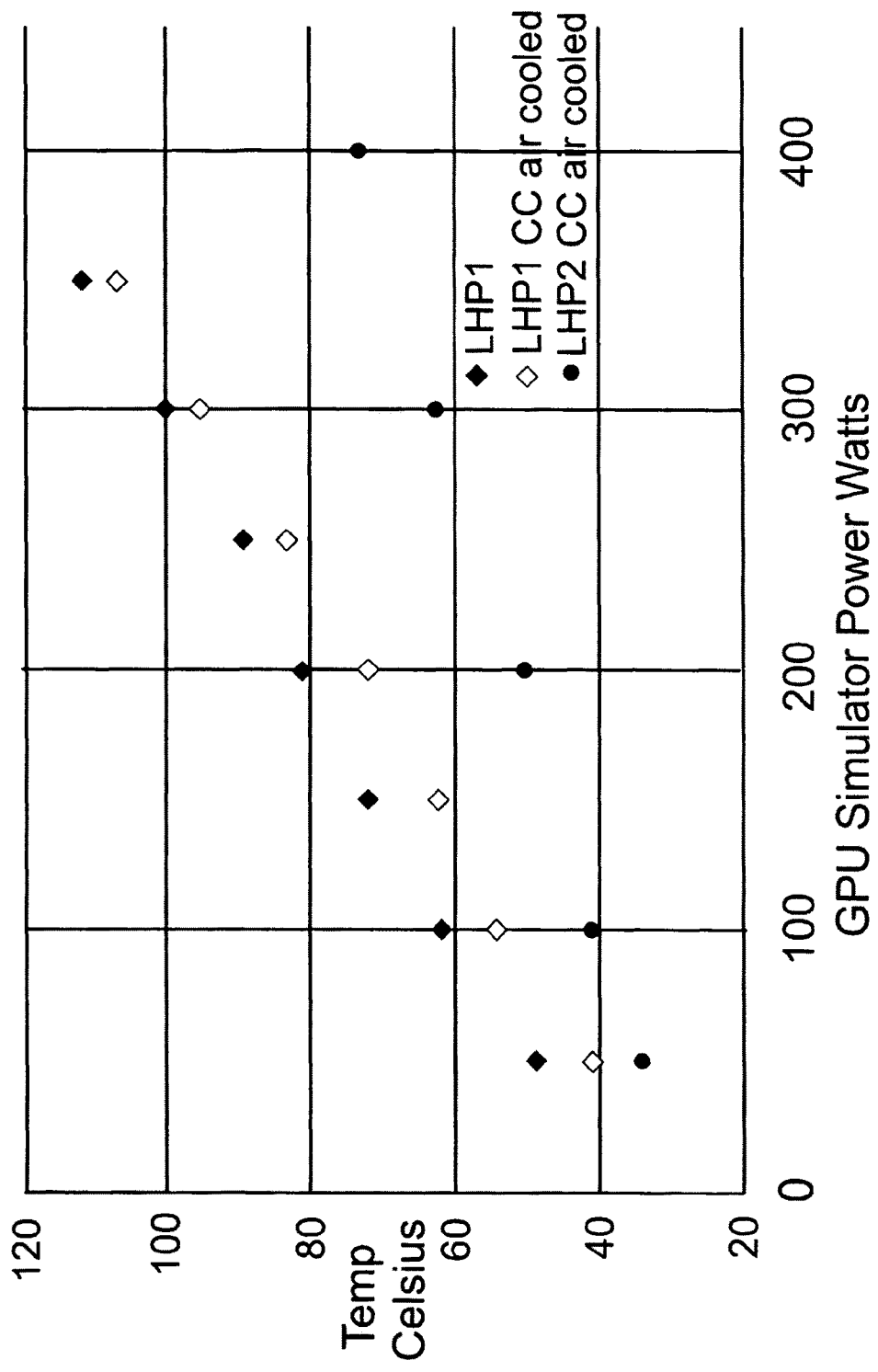
FIG. 52 is a plot of a CPU simulator temperature vs. power in Watts, which demonstrates the value of CC cooling.

The use of LHPLs to cool GPUs located on PCIe cards along with their use to cool other types of add in cards found in COTS (commodity off the shelf) computers including computer motherboards was already disclosed. We added new figures that demonstrate how this cooling can be employed in a typical air cooled desktop PC tower chassis that can also be laid on its side and employed as a desktop or workstation chassis. The embodiment here described is not limited to either PCs or to a particular type of add in card, nor to the geometry. It could also be used to cool any hot semiconductor mounted inside of an enclosure employing an air cooled condenser that is mounted to a cooling fan situated on the exterior surface or for that matter within an enclosure if cooling efficiency is not an issue, but heat transfer performance is. FIG. 36 shows an LHPL cooled PCIe card with a hot component on it that is cooled by the 120 mm fan that is normally mounted on the rear wall of a tower to exhaust heated ambient air from the tower. This same device could have also been used to cool one of more CPUs mounted on a motherboard using fans mounted on the rear wall or the enclosure's top. In this LHPL cooling scenario the fan does double duty, simultaneously removing ambient air and cooling the LHPL condenser. This approach reduces ambient air temperatures within the enclosure while simultaneously reducing the speed of the exhaust fan employed to remove hot air from the enclosure, reducing the number of fans needed and at the same time reducing the flow rate required to evacuate ambient air from the enclosure, thereby reducing fan cost and power consumption. For this technology to be commercially viable it needs to operate correctly in all orientations. FIG. 38 is a performance diagram that shows the performance curves for the PCIe cooler shown in FIG. 37 as the orientation changes. FIG. 52 demonstrates the benefits of adding a CC cooler to a GPU cooler and also demonstrates the importance of tuning the design parameters to achieve the best performance. In the case of a PCIe card, FIGS. 7 and 8 provide a few of how the LHPL mounts to the component on the card being cooled. FIG. 10 shows a pair of cooling fins originally designed for use to cool a PCIe card using a 120 mm fan, with the arrow indicating that the air being pulled along the fins, not through them. This fin pair was originally designed to have the air pulled through, not along the fins. The devices in FIG. 37 only show one of the two sets of fins, the other attaching to the first set of fins and clamping the tubing tightly between the pair. When used with an air cooled rack mounted chassis (FIGS. 1.4 and 46), including ones where there is not a large amount of room above CPUs or GPUs mounted on a PCB for cooling fins, the same noise, energy consumption and cooling performance benefits described in this paragraph for a typical computer enclosure end up applying.

Our use of the term LHPL includes LHPs, CPLs and ALHPs: devices which employ a pump in the condenser line that heretofore was intended to extend the distance between an evaporator and its condenser. In this disclosure we add another use for pumps in LHPLs, and that is to reduce the operating temperature of the evaporator by reducing the vapor pressure in the evaporator and vapor line. While a miniature LHP has been developed that can reject almost 1,000 Watts per cm squared, one of the problems with this device is that it reaches this transfer rate at an evaporator temperature of 120.degree.C. In the case of a very high performance multi-core semiconductor device, lowering this temperature by adding a vacuum pump in the vapor line that reduced the vapor pressure at the exit point of the wick evaporator produces a hybrid cooling solution that provides both high levels of heat rejection while at the same time preserving some of the passive benefits of LHPL technology. Such an ALHP is actually a hybrid cooling cycle half way between a refrigerator and a Loop Heat Pipe.

Another problem that this disclosure provides a solution for is the use of a single evaporator design employed to cool LHPLs whose condensers and evaporators are separated by different distances. The volume of the lines used to connect components together impacts things like the size of the CC. For a single evaporator to work with designs whose distances vary, balancing line length using either a serpentine shaped liquid return line or by placing a volume in the liquid return line (which converts an LHP into a CPL complicating start up issues) provides a solution that enables the same evaporator to be used in different locations.

To improve the overall thermal resistance of an enclosure cooling solution the crucial issue for us became the design and location of LHPL condensers. Ultimately, it is the transitions that the rejected heat has to make as it passes across the metal barriers separating the working fluids that make the largest contributions to thermal resistance. Improvements to the condensation channel design include reducing the thermal resistance between the condensation channel itself and the devices used to cool the channel and carry off the heat as well as the location of the condenser. In the case of both air and liquid cooled condensers, placing the condensation channel between a pair of cooling devices, including either a pair of fins or a pair of liquid cooled cold plates, results in the best channel performance by minimizing the distance that the heat has to flow through metal to reach the external coolant.

In the case of a serpentine shaped tubular condensation channel, that means placing the tube at the center of the fins. One of the problems with these designs in particular is the intensity of the heat being rejected by the condensation channel, which can be significantly greater in a two phase device than in single phase heat transfer devices. To help distribute this intense heat in the case of an air cooled condenser the solution includes increasing the amount of metal at the base of a fin set. The designs already presented include finned Aluminum condensers where the metal that made contact with the condenser tubing was beefed up and made to wrap around the tubing. A similar design was added to this disclosure in which inexpensive commodity copper CPU heat sinks had channels machined into their base areas making it possible to surround the condensation channel with the base plates of these condensers. In situations where the pressure loss of a serpentine tubular shaped condensation channel presents a problem, a tubular condenser that employs a manifold to distribute and collect the working fluid can be employed to drive a set of fins.

This disclosure includes planar condensation channels that are both air and liquid cooled and which are also placed at the center of the condenser, making it possible to maximize the heat being extracted from the channel. Studies made of these channels at the authors laboratory show that the liquid condenses out along the edges of the channel. To minimize the pressure loss of the channel which helps reduce thermal resistance by reducing vapor pressure losses between the evaporator and the point in the condensation channel where liquid condensate appears, the channel must be kept clear of obstacles. In the ideal case, the heat flows out through both the top and bottom of the channel to either a set of air cooled fins or a flowing liquid on both sides, whose thermal conductivity has been increased, as the low liquid flow rate needs some form of turbulator to bring it into full contact with the condensation channel walls. In situations where the geometry requires that the condensation channel inlet and outlet are on the same side of the channel, the length of the condensation channel can be increased by simply inserting a barrier down the middle that produces a U shaped channel which enables the condensation channel to have its inlet and outlet on the same side.

The original disclosure included a liquid cooled serpentine condenser channel whose performance was enhanced using the techniques mentioned in the prior paragraph that also eliminated heat conducting thermal shorts between the external coolant inlet and outlet and which also employed a counter-flow geometry to maximize the temperature of the external coolant at the condenser outlet, thereby continuing the reduction in thermal resistance. To further improve the performance of this device, a turbulator made of a helical wire was wound around the serpentine shaped condensation channel before it was enclosed in a liquid cooling jacket. Where possible, these methods should be applied to all liquid cooled condensers and most of them were incorporated in the two new designs. One of the problems with serpentine shaped condensation channels is that they take up a lot of space. In this disclosure the two new compact liquid cooled condensers combine the properties of both the serpentine shaped condensers already disclosed with the properties of the planar air cooled condensers. The first design employs a cylindrical condensation channel while the second employs a planar channel. On both the inside and outside walls of the cylindrical design we provide another pair of cylindrical channels that carry the external liquid coolant. A similar strategy is employed in the planar design to cool the central condensation channel. We added turbulators to the liquid cooling channels of both designs.

An air cooled planar condenser in which both the top and bottom of the condensation channel was simultaneously cooled by a set of fins was employed to cool a pair of CPUs that were each cooled by LHP evaporators that shared the single high performance miniature condenser. Two types of condenser channels were tested: U shape channels in which the working fluid enters and leaves on the same side, and a design in which the flow passes in a straight line. Prior art for the use of a similar planar condenser that only cooled a single side of a condensation channel was found: the performance of this device when compared with our devices would have been limited by both the evaporator and condensation channel design. However a further reading of that patent reveals that what is actually claimed is not any form of LHPL, but rather an ordinary heat pipe that employs a wick filled liquid return line first patented in 1969 (U.S. Pat. No. 3,543,839). This device is missing the secret ingredient of both LHP's and CPL's, which is an evaporator that produces a high speed vapor flow capable of carrying the working fluid about the loop with a minimal loss in pressure. As a consequence, the vapor flow velocity in the condenser is low, making it possible to insert a turbulator into the working fluid to improve heat transfer, something not needed in either an LHP or CPL condensation channel, but which is useful in the external coolant channel when the external coolant is a liquid. Our condenser design provides the exceptional performance required to justify its manufacture for products which need to reject large amounts of heat in small spaces and it includes the use of CC cooling to improve performance accomplished with a carbon strip to remove heat from the CC and conduct it to the body of the air cooled blower.

The lowest thermal resistance electronic enclosure cooling device yet discovered employed liquid cooled LHPs in conjunction with secondary cooling devices that rejected the heat that they collected to the same external liquid coolant. This disclosure provides an exemplary embodiment that elucidates features discussed or pictured in our initial specification which employs flat planar condensers disclosed in the U.S. Provisional Application 60/923,588 filed Apr. 16, 2007 that serve the same function of the liquid cooled serpentine condensers used in FIGS. 27 through 30 and which provide a more compact method of attaching external cooling lines to liquid cooled condensers. This embodiment also uses a vertical ascending plenum seen in FIGS. 11 through 13 that provides coolant a stack of chassis using spring loaded doors to isolate the plenum from the air within the rack cabinet when the chassis are removed. In this instance, a similar plenum with spring entry slots that close when a node is removed is used to provide protection from spilled liquid coolant. In addition, this chassis has been broken into two sections, one of which holds the server electronics with the second sitting behind it that is sealed to prevent either LHPL condensers or the pipes which feed them from becoming a hazard. This design can be implemented and is drawn with a separation between the two halves providing an internal plenum that makes it possible to build a hybrid chassis in which air is removed to cool a portion of the components while a liquid is used to cool the primary thermal loads. To further enhance the design with a feature we discussed in the first disclosure, we have included a cold plate beneath the motherboard that has vertical risers that can be used to cool particular components such as DIMM modules. Finally, to control the temperature of the coolant leaving the enclosure that is being passed back to an outside device such as a cooling tower exchanging heat with the outside air, we have included an embedded control that can change external coolant flow rates to guarantee that the rejected heat is hot enough to guarantee it can be rejected without the use of energy wasting devices such as water chillers. This control can also be used to fine tune the performance of the LHPL during turn on, shut down and when running at low power by changing the temperature distribution in the LHPL to guarantee. This task is accomplished using a microcontroller that is part of an embedded computer system that simultaneously monitors the temperatures of the devices being cooled and the outlet temperature of the external coolant while at the same time controlling a circuit which controls a valve that is used to adjust the external coolant flow rate through the LHPL condenser. This device can also be used to manage velocity of air cooled LHPL condensers and can be used to solve start up issues in advanced LHPLs related to the movement of working fluid away from the evaporator. It can accomplish these tasks by either cooling the evaporator and its CC or by heating up some other portion of the cooling circuit, forcing working fluid to flow back into the evaporator.

Another issue that needs to be taken into consideration is how do we manage two different liquid coolant streams that get combined at some point into a single external coolant stream. There are several possible approaches. In many systems, the primary heat load is 60% of the total IT load while the secondary is 40% Eliminating the fans typically needed, changes this to a 70%/30% ratio. In the situation that we investigated in which we cooled a pair of 100 Watt primary loads, given a source of 30.degree.C external liquid coolant, we had no problem meeting the return temperature of 35.degree.C required by a cooling tower in Atlanta Ga. running at the hottest day of the year. In fact, we could return coolant whose temperature was 45.degree.C. This delta T was three times the required amount and provides the headroom required to use the liquid coolant we have preheated cooling secondary components to then reject the heat being released by the LHPL condensers. Alternatively, we could have mixed the two heated liquid coolant streams together, and by reducing the flow rate to the LHPL condenser increased the delta T produced by it, making it possible to increase the mixed outlet temperature to the desired 35 degree.C level.

Figure 48:
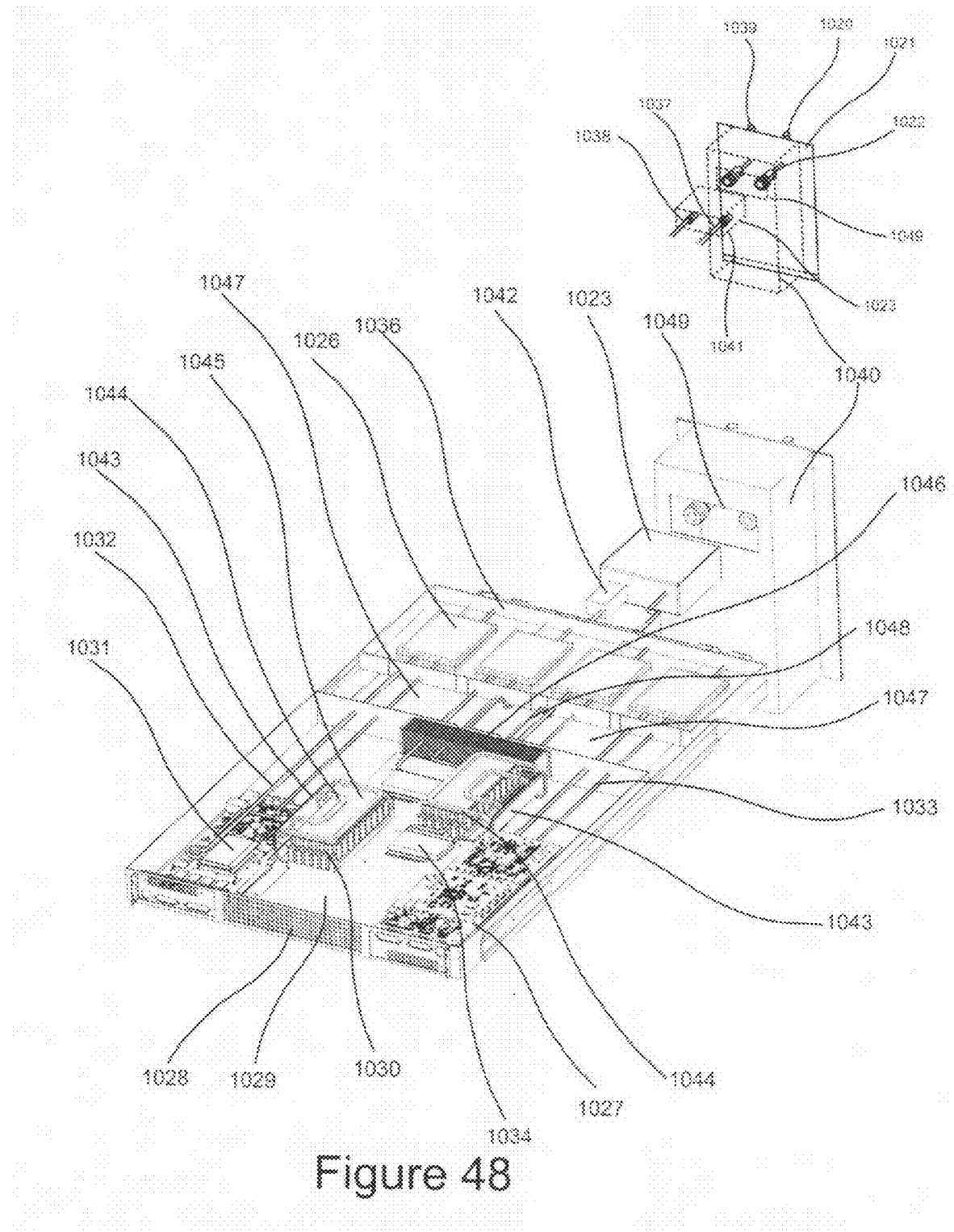
FIG. 48 is a 1U chassis that contains two CPUs and two GPUs cooled by four liquid cooled LHPLs that receives external coolant using a pair of quick disconnects in a splatter guard.
Figure 49:
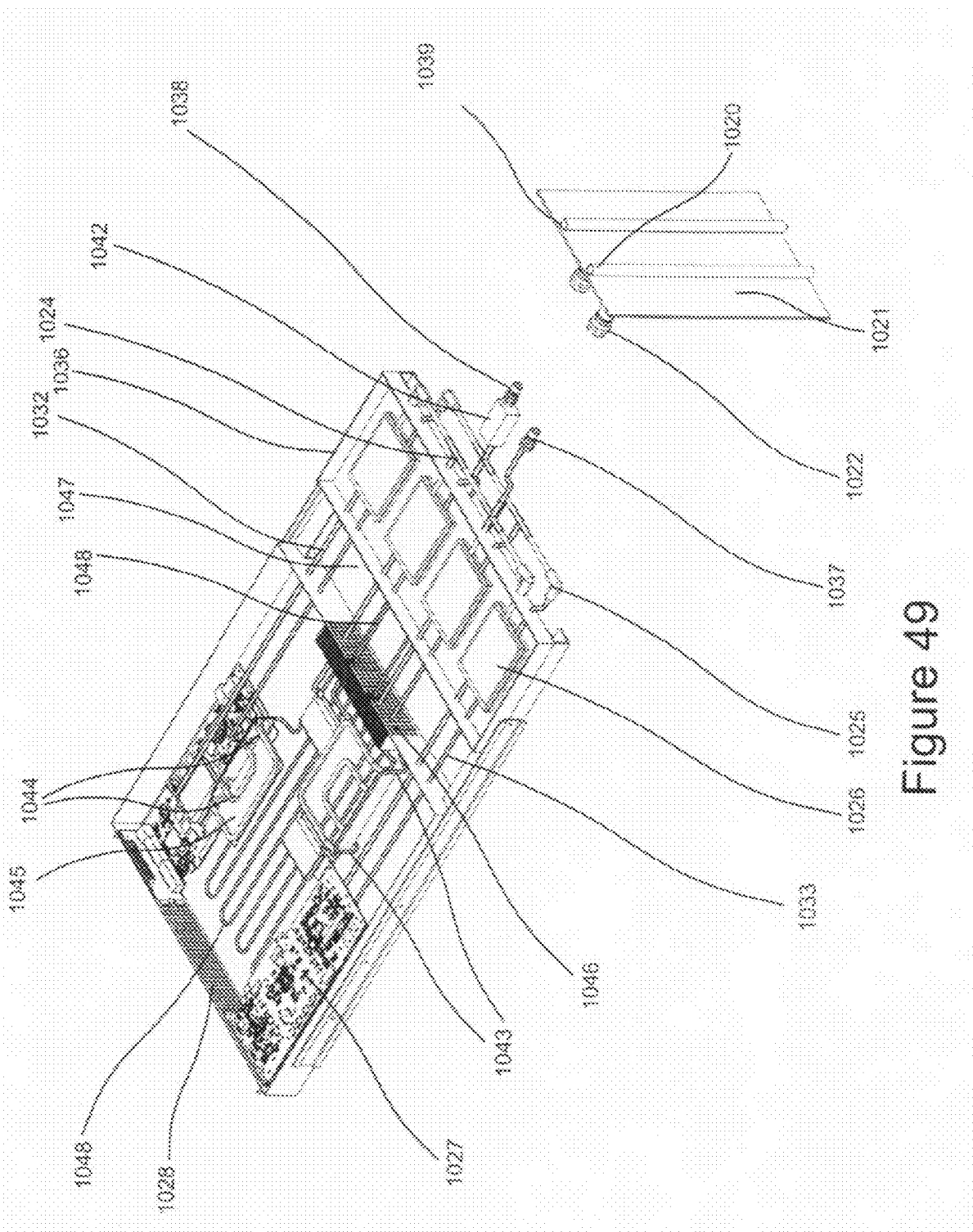
FIG. 49 is another view of the chassis in FIG. 48 showing details of the cold plate used to cool the motherboard and DIMM modules.

The liquid cooled 1U chassis embodiment shown in FIGS. 48 and 49 help to clarify the idea of using cold plates to cool large surface area devices such as printed circuit boards (PCBs) which in turn remove secondary heat from the chassis. PCBs do much more today than simply provide electrical connections to the components that are attached to them. In situations where semiconductors radiate several Watts, the heat can be easily rejected by employing extra connections between the device's numerous power and ground connections to the internal copper planes within the PCB. These connections are made using vias. Many of the current MOSFETs used in DC/DC converters are designed to reject their heat primarily to the PCBs they sit on. Placing a PCB in contact with a cold plate makes it possible to turn the numerous copper planes within it into a global heat exchanger that not only cools the components soldered to it but can help cool the air flowing over it. This last form of heat transfer can be enhanced by simply thermally attaching finned heat exchangers to the PCB. We have discovered that such an approach not only is effective in improving the performance of devices like MOSFETs, but also makes it possible to help cool the air being circulated within an enclosed partially sealed chassis.

Figure 37:
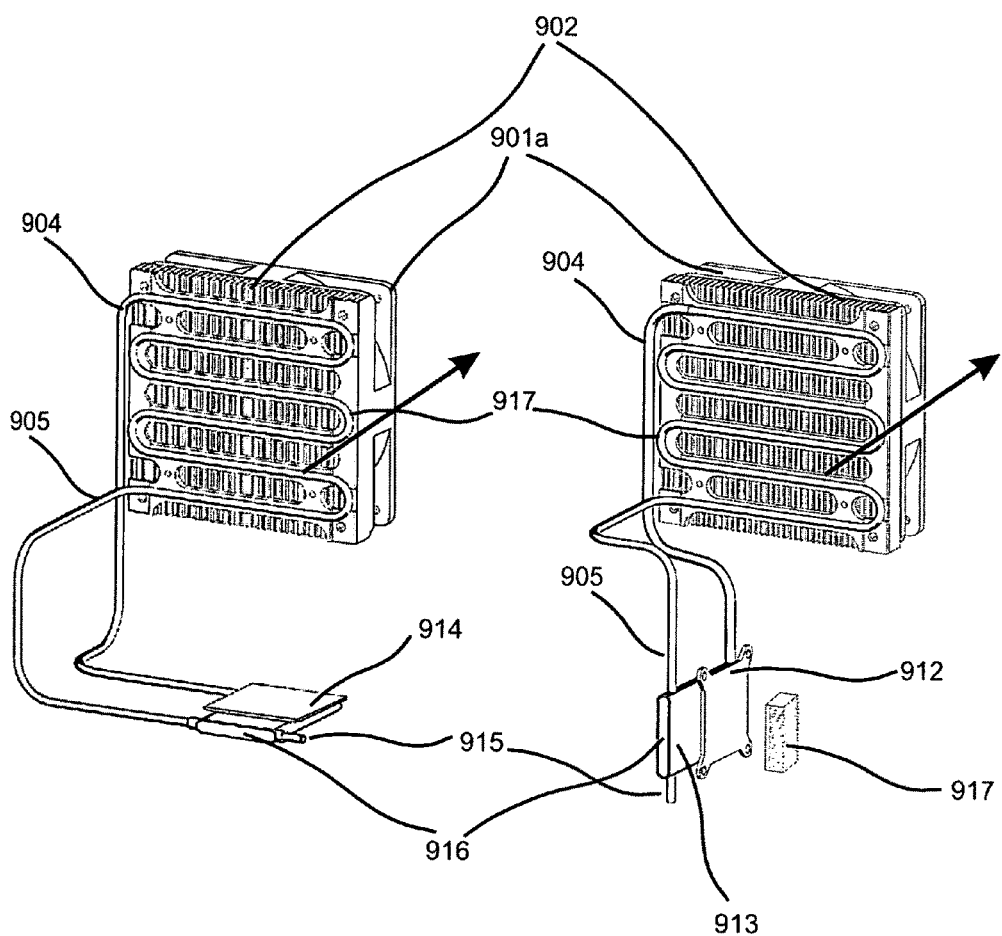
FIG. 37 is a two LHPL coolers designed to cool components on PCIe cards.

FIG. 36 is a 3D exemplary embodiment of a computer tower chassis that can alternatively be laid on its side, in which case it functions as either a desktop personal computer or workstation. This embodiment includes a PCIe GPU card 906 plugged into the computer's "IO channel" whose rear chassis outlet holes 911 can be seen at the left hand side of the chassis in the rendering. The PCIe card 906 contains at least one component (not seen in the drawing) that rejects enough heat to warrant it be cooled using an LHPL device. In this example the LHPL employed uses a flat evaporator (that also cannot be seen in this rendering but is shown in FIG. 37) that attaches to the PCIe device being cooled. The LHPL vapor line 904 and liquid return line 905 can be seen as well as the condenser fin pair 902 that are bolted to a 120 mm chassis exhaust fan 901a, that is mounted on the enclosure's rear wall. The fin pair 902 may be identical to those seen in FIG. 10, with the exception that the air is drawn through the fins as opposed to the flow direction in FIG. 10, which is along the fins. Two more internal fans 901 that extract air out of the hard disk enclosure 908 as well as the peripheral enclosure 909 can be seen along with the motherboard's CPUs 900 and DIMM modules 907. The power supply can not be seen, but it does sit directly behind where 911 points out ventilation holes and the four AC power plugs on the rear wall employed by it, which suggest that this particular enclosure was designed to contain devices whose total power rejection approached one KW.

FIG. 37 is a 3D rendering of an exemplary embodiment of a pair of different low pressure flat oblong LHP evaporators. The arrows depict the direction of the air flow (perpendicular to the plane of the fins). These devices are examples of low pressure LHPs that employ flat oblong evaporators used with working fluids whose vapor pressure vs temperature curves require that they be run at sub-atmospheric pressures. The choice of the metal used for the evaporators, tubing and condenser that come in contact with the working fluid is determined by the long term chemical compatibility of the metal with the working fluid. In this exemplary embodiment the working fluid could be water or one of several organic compounds. The fins in this rendering are identical to the ones seen in FIGS. 10 and 36, with only the rear half of the fin 902 that attaches to the face of a 120 mm fan 901a being shown. The serpentine shaped condenser line 917 is an exemplary embodiment and not the only choice that works well with this set of fins. FIGS. 7 and 8 are exemplary embodiments of a PCIe card being cooled by a condenser that employs a parallel manifold to distribute working fluid vapor between the vapor and liquid return lines. This approach, while more expensive to manufacture, can reduce pressure loss across the condenser that in turn reduces the total thermal resistance of the LHPL. The vapor 904 and liquid return lines 905 can easily be seen as well as the evaporator body whose end cap 916 is called out. The evaporator on the right has a CPU or GPU clamping plate 912 shown whose purpose is to bring the opposite side of the evaporator into pressure contact with the device being cooled. This clamping plate is exemplary and different than the clamp employed in FIG. 24 to clamp a flat oblong evaporator. The evaporator on the left hand side has a CPU heat spreader 914 and both evaporator's have their working fluid filling tube 915 called out. The orientations of these devices are obviously different, but both were intended to cool devices that sat on PCIe cards using fans mounted to the rear wall of an enclosure. We have included an image of an exemplary CC cooling device, an air cooled finned heat exchanger 917 that can be attached to the CC of either evaporator using a thermal interface compound. The pointer 913 has been used to call out the evaporator shell of the right hand LHP that sits directly above that LHPL's compensation chamber (CC), which is where the fins 917 would be attached to cool the CC.

FIG. 38 is the performance curve for the LHP seen on the right hand side of FIG. 37. Its design point was for a device that could reject 300 Watts that needed to operate at or below 85 C. Note the peculiar start up characteristics of the device when it is either laying on its side or upside down, with the worse start up being sideways with a large portion of the condenser tubing being below the level of the evaporator. Also note that even though the start up performance is peculiar in two orientations in that the temperature quickly rises and then falls off before rising again, the device being cooled still remains below its peak operating temperature throughout the possible orientations. This is quite different from the orientation dependent performance of an ordinary heat pipe we tested that rejected 320 Watts right side up that could only reject 70 Watts when turned upside down.

Figure 39:
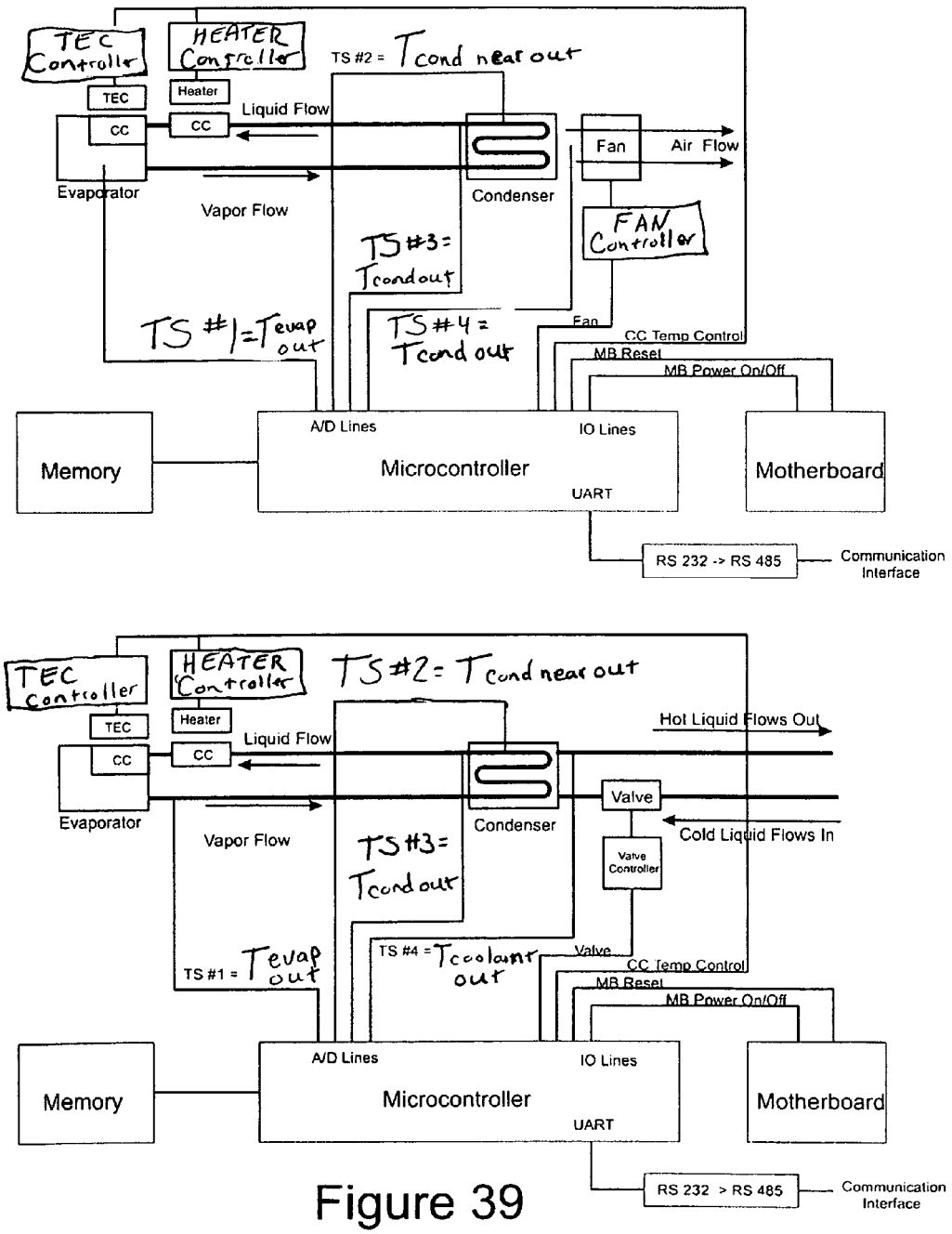
FIG. 39 is a schematic overview of an LHPL microcontroller.

FIG. 39 is an exemplary embodiment of a pair of control circuits that employ microcontrollers to monitor and control LHPL devices that are simultaneously in communication with software that monitors and controls a server. These were first disclosed in US Provisional Application 61/327,659. The circuits employed are similar to IMPI, a standard for remotely monitoring and controlling servers, which often comes built into servers. Unlike most cooling circuits, where the goal is to keep up with a heat load, by controlling the speed of cooling devices such as fans as the heat load increases, our goal here is to maximize the overall energy efficiency of an LHPL cooling solution by actually reducing the cooling in such a manner that the exhaust temperature leaving an LHPL cooled enclosure is maximized, while at the same time keeping the device being cooled operating below its maximum temperature. This is accomplished by continuously reducing the cooling until the device being cooled approaches the desired upper operating temperature. The net effect of this optimization is to increase coolant exhaust temperatures while reducing the power required to cool, and at the same time improving the efficiency of any downstream devices used to cool the external coolant(s). The net effect is a reduction of the overall thermal resistance of the LHPL cooling device.

Two cases are considered here, one in which the condenser is air cooled (on the top of FIG. 39) and the other in which the condenser is liquid cooled. In the case of the liquid cooled LHPL, the goal is to hit or exceed the temperature being requested by the device which exchanges the rejected heat flow carried by the by the external coolant which will be exchanged with a heat sink that ultimately deposits the heat load to the local environment. Since the most common local heat sink is outside air, our goal in this exercise is to produce external coolant hot enough to efficiently employ cooling towers (cooling towers can run with smaller delta T's than their design point, but such operation increases the power rejected by their fans) on hot days. Cooling towers that heat outside air are more likely to be used in this service than heat exchangers being cooled by a body of water.

To operate on very hot days, cooling towers vendors specify for a particular outside air temperature what temperature the external coolant they are cooling needs to hit. For example, on the hottest day of the year in Atlanta Ga. a cooling tower vendor specified that it could chill the liquid leaving the tower to 30 C if the external coolant it was tasked to cool arrived at its inlet at 35 C. This 5C "delta T" is typical of heat transfer devices that do not consume excessive amounts of energy to operate their cooling fans. The power required to move an external coolant to and from a cooling tower and run its cooling fan is a small percentage of the power required to run a water chiller. In the case of an air cooled LHPL, the object becomes simply to maximize the temperature of the coolant leaving the LHPL while at the same time providing enough cooling to guarantee that the device being cooled does not exceed its maximum temperature.

In both cases, the external coolant exit flow temperature is raised by reducing the flow rate of the external coolant. The temperature of the device being cooled is typically monitored by a diode inside of it, in the case of a CPU or GPU being cooled by an LHPL, this temperature can be obtained from programs that run on these devices. However not all semiconductors have such devices embedded within them. The two exemplary circuits provide two different methods for obtaining die temperatures. In both circuits a temperature sensor whose net labeled TS #1 produces a variable used by the microcontroller called $T_{evaporator\_out}$. The temperature sensor is an exemplary device that can be implemented using different devices including thermocouples and thermisters is mounted either in or on the side of the thin heat spreader that conducts heat between the device being cooled and the LHPL evaporator. In the upper circuit used to cool an air cooled LHPL, a temperature sensor whose net is also called out as TS #1=$T_{evaporator\_out}$ is attached to the vapor line several centimeters from the point where the vapor line leaves the evaporator. The temperature measured by TS#3=$T_{Cond-out}$ at the start of the liquid return line will typically be half way between the temperature of the device being cooled and the outlet temperature of the external coolant leaving the condenser. For every LHPL, this difference in temperature can be used to produce a look up table which will provide a measure of the total power being rejected by the LHPL which along with the temperature of the evaporator can be used to compute the die temperature by essentially adding to the evaporator temperature the temperature lost in the heat spreader which can be computed by multiplying the measured thermal resistance between the heat spreader and the die by the current heat flow being rejected.

Both circuits employ an exemplary microcontroller that in its operation is very similar to the standard IPMI devices that are now used to monitor and control motherboards. The method that the microcontroller uses to communicate with the outside world is also exemplary, in this case taking the output of a UART and employing an RS-232 to RS-485 converter to drive an RS-485 signal pair (shown as a single line, as are all the other circuit pairs in these schematic overviews). Often, the embedded CPU employs a GigE interface (instead of RS-485) and usually carries out a number of tasks, not shown, such as monitoring voltages, reading and controlling other cooling fans as well as monitoring reset and on/off switches and generating these signals remotely. In this case the 8051 embedded CPU contains the interfaces needed to both read A/D lines (i.e. temperature sensors and voltages) as well as the I/O control lines needed to read and control pumps, fans, tach lines, limit switches and other devices.

In addition to maximizing external coolant temperature this exemplary control circuit can provide other beneficial services. After a rapid shutdown, it is possible to put some LHPLs into a dry state in which there is no working fluid in the evaporator, resulting in what is called dry out. By actively controlling the temperatures about the cooling loop during shut down and start up, it becomes possible to fine tune the operational parameters of these devices to eliminate them in solutions that require them. Both circuits show a heater element positioned in the vicinity of a compensation chamber (CC) located in the liquid return line (i.e. for controlling a CPL). The position chosen is exemplary and could have been anywhere about the loop where liquid phase working fluid accumulates when the LHP is cold, including the condenser. A thermoelectric cooler is also shown positioned above the CC located within an evaporator (the case where the device is classified as an LHP) which can be used to draw working fluid to the evaporator during shut down. The TEC cooler can also be used to improve cooling at low power levels by preventing working fluid in the LHP CC from heating up due to shell conduction (see FIG. 52). In addition two or more temperature sensors could be positioned in the condenser to monitor the location of the point where the boundary between working fluid liquid and vapor sits: monitoring this location helps to maximize condenser performance, something that can be aided by changing the external coolant flow rate. In this case temperature sensor TS #2=$T_{Cond\_out}$ is situated at the point where the condenser tube leaves the condenser while TS

3=$T_{Cond\_near\_out}$ is situated at a position on the condenser tube a small distance upstream of TS #2=$T_{Cond\_out}$. At low power settings increased condenser performance can be achieved by reducing the flow rate of the external coolant which will let the working fluid meniscus retreat towards the condenser's exit. As the meniscus within the condensation channel approaches the exit point it pays to increase heat transfer between the working fluid and the external coolant by increasing the amount of cooling which also keeps the meniscus at the exit point of the channel. This type of control is enabled by TS#2 and TS#3. Ideally, one would like the entire condensation channel to participate, as this maximizes the amount of condensation going on within the condenser, and produces the highest external coolant outlet temperature. The circuit also provides control lines for monitoring and controlling the speed of the cooling device, which in the case of a liquid coolant is most likely to be some form of valve that restricts coolant flow while in the case of an air cooled condenser it will be a fan speed control. The two lines which typically are included in IPMI microcontrollers that control motherboard reset and power supply on/off, are also shown. GPUs are a good example of devices that typically run at a single cooling speed and do not employ IPMI control devices.

Figure 40:
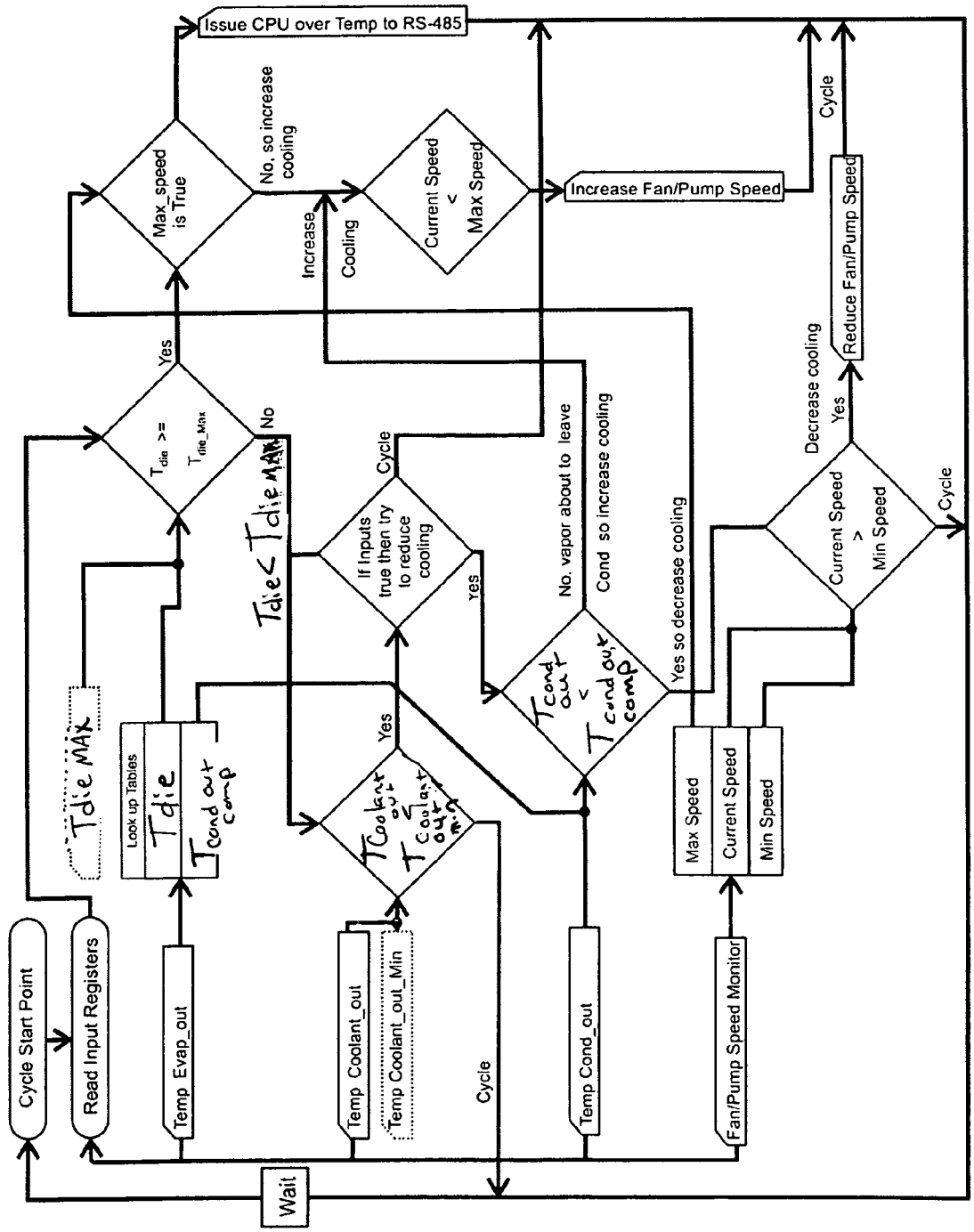
FIG. 40 is a flow chart for a program designed for use with the controller of FIG. 39.

For these monitoring and control objectives to be met software needs to be written that simultaneously monitors working fluid and external coolant temperatures that gets employed as inputs to control cooling fans and pumps as well as initiating CC cooling or heating during shut down and low power operation. FIG. 40 is a flow diagram for a program design to control the circuits described in FIG. 39. The flow diagram takes the form of what software developers call a Do Forever loop: the starting point initiated by the microcontroller after reset goes true and a program which executes the flow diagram has been loaded and jump to starts off at the head of the flow chart which we label Cycle Start Point. Throughout the flow chart, decisions get made which force the program to either continue making decisions and take action or decided to do nothing and return to the starting point. A line about the chart which we label cycle directs non-actions back to the start.

The first action at the head of the loop is to read the input registers, which like the write registers are contained in an I/O block. The I/O blocks that are dotted contain constants that never change value, i.e. global constants used in calculations. The actual values stored for variables like $T_{evaporator\_out}$ do not have to be the last value read in. LHPL devices can experience instabilities that cause their temperatures to oscillate several degrees. The period of these oscillations is typically vary from 30 to 120 or more seconds. Just below the start point on the cycle path we have placed a WAIT statement whose value can be set and whose job is to wait some time before reading the next set of register values. The actual value of things like temperatures that are passed into the program implementing the flow chart does not need to be the current value. A more reasonable value is a running average taken over N cycles that is designed to average out fluctuations. This will avoid the control circuits to spend too much time chasing phantom changes in LHPL operation. Regarding the flow chart itself, in situations where decisions need to be made using several input parameters, we bind them together into a common inlet channel using a sold dot to indicate that all of the I/O parameters or constants enter the decision box through a single location. There is one decision box that might be a little confusing. Within this decision statement is the text, "if inputs true then try to reduce cooling." The input to the top of this box is the "NO" from the last box, which we interpret to mean that $T_{die} < T_{die\_max}$. If this is true, and the result of the box to its left which is where the flow actually went is also true (which compares the external coolant temperature with the desired temperature) we are in a position to attempt to reduce cooling, otherwise we go to cycle and repeat the entire loop.

The first job that the flow chart approaches is the most troublesome case, which would be an LHPL cooling device that was not adequately cooling a CPU or GPU. While we can in some instances simply read the temperature of the device, in situations where we can't, such as a GPU, we need to compute that temperature. There are several exemplary methods that we could take, for example measuring the energy flowing into the external coolant by measuring the flow rate, inlet temperature and outlet temperature. We have instead chosen building a table whose input parameter is the vapor temperature leaving the LHPL evaporator. For any particular LHPL, the power being rejected can be determined from the evaporator temperature (except in the case of an LHPL that is in a peculiar orientation which we discuss below). A pair of look up tables get used to compute $T_{Die}$ as well as a the expected temperature of working fluid entering the liquid return line $T_{Cond\_out}$ and the computed die temperature $T_{Die}$. This last value is the expected temperature of the silicon die we are cooling. It is employed in the first decision box to determine if the die temperature is greater or equal to the maximum die temperature allowed, which normally would be a temperature slightly below the maximum temperature at a point where the lifetime of the semiconductor die is not impacted. If this condition is met, we have a problem and now have to check if we can increase cooling by checking if either the pump (i.e. valve controlling a flow) or the fan being used to cool the LHPL condenser can have its speed increased. If it has reached Max speed we have a problem that can only be resolved by asking the device which controls the speed of the device being cooled, to reduce its speed, by presumably reducing its clock frequency. Max_speed is derived from the input variable Current Speed. It is either computed, or possibly is set by limit switches in the case of a valve being controlled by a servo circuit. In the case where we have hit both limits, we have no choice but to send a message to the machine controlling the server being cooled, to reduce frequency. In most motherboards used today, this actually happens automatically, using built in circuitry that uses a similar scheme. If we have not reached Max Speed, we send a message or a signal to the device controlling our cooling device to increase the flow rate.

If the die temperature was below $T_{Die}$, we are in a position to increase the temperature of the external coolant by reducing the cooling rate. However, before we do that, we need to check to make sure that what is coming out of the condenser is a liquid and not vapor. To do that we again go to a look up table which contains the value of $T_{Cond\_out\_comp}$. As long as the Condenser outlet temperature $T_{Cond\_out}$ is less than $T_{Cond\_out\_comp}$ we still have liquid leaving the working fluid exit of the condenser, and it is safe to increase cooling further. The entire flow chart is exemplary, in any real device, the sensors used to collect information about the operating conditions of the LHPL are likely to be different than those we have chosen. In addition, in situations where the performance curve of the device being cooled is a multi-valued function (has more than two or more temperatures corresponding to different operating points (see FIG. 38, one of the cases hits 70 C at three different temperatures) a more detailed analysis of the total heat load rejected to the external coolant will be needed in conjunction with a measurement of working fluid vapor temperature.

Figure 41:
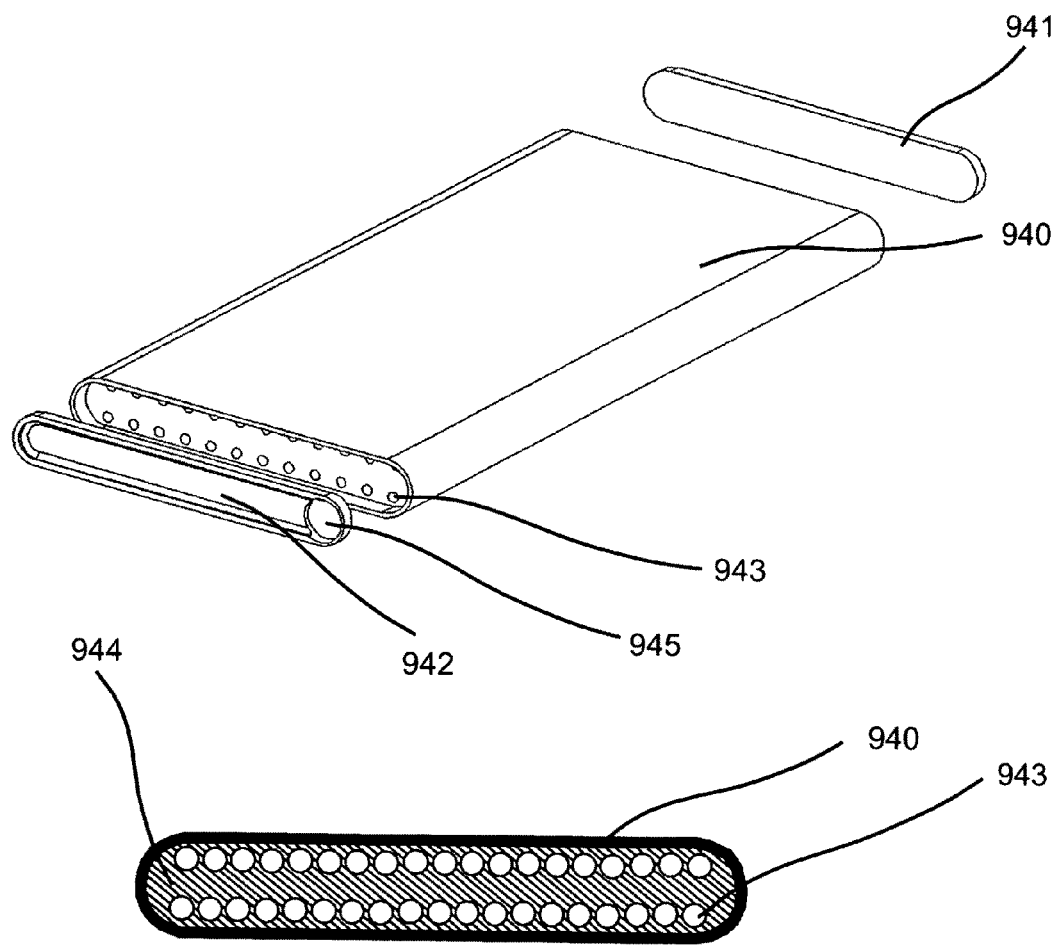
FIG. 41 is an LHP Evaporator with escape channels designed to cool two surfaces Simultaneously.

FIG. 41 contains a 3D exemplary exploded view of an oblong flat evaporator capable of accepting heat on two surfaces at the same time. This design is employed with working fluids that work at low pressure or sub-atmospheric pressures. They typically are made of a metal shell 940 that is chemically compatible (does not react with the working fluid over the lifetime of the LHPL to produce non-condensable gases) with the working fluid and can be sealed using end caps 941 and 942 that are soldered or welded in place or in situations where the shells are very thin simply compressed together then sealed using solder or a welding method. The end cap nearest the point where vapor escapes from the wick 944 through escape channels 943 shows an exemplary hole 945 where the vapor tube is inserted and then soldered to the end cap. The wick fits within the shell and occupies starting a small distance in from the end cap 942 protruding through the cavity before terminating some distance from the end cap 941, which provides a region for returning working fluid to be stored. This region directly behind 941 is the compensation chamber (CC). The wick itself is always made of a porous material that allows the liquid phase to pass through it without generating large pressure losses while at the same time employing small enough gaps between whatever material it is made up of to employ surface tension in the evaporation zone to generate the pressure required to drive the loop. The most common material used today employ small metal particles that have been sintered to form a porous sponge like structure. The unique feature of this particular evaporator is its ability to accept heat from both of its flat surfaces simultaneously. This is facilitated using escape channels located in the evaporation zone of the wick near both of the top and bottom flat surfaces The circular shape of the large escape channels is exemplary. Alternatively large escape channels that had an oblong shape and were oriented so that they spanned both evaporation zones could be employed.

Figure 42:
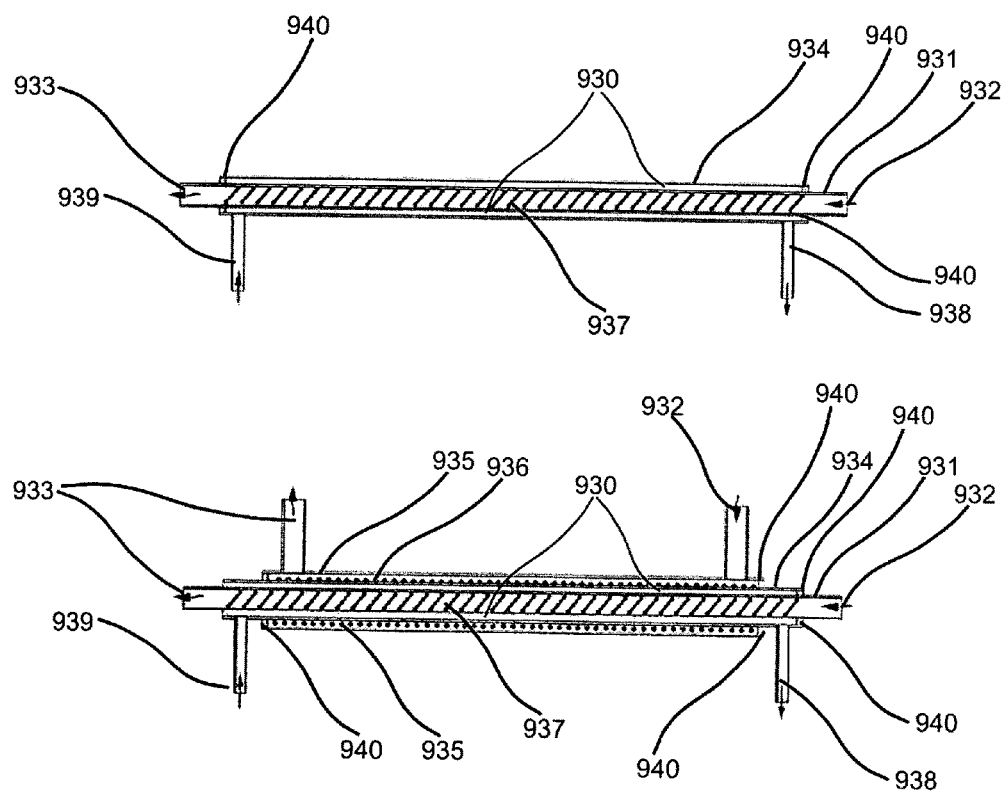
FIG. 42 is a Liquid Cooled LHPL Condenser composed of concentric cylinders.

FIG. 42 is a drawing of two concentric cylindrical liquid cooled LHPL condensers. The upper drawing contains a pair of concentric cylinders. The inner cylinder, 931, is simply a tube that carries the external coolant through it, entering on the right at 932 and leaving on the left at 933. Surrounding the first cylinder is a second, 934, that is sealed at each end to the first using a ring 940 that is soldered to both cylinders and also provides separation. The condenser's condensation channel is defined by the separation between the two cylinders 930. The working fluid enters the condensation channel by a pipe 938 attached to the outer cylinder 934 and exits at the left end through a similar pipe 939. To achieve the lowest thermal resistance and the highest external coolant exit temperature it is necessary to slow up the flow of coolant which reduces its Reynolds number. To improve mixing at low Reynolds numbers of the external coolant as it flows down the inner tube 931, a turbulator 937 has been introduced. An exemplary turbulator is a rod (not shown) with a wire 937 wrapped around it forming a helix, which is the same technique we used to improve the serpentine condenser seen in FIG. 37. The condenser at the bottom of the figure expands on this concept adding a third concentric cylinder 935 that surrounds what was the outer cylinder 934 of the first example. This cylinder is attached to the inner one also using rings 940. It adds a second external coolant entrance 932 and exit 933 as well as a second turbulator 935 that can be implemented by simply wrapping another wire about 934 forming a helix. The remainder of this condenser is identical to the top one. The form factor for this liquid cooled condenser was chosen because it makes it possible to create compact liquid cooled condensers. The form of the condensation channel is not limited to concentric cylinders. An alternative form factor that is compact and provides excellent performance is a thin box shaped condensation channel that is surrounded on both sides with the external coolant. Three devices which use air and fins are about to be described followed by a liquid cooled rectangular condenser in FIG. 50 whose cross section resembles the bottom device in FIG. 42.

Figure 43:
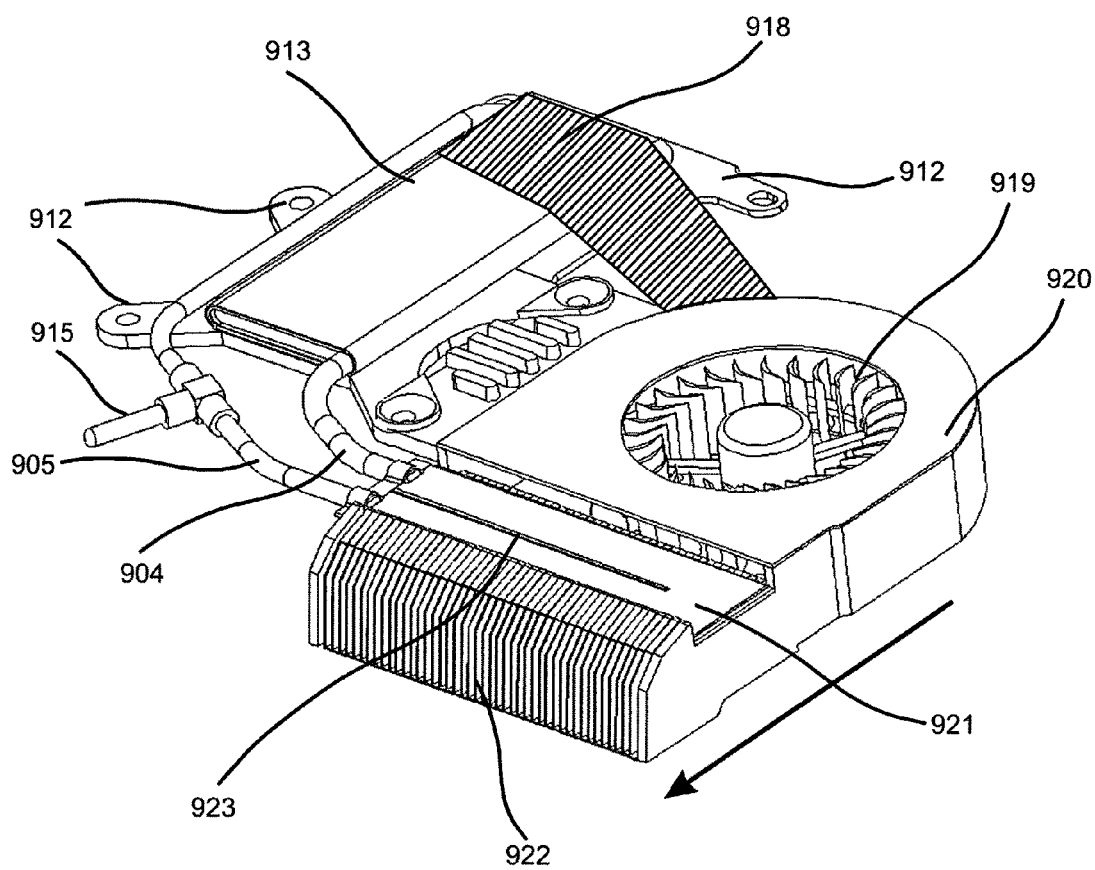
FIG. 43 is a small LHP designed to cool components in laptops.

FIG. 43 is the first of three LHPs that employ air cooled flat rectangular condensation channels. Such channels when liquid cooled, provide the best performance when both sides of the channel are exposed to the external coolant and coolant mixing is enhanced using turbulators. In the case of an air cooled condensation channel the crucial issue is exposing both sides of the channel to the fins which are employed to carry off the heat, which usually means sitting them in the middle of the fins. The two sided slit channel 921 in FIG. 43 is made by taking a pair of thin plates and forming them so the separation between the plates is not large. In this exemplary example a rib 923 that acts to both stiffen the structure and as a baffle that forces the working fluid vapor to follow a U shaped. The U shaped route makes it possible to located both the vapor and liquid return lines on the same side of the condensation channel, which is an important feature of this design. The vapor enters the slit condenser from the vapor line 904 on the left side flows toward the right side and then returns to the left side where it enters the liquid return line 905. The slit condenser 921 has fins 922 placed above (cut out in this picture) and below it. The direction of the air leaving a blower whose shroud 920 and fan 919 can be seen is depicted by the arrow. A saddle 912 for clamping the evaporator 913 to the device being cooled (not seen) has also been called out as well as the working fluid charging tube 915. To improve performance a thermal conducting component has been added 918 that conducts heat from the region of the evaporator where the CC is located. An exemplary example of a good thermal conducting material is a carbon nanofibre mat.

Figure 44:
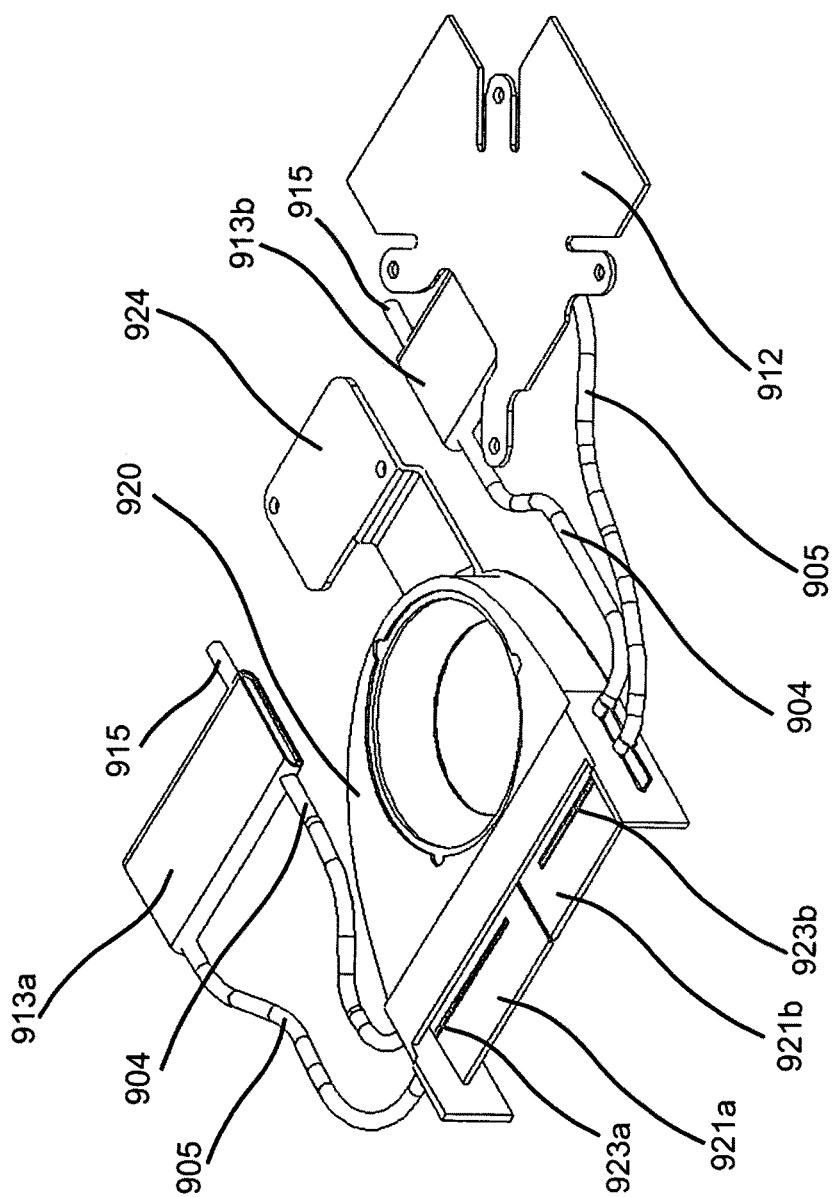
FIG. 44 is a small LHP with parallel evaporators and a single condenser for laptop cooling in which a pair of condensation channels is cooled by a single blower.

FIG. 44 is the first of two LHPs that can cool a pair of semiconductor devices using a single condenser cooled with a centrifugal blower capable of cooling a pair of 60 Watt devices or a 120 Watt device. The left hand LHP employs an evaporator 913a feeding a U channel slit condenser 921a with an internal rib 923a using a vapor tube 904, liquid return line 905, filler tube 915. The common shroud 920 as well as a heat spreader 924 that cools a secondary heat load such as a CPU chipset by conduction. We have omitted from this figure both the fins and the blower compressor wheel. Note the position of the two slit condensers, 921a and 921b, which have been placed in the middle of the air channel leaving the blower, making it possible for both the top and bottom of the slit condensers to be cooled by an appropriately designed set of fins. The internal baffles 923a and 923b are also called out. The right hand saddle 912 is called out but the left hand saddle was removed to get a view of the evaporator on that side.

Figure 45:
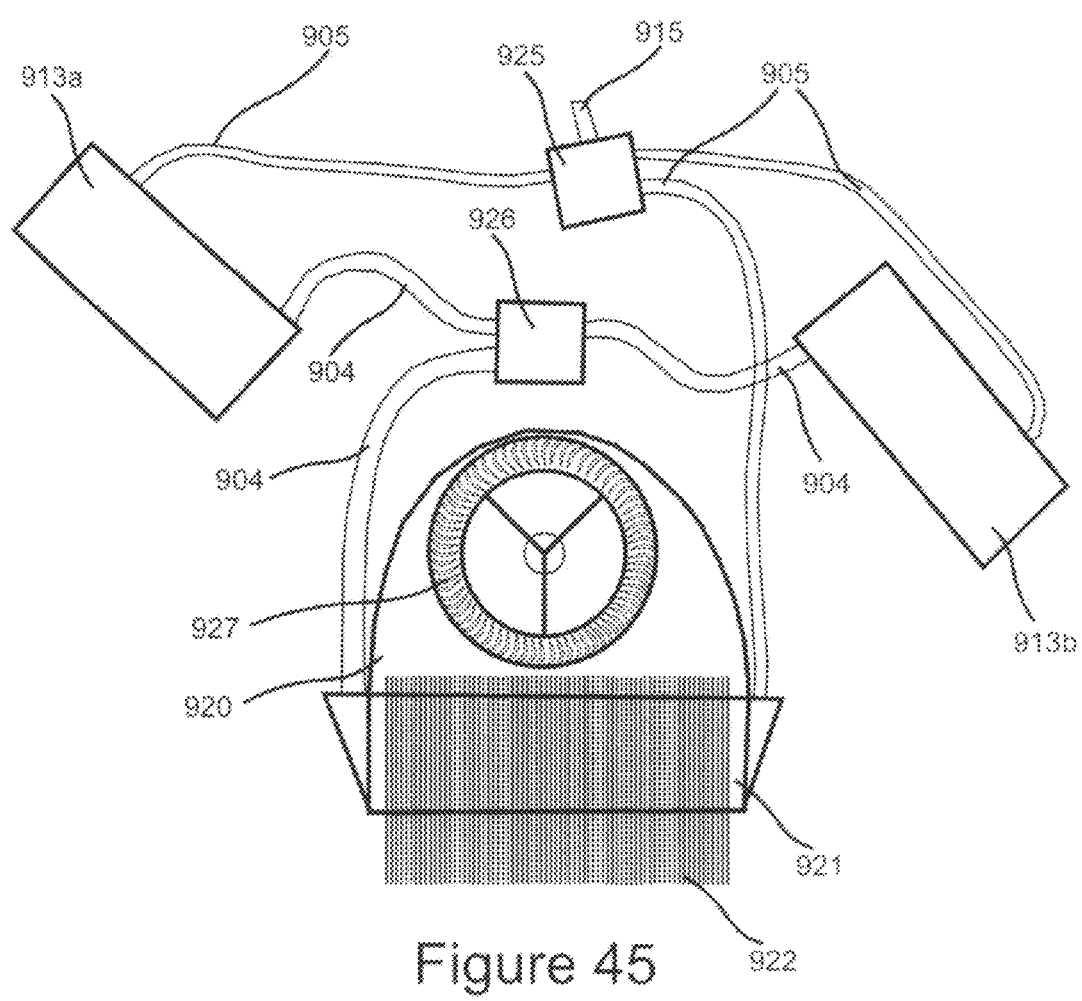
FIG. 45 is a small LHP with parallel evaporators and a single condenser for laptop cooling that uses a single condensation channel and a single blower.

In some situations it becomes desirable to use a single condenser to cool two or more evaporators. For systems in which either of the two device generate full power at one time, but for which it is rare that both run at high power at the same time, the system shown in FIG. 45 is preferred. This system employs a pair of evaporators 913a and 913b feeding a single slit condenser 921 that is cooled by a set of fins 922 that surrounds the condensation channel 921. The blower shroud 920 as well as the blower wheel 927 have been drawn. The remainder of the components use the same numbering as the components in FIGS. 43 and 44. The vapor lines, 904, feed the vapor into a junction box 926 from which it emerges using a third vapor line 904 that connects to the condenser 921. The liquid leaving the condenser follows a liquid return line 905 to a junction box 925 where it is dispatched using another pair of liquid lines 905 to the two evaporators. This particular method of coupling LHP and CPL evaporators to a single condenser has been in use for quite sometime. The unique and important feature added here is the energy efficient condenser which employs a condensation channel that has heat removed from the working fluid using fins that are attached to both sides of the channel.

Figure 46:
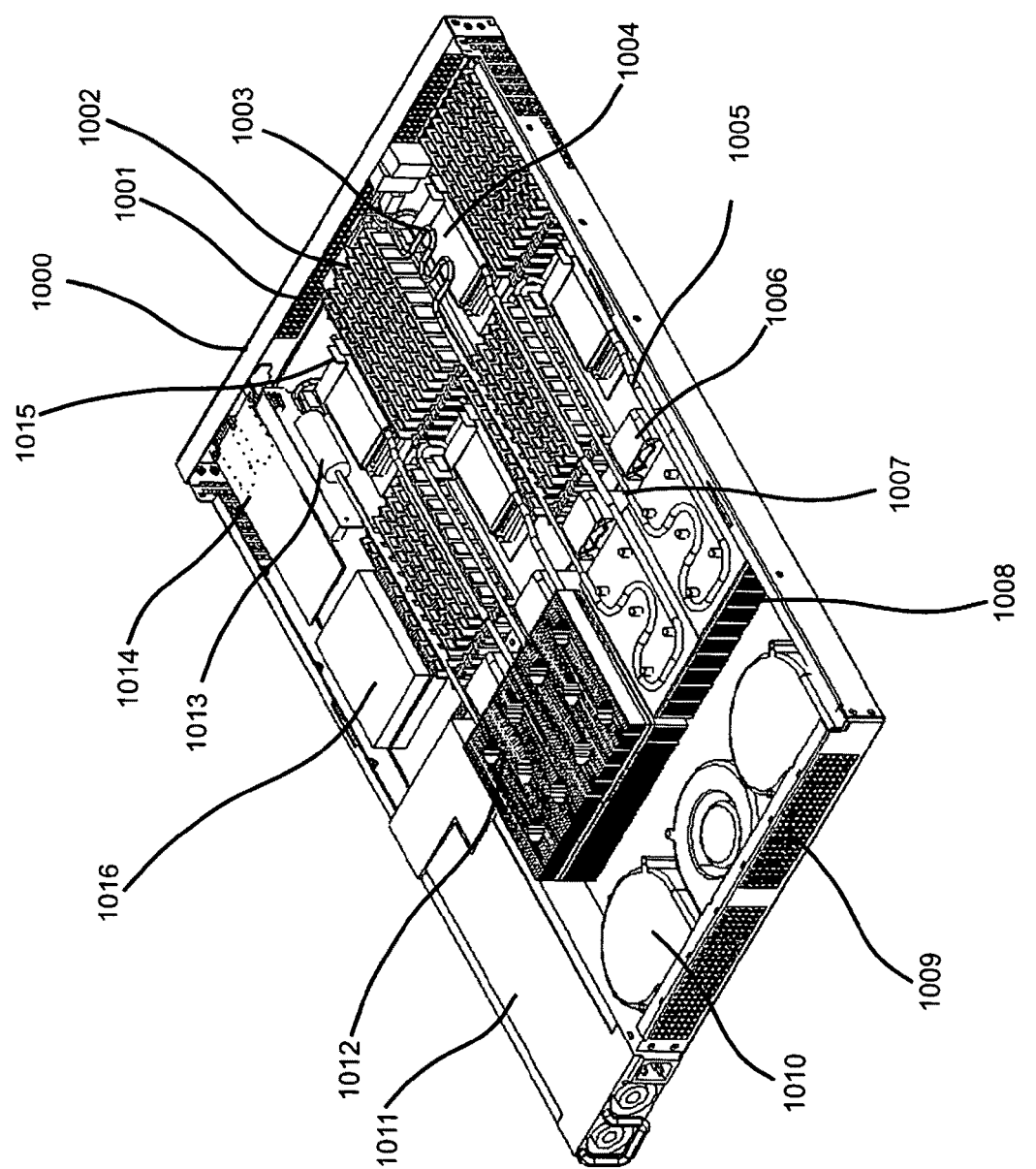
FIG. 46 is a 1U chassis containing four CPUs cooled by four LHPs that employs three blowers to remove air from the chassis and cool the CPUs at the same time.

FIG. 46 is an exemplary 3D view of an air cooled Quad Processor 1U chassis under development that employs four LHPs whose working fluid typically operate between pressures of 0.06 and 0.20 atmospheres and is capable of cooling a 230 Watt CPU to 70 C. This 1U system is essentially a current exemplary embodiment of FIG. 1, whose working fluid, Ammonia, runs at high pressure (20 atmospheres) and is the preferred working fluid used in LHP space vehicle applications. The processors used in this chassis can reject up to 130 Watts each where those tested in FIG. 1 typically rejected 100 Watts. To reject 390 Watts required us to employ three 1U blowers.

The chassis bottom half 1000, has cooling air inlet holes 1001 situated in its front. Items of interest include four sets of DIMM modules one of which 1002 is pointed out. Items 1003 and 1013 are inserted in the liquid return lines and would normally be used to tune the lengths (1003) or add capacity (1013) to the evaporator's CC of the LHPs with the smallest vapor tubes (opposite of what is drawn). Adding an additional CC chamber 1013 technically turns the device from an LHP to a CPL. There are four flat oblong low pressure evaporators 1004 the first of which is called out. 1005 points out one of four LHP vapor lines while 1006 points out one of four optional DIMM module cooling fans, which may or may not be needed, depending on the type and quantity of memory installed in the two motherboards used, neither of which can easily be separated in this drawing, but sit beneath the electronic components being cooled with air that include the DIMM modules, CPUs (which sit beneath the four evaporators) as well as secondary components like MOSFETs. 1007 points to one of the four liquid return lines while 1008 points to one of the four sets of lower condenser fin sets which sit beneath the serpentine vapor lines that are fed by the evaporators. 1012 points out the upper most set of fins which clamp to the lower ones using studs that can easily be seen in the two sets of lower cooling fins. To create this LHPL condenser, we hogged out a channel in a pair of commercial CPU heat exchangers. This provided a tight fitting cylindrical cavity in the heat exchanger's base that provided excellent thermal contact with the entire serpentine shaped condensation channel. The thermal conductivity between the heat exchangers and the serpentine condensation channel can be enhanced by either soldering the heat sinks to the serpentine channel or simply using a thermal compound. We tested using the latter and got excellent performance, which helps when it comes time to replace a CPU, as the top heat exchanger can be easily removed allowing the LHP to lift off, providing access to the CPU. 1009 points out the hot air exhaust ports in the chassis through which the hot air was pushed using three blowers 1010. This is followed by the removable power supply 1011, a pair of hard disks 1016 and a PCIe communication card 1014. The blowers that provide the greatest portion of the cooling of this design consume less than half the power of the typical fans used to cool a similar 1U chassis. The reduction in power is a direct result of the fact that the large fin area reduces the flow rate required to cool the processors the fact that the blowers run at just 6,000 RPM which dramatically improves reliability over fans and the fact that the air used to cool CPUs does not end up heating DIMM modules, which causes a typical 1U chassis to have to further increase its cooling air flow rate.

Figure 47:
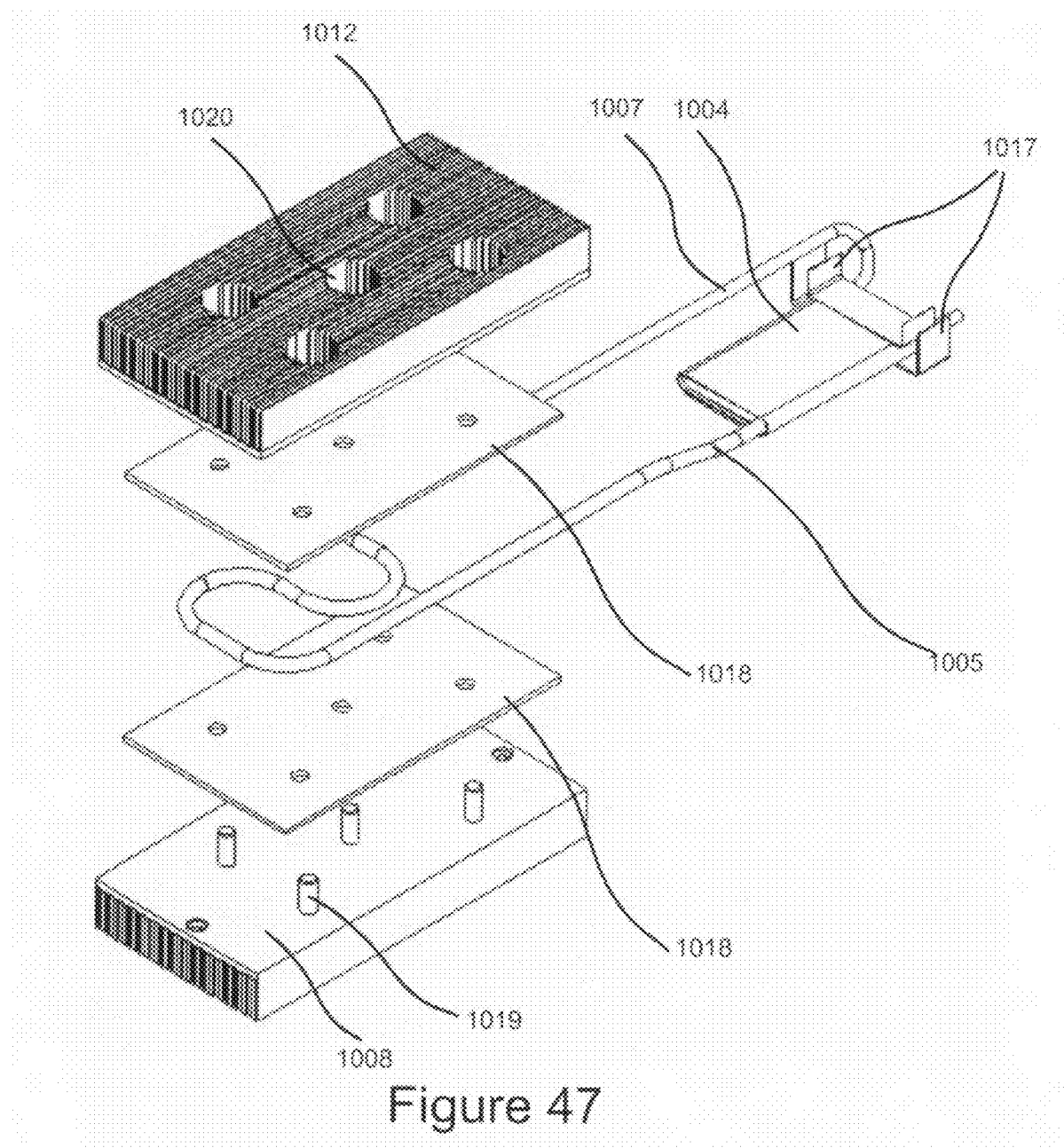
FIG. 47 is a simple air cooled LHPL condenser design that employs a serpentine condensation channel, a pair of heat spreaders and two commodity heat exchangers clamped to the condensation channel.

The condenser in FIG. 46 was made by machining a pair of groves into the base of a pair of standard CPU heat sinks. There are two alternative approaches to employing inexpensive commodity heat sinks to cool LHPL condensers. One is to simply clamp the condenser lines between the bases without doing anything other than adding some thermal interface compound. We used this technique in an earlier design, which used a high pressure working fluid. However with a low pressure working fluid you need to do a better job removing thermal resistance. An alternative to milling operation is to solder (or glue using a thermal heat transfer epoxy) a pair of thin plates to the vapor lines and to then mount either one or two CPU heat sinks to the thin plates using a thermal transfer compound. FIG. 47 is an exploded view of such a condenser. This approach to taking advantage of commodity components reduces cost while at the same time producing a solution that is easy to manufacture and does not interfere with the removal and reinsertion of CPUs that fail. In the exemplary 3D drawing provided we can make out the lower 1008 and upper set 1012 of condenser fins, the heat spreader plates 1018 that are thermally attached to the vapor 1005 and liquid return lines 1007. The evaporator 1004 has a compensation chamber cooling fin 1017 that also has been placed but not called out in FIG. 46. The fins are pressure mounted to the condenser lines and their heat spreaders using a set of studs mounted in the lower set of fins that are fitted with nuts that are inserted in the holes in the top set of fins.

FIG. 48 is an exemplary 3D view of a 1U liquid cooled chassis that houses four processors, two CPUs and two GPUs. A liquid external coolant distribution manifold employs a external coolant inlet line 1039 that distributes an external liquid coolant that is released to the outside world through the pipe 1020. A pair of male quick disconnect components 1037 and 1038 are employed to make connections with the liquid inlet and outlet manifolds using female quick disconnects 1022. A liquid splash guard 1040 and the back plate used to mount the female quick disconnects 1021, surrounds the female quick disconnects and is employed to solve the rare but possible problem of a female quick disconnect failing. A hole 1049 has been inserted into the splash guard which pushes open a door (not seen) that closes when the chassis is removed, completely isolating the female quick disconnects still under pressure from the remainder of the system. The male quick disconnects, 1037 and 1038, are enclosed in a five sided box 1023, that has a thin sponge like material inserted on the box's bottom. Typical quick disconnects can release approximately 0.3 cc of liquid when engaged or released. This small amount of liquid is guaranteed to be picked up by the sponge. Once the box has exited the splatter box, both sources of leakage will be eliminated. The piping used to distribute the external coolant to the condensers can be seen, 1024 distributes the cold coolant to the condensers while 1025 distributes the returning hot coolant to a quick disconnect for disposal.

To further isolate any liquid cooling hazard from the enclosures electronic components, the LHPL liquid cooled condensers (see FIG. 50) 1026 are housed in a separate water tight section 1036 of the chassis. In this exemplary embodiment we have inserted an optional vertical air channel 1047 between the 1036 and the main portion of the chassis 1035 which houses the server electronics. This channel makes it possible to create chassis in which air is used to remove the secondary heat loads employing a negative pressure rotary device that sits on the top of the rack cabinet, and exhausts heated air to another device. To help reduce energy consumption further, this embodiment includes a cold plate 1043, that circulates cold water throughout the server section. To eliminate external heat exchangers which cool heated air, we have inserted an optional liquid cooled heat exchanger 1046 that can be used to help restore air leaving the 1U chassis to its inlet temperature that is in thermal contact with the cold plate 1048. In an airtight version of this 1U chassis, this heat exchanger would be coupled with one or more low speed cooling fans to remove heat from ambient air within the chassis. This chassis has a pair of PCIe GPU cards 1027 which each are cooled by an LHPL whose evaporator 1031 can be seen on the left hand side device. The orientations of the GPUs takes two different positions, hiding the evaporator for the right hand GPU in FIG. 48. In the front, an optional air cooling entrance 1028 can be seen as well as the CPU motherboard 1029 and one of its evaporators 1034. The motherboard DIMM modules 1030 can be seen along with an optional water cooling device that employs a heat spreader 1045, which is in thermal contact with the DMM modules (which now can be purchased with metallic heat spreaders which bridge both sides and cross over the top, providing a thermal contact surface to remove heat from, using heat spreader 1045 and a thermal contact pad), a pair of ordinary heat pipes 1044 in thermal contact with the heat spreader that have a 90 degree bend in them going vertical that makes it possible to conduct heat from the heat spreader 1045 to a vertical rising section of the cold plate 1043, all of which are most easily made out in FIG. 49. The first of four liquid return lines 1032 as well as the first of four vapor lines 1033 can be made out as well.

The liquid cooled cold plate 1043 seen in FIG. 49 is sheathed top and bottom with a thin metallic layer designed to act as both a heat spreader and to protect the cold plate's piping. The cold plate vertical riser 1043 is also sheathed in copper as is the portion of the DIMM module heat pipes 1044 which comes into contact with it: both are brought into thermal contact using a mechanism which clamps the heat pipes to the cold plate vertical riser. This same embodiment could also be used for cooling an air heat exchanger mounted in the rear of the chassis as well as an interface to cool evaporator CCs. Item 1042 is an exemplary embodiment of a device used to control the rate of liquid cooling flow rate through the LHPL condensers and cold plate. In this instance it turns out to be a servo controlled valve on the water inlet side that simultaneously controls both the LHPL condensers and cold plate.

Figure 50:
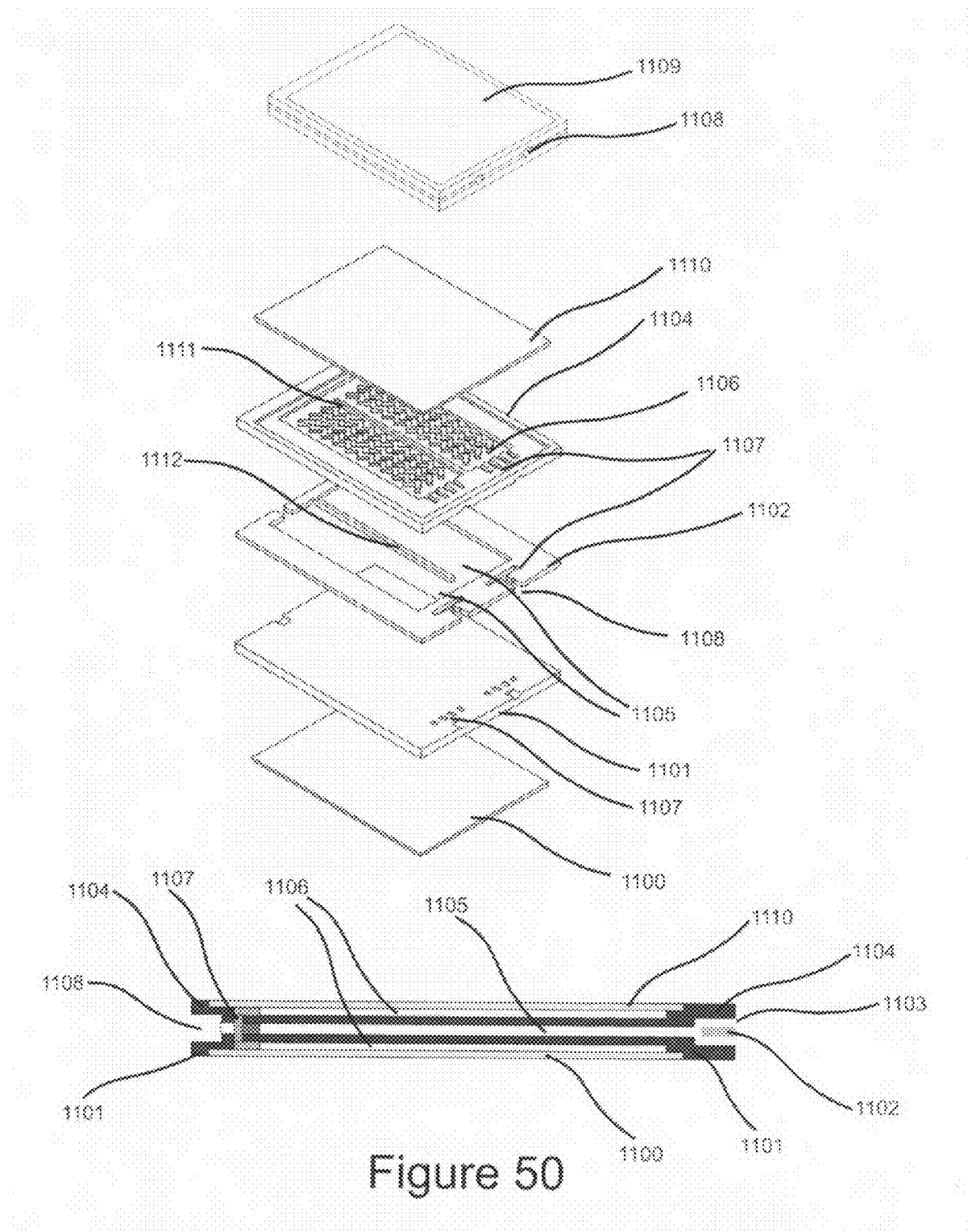
FIG. 50 is a rectangular liquid cooled LHPL condenser module.

FIG. 50 contains an exemplary 3D view of the liquid cooled parallel plate condensers employed in FIGS. 48 and 49. The condenser is made up of five stacked metal plates that are chemically compatible with the working fluid employed. In its design it is similar to the concentric cylinder condenser in FIG. 42. A single U shaped condensation channel 1105 similar to the channels seen in FIGS. 43 and 44 is employed. This makes it possible for the working fluid to enter and leave the condenser on one end and the external coolant to enter and leave on the other. Above and below the condensation channel sit a pair of U shaped condensation channels 1106. Three stacked plates 1101, 1102 and 1104 make this design possible. They are each machined before being joined together about their outer boundaries using an exemplary technique such as soldering. Once combined into a single object, liquid coolant galleys 1107 are drilled through the joined plates. The middle plate 1102 contains a pair of T shaped galleys on either side that can be seen in the exploded view that enable the external liquid coolant to enter both cooling channels simultaneously, progress around a U shaped channel that is created by a ridge that runs down the middle of 1102 before leaving through the opposite set of galleys. Prior to soldering on the two end caps 1100 and 1110 a four holes get drilled into the side of the structure to link up the cooling lines and LHPL vapor and liquid return lines with their appropriate internal components: the external coolant linking up with the galleys using the holes 1108 and the vapor and liquid return lines linking up with the condensation channel using holes labeled 1103 as seen in the cross sectional view. Looking at the exploded drawing, we can see the two different aspects of the stack components 1101 and 1104, which are identical, except for their orientations, which are opposed. Looking at 1101 in the exploded drawing we can see that it is solid, with the exception of the galley holes 1107. Looking at 1102 in the exploded view we can make out the ridge 1111 going down the middle of the external coolant channel as well as the galley channels 1107 that were cut in the left hand side to create the horizontal portion of the galleys. Going down one layer to 1102 we can see the ridge 1112 that gets sandwiched between 1104 and 1101 that forces the working fluid to follow a U shaped condensation channel 1105 as well as the galleys 1107 that were machined into this element prior to the coolant galleys being drilled in. The last step in this exemplary design is the attachment of the sealing plates 1100 and 1110. One method of implementing a turbulator would be to machine parallel zigzag groves into 1101 and 1104. A less expensive implementation that has the same effect involves molding or sintering a flat planar metal structure with zigzag channels cut into that gets inserted into the cavity that forms the coolant channels before the outer lids are soldered in place. Either approach forces the liquid coolant flowing at small velocities to continuously change directions, improving mixing while at the same time doubling the contact area between the coolant and the thin wall that separates the coolant from the vapor in the condensation channel.

Figure 51:
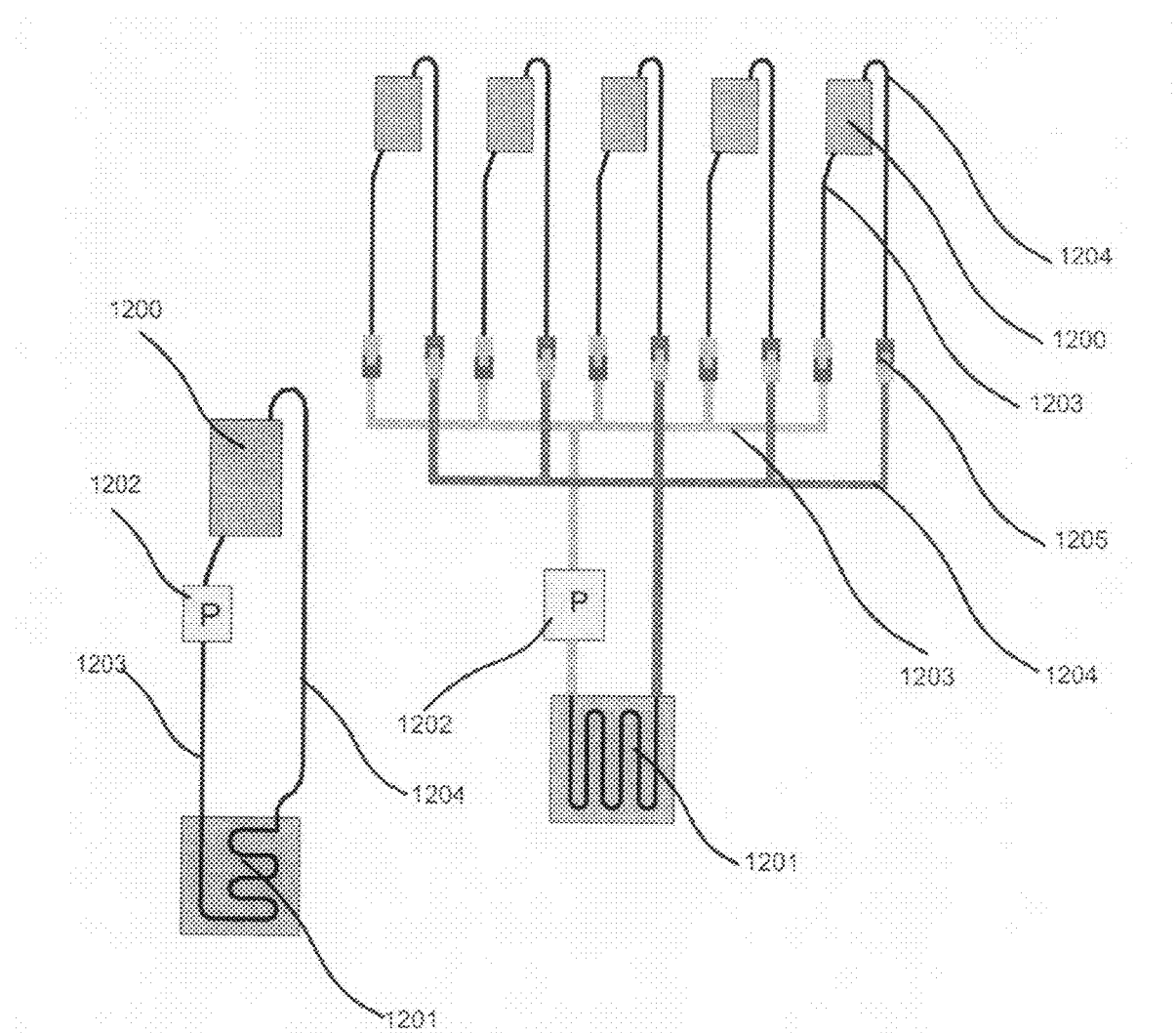
FIG. 51 is an LHPL cooled system that employs a vacuum pump in the vapor line that can be used to cool one or more primary heat loads.

FIG. 51 is an Advanced Loop Heat Pipe (ALHP) that employs a pump in the vapor line to reduce the vapor pressure and therefore the evaporation temperature in the evaporator. As the heat densities rise to 1,000 Watts/cm$^2$ and greater in low pressure evaporators the evaporation temperature of the working fluid rises to over 100 C. Cooling devices that reject these high power densities then becomes a problem unless the pressure in the vapor line is reduced. This is accomplished using a vacuum pump, 1202. The ALHPs shown in FIG. 51 employ a pump to reduce vapor pressure on either a single evaporator or multiple evaporators. Each of the ALHPs employs an evaporator 1200, a condenser 1201, a vapor line 1203 that feeds the pump inlet, a liquid return line 1204. In the exemplary embodiment shown where a single pump is reducing the vapor pressure on five evaporators and feeding the resultant higher pressure (and temperature) working fluid to a condenser, quick disconnects can optionally be inserted in the vapor lines and liquid return lines, which end up feeding in parallel through a manifold that transports the higher pressure vapor to the condenser and returns the resulting liquefied working fluid to the evaporators. The approach we employed is not limited to a single system chassis, but could be employed at the rack level or possibly even at the data center level to cool many heat rejecting devices at the same time using a common vacuum pump and condenser.

FIG. 52 shows a sequence of performance charts for different versions of the GPU/CPU LHPL coolers shown in FIG. 37. This sequence started out with LHP evaporators that did not employ fins to cool the CC. Comparing the two sets of data for LHP 1, we can see that adding CC cooling reduces the simulator temperature by approximately 10 C, over most of the this devices performance range. By the time the simulator is running at 350 Watts, this benefit has been cut in half, demonstrating that the problem it solves, conduction of heat from the CPU/GPU simulator through the evaporator shell, impacts performance most heavily at low power. The use of CC cooling can have other benefits as well, including drawing water to the evaporator after a system has been shut down, or during shut down, to help avoid wick dry out. While we have benefited from simple CC cooling solutions, such as air cooled finned heat exchangers (FIG. 37), there are alternative exemplary solutions as well, including the use of thermoelectric coolers, finned heat exchangers with built in fans and thermal connections between a CC and a cold plate.

Although the steps of the method of assembling the device illustrated herein may be listed in an order, the steps may be performed in differing orders or combined such that one operation may perform multiple steps. Furthermore, a step or steps may be initiated before another step or steps are completed, or a step or steps may be initiated and completed after initiation and before completion of (during the performance of) other steps.

The preceding description has been presented only to illustrate and describe exemplary embodiments of the methods and systems of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope. The scope of the invention is limited solely by the following claims.

What is claimed is:

1. A cooling device to cool a plurality of heat rejecting components, comprising:

an enclosure housing enclosing the plurality of heat rejecting components;

an external heat rejection device that includes a liquid external coolant that transfers primary heat from a primary cooling system and secondary heat from a secondary cooling system to an environment outside of the enclosure housing;

the primary cooling system includes a loop heat pipe like device, the primary cooling system cooling a primary heat rejecting component;

the loop heat pipe like device includes an evaporator module, a condenser module, a vapor line, a liquid return line, and a working fluid having a liquid phase and a vapor phase, wherein the primary heat produced by the primary heat rejecting component being cooled causes the working fluid in the evaporator module to change from the liquid phase to the vapor phase, the vapor phase leaves the evaporator module passing through the vapor line and into the condenser module where the working fluid releases the primary heat absorbed in the evaporator module and returns to the liquid phase, the liquid phase then leaves the condenser module passing through the liquid return line and the working fluid returning to the evaporator module;

the evaporator module includes a component evaporator heat spreader, an evaporator body, and an evaporator-component clamping means, wherein the component-evaporator heat spreader is clamped to the primary heat rejecting component providing thermal contact to transfer the primary heat produced by the primary heat rejecting component being cooled to the evaporator body by reducing thermal resistance between the primary heat rejecting component and the evaporator body;

the evaporator body includes an evaporator outer shell, a working fluid inlet port, a compensation chamber, a working fluid exit port, and an evaporator wick having vapor escape channels, wherein the evaporator body receives the working fluid through the working fluid inlet port where the working fluid enters the compensation chamber located within the evaporator body before passing by capillary action into the evaporator wick where the working fluid absorbs the primary heat being rejected by the primary heat rejecting component causing the liquid phase of the working fluid to change the vapor phase that carries the primary heat produced by the primary heat rejecting component out of the evaporator wick through the vapor escape channels into the working fluid exit port;

the condenser module includes a condenser coolant inlet, a condenser coolant exit, a condenser condensation channel, a condensation channel working fluid inlet, a condensation channel working fluid exit, and a condensation channel-coolant thermal interface, the condensation channel-coolant thermal interface includes a coolant passageway, wherein the working fluid enters the condensation channel through the condensation channel working fluid inlet in the vapor phase, the working fluid changes phase in the condensation channel from the vapor phase back to the liquid phase and leaves the condensation channel through the condensation channel working fluid exit, delivering the primary heat produced by the primary heat rejecting component that was temporarily stored as heat of evaporation within the vapor phase to the external coolant which enters the condenser module through the condenser coolant inlet where the external coolant passes into the coolant passageway, the external coolant then carries away the primary heat produced by the primary heat rejecting component by exiting out of the coolant passageway through the condenser coolant exit;

the secondary cooling system including a secondary coolant, the secondary cooling system cooling a secondary heat rejecting component;

the secondary cooling system includes an air cooled finned heat exchanger that is in thermal contact with the secondary heat rejecting component, and a rotary electric device to direct air across the air cooled finned heat exchanger and the secondary heat rejecting component to convection cool the secondary heat rejecting component, wherein the secondary heat produced by the secondary heat rejecting component is released to the secondary coolant, the secondary coolant releases the secondary heat to the air cooled finned heat exchanger, and the air cooled finned heat exchanger releases the secondary heat to the external coolant.

2. The cooling device according to claim 1, wherein the condenser module includes a straight condensation channel with a flat rectangular cross section whose height is less than its width or length or a circular cross section in contact with one or more coolant passageways whose cross section is similar and parallel to the condensation channel wherein the coolant passageway constrains the coolant to flow along the flat boundaries of the rectangular condensation channel or both the inner and outer boundaries of the cylindrical condenser.

3. The cooling device according to claim 2, wherein the condensation channel whose cross section is a flat rectangle whose height is less than its width or length in which a barrier has been placed part way down the middle of the condensation channel wherein the working fluid is forced to take a U-shaped path increasing the length of the channel while the inlet and outlet ports of the condensation channel sit on the same end of the condenser module.

4. The cooling device according to claim 2, wherein the coolant passageway has a flat rectangular shape whose height is less than its width or length and which has a barrier placed part way down its middle along with a condensation channel-coolant thermal interface including a plurality of obstacles to the liquid flow wherein the contact area between the coolant and the working fluid vapor is increased while forcing the coolant to mix and take a U shaped path thereby increasing thermal conductivity between the working fluid and the coolant while the coolant inlet and outlet to sit on the same end of the condenser module.

5. The cooling device according to claim 4, wherein the condenser module includes two flat rectangular coolant passageways that are employed to cool a single condensation channel and are arranged so that both sides of the condensation channel are being cooled.

6. The cooling device according to claim 5, wherein the condensation channel and the two coolant passageways are concentric cylinders in which the condensation channel-coolant thermal interface is implemented by placing a plurality of obstructions in the liquid passageway.

7. The cooling device according to claim 6, wherein one of the two sides of the condensation channel is in contact with one of the two coolant passageways.

8. The cooling device according to claim 1, wherein the external coolant flow is unopposed to that of the working fluid.

9. The cooling device according to claim 1, wherein a plurality of protrusions have been added to the channel walls to improve working fluid vapor mixing and improve the performance of the condensation channel-coolant thermal interface.

10. A cooling device to cool a plurality of heat rejecting components, comprising:
an enclosure housing enclosing the plurality of heat rejecting components;
an external heat rejection device that includes a gaseous external coolant that transfers primary heat from a primary cooling system and secondary heat from a secondary cooling system to an environment outside of the enclosure housing;
the primary cooling system includes a loop heat pipe like device, the primary cooling system cooling a primary heat rejecting component;
the loop heat pipe like device includes an evaporator module, a condenser module, a vapor line, a liquid return line, and a working fluid having a liquid phase and a vapor phase, wherein the primary heat produced by the primary heat rejecting component being cooled causes the working fluid in the evaporator module to change from the liquid phase to the vapor phase, the vapor phase leaves the evaporator module passing through the vapor line and into the condenser module where the working fluid releases the primary heat absorbed in the evaporator module and returns to the liquid phase, the liquid phase then leaves the condenser module passing through the liquid return line and the working fluid returning to the evaporator module;
the evaporator module includes a component-evaporator heat spreader, an evaporator body, and an evaporator-component clamping means, wherein the component-evaporator heat spreader is clamped to the primary heat rejecting component providing thermal contact to transfer the primary heat produced by the primary heat rejecting component being cooled to the evaporator body by reducing thermal resistance between the primary heat rejecting component and the evaporator body;
the evaporator body includes an evaporator outer shell, a working fluid inlet port, a compensation chamber, a working fluid exit port, and an evaporator wick having vapor escape channels, wherein the evaporator body receives the working fluid through the working fluid inlet port where the working fluid enters the compensation chamber located within the evaporator body before passing by capillary action into the evaporator wick where the working fluid absorbs the primary heat being rejected by the primary heat rejecting component causing the liquid phase of the working fluid to change the vapor phase that carries the primary heat produced by the primary heat rejecting component out of the evaporator wick through the vapor escape channels into the working fluid exit port;
the condenser module includes a condenser coolant inlet, a condenser coolant exit, a condenser condensation channel, a condensation channel working fluid inlet, a condensation channel working fluid exit, and a condensation channel-coolant thermal interface including a coolant passageway, wherein the working fluid enters the condensation channel through the condensation channel working fluid inlet in the vapor phase, the working fluid changes phase in the condensation channel from the vapor phase back to the liquid phase and leaves the condensation channel through the condensation channel working fluid exit, delivering the primary heat produced by the primary heat rejecting component that was temporarily stored as heat of evaporation within the vapor phase to the external coolant which enters the condenser module through the condenser coolant inlet where the external coolant passes into the coolant passageway, the external coolant then carries away the primary heat produced by the primary heat rejecting component by exiting out of the coolant passageway through the condenser coolant exit, a condenser module rotary electric device to direct air across at least a portion of the condenser module;
the secondary cooling system including a secondary coolant, the secondary cooling system cooling a secondary heat rejecting component;
the secondary cooling system includes an air cooled finned heat exchanger that is in thermal contact with the secondary heat rejecting component, and a secondary cooling system rotary electric device to direct the gaseous external coolant across the gas cooled finned heat exchanger and the secondary heat rejecting component to convection cool of the secondary heat rejecting component, wherein the secondary heat produced by the secondary heat rejecting component is released to the gaseous external coolant.

11. The cooling device according to claim 10, wherein the condenser module includes a condensation channel being straight with a flat rectangular cross section whose height is less than its width or length that is in thermal contact with a plurality of cooling fins wherein the cooling fins remove heat from the channel.

12. The cooling device according to claim 11, wherein the condensation channel has a barrier placed part way down its middle while the working fluid inlet and outlet sit on the same end of the condensation channel.

13. The cooling device according to of claim 11, wherein the cooling fins are thermally attached to both sides of the condensation channel.

14. The cooling device according to claim 10, wherein condensation channel includes one or more tubes that are straight or serpentine and contiguous or connected by a manifold which have a common inlet and outlet that connect to the loop heat pipe like vapor tube and liquid return line whereby working fluid vapor can enter through the inlet and pass along the tubing delivering their heat to an external gaseous coolant that comes into thermal contact with the condensation channel by passing through the plane of the tubes or along the cooling fins that are in thermal contact with the tubing allowing the working fluid to leave the channel as a liquid before entering the liquid return line.

15. The cooling device according to claim 14, wherein the condensation channel that lies in a plane and is thermally attached to a heat spreader plate on one or both of its sides allowing it to transfer heat to one or more heat exchangers including a plurality of fins attached to a base plate which clamp to the heat spreader.

16. The cooling device according to claim 14, wherein the condensation channel that is thermally attached to a pair of heat exchanger modules each of which include a base plate with fins that have a grove machined into its base plate that profiles the shape of the condensation channel, the condensation channel getting sandwiched between the two profiled base plates using a clamping mechanism that also allows one of the two heat exchanger modules to remain in the chassis when the loop heat pipe like tubing and evaporator is removed.

17. The cooling device according to claim 14, wherein the condensation channel that employs a manifold which allows it to distribute working fluid vapor along a set of parallel fins.

18. The cooling device according to claim 16, wherein the exchanger modules allow the coolant to pass through the plane of the base plate by machining a plurality of grooves in the base plate that let air pass through it.

19. The cooling device according to claim 10, wherein the external coolant is air.

20. The cooling device according to claim 19, wherein the condenser module rotary electric device is mounted to a periphery of the enclosure housing, thereby enabling the condenser module rotary cooling device to simultaneously remove heat from the secondary heat load by removing ambient air from the enclosure housing while also removing heat from the loop heat pipe like primary heat load.

* * * * *